(12) United States Patent
Mukai et al.

(10) Patent No.: US 6,567,322 B1
(45) Date of Patent: May 20, 2003

(54) SEMICONDUCTOR MEMORY DEVICE

(75) Inventors: Hideo Mukai, Tokyo (JP); Kaoru Nakagawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/528,177

(22) Filed: Mar. 17, 2000

(30) Foreign Application Priority Data

Mar. 19, 1999 (JP) .......................................... 11-075065
Sep. 3, 1999 (JP) .......................................... 11-250509
Jan. 7, 2000 (JP) ...................................... 2000-001833

(51) Int. Cl.[7] .............................................. G11C 7/00
(52) U.S. Cl. .................................... 365/200; 365/225.7
(58) Field of Search .............................. 365/200, 225.7

(56) References Cited

U.S. PATENT DOCUMENTS

| | | | | |
|---|---|---|---|---|
| 4,389,715 A | * | 6/1983 | Eaton, Jr. et al. | 365/200 |
| 5,124,948 A | * | 6/1992 | Takizawa et al. | 365/200 |
| 5,343,429 A | * | 8/1994 | Nakayama et al. | 365/200 |
| 5,469,388 A | * | 11/1995 | Park | 365/200 |
| 5,684,746 A | | 11/1997 | Oowaki et al. | 365/200 |
| 5,703,817 A | | 12/1997 | Shiratake et al. | 365/200 |
| 5,835,424 A | * | 11/1998 | Kikukawa et al. | 365/200 |
| 6,075,732 A | * | 6/2000 | Ooishi et al. | 365/200 |
| 6,094,381 A | * | 7/2000 | Isa | 365/200 |

OTHER PUBLICATIONS

"A 1.6GB/s DRAM with Flexible Mapping Redundancy Technique and Additional Refresh Scheme"; 1999 IEEE International Solid–State Circuits Conference, S. Takase, et al., pp. 410–411.

* cited by examiner

Primary Examiner—Trong Phan
(74) Attorney, Agent, or Firm—Banner & Witcoff, Ltd.

(57) ABSTRACT

In a DRAM semiconductor memory device, a DRAM semiconductor memory device disclosed herein comprises a first spare element SWL provided for each of a plurality of normal banks BANK0–BANK15 formed by dividing a memory cell array into a plurality of sections, a second spare element SWL provided for a spare bank BANKSP different from the normal banks, a plurality of first spare decoders SRD0–SRD3 for selectively operating the first spare element, a plurality of second spare decoders SRD0–SRD3 for selectively operating the second spare element, and a substitution-control circuits FS0a–FS27a, RWLON1–RWLON2, SRDact0–SRDact3 for selectively assigning the second spare elements to arbitrary banks of the plurality of normal banks. With the above structure, the total number of the spare elements of the defective memory cells of the DRAM can be reduced while the relieving ratio is being maintained. As a result, the area efficiency of the redundant circuit on the chip can be improved.

25 Claims, 20 Drawing Sheets

SEMICONDUCTOR MEMORY DEVICE

CROSS REFERENCE TO RELATED APPLICATIONS

This application is based upon and claims the benefit of priority from the prior Japanese Patent Applications No. 11-075065, filed Mar. 19, 1999; No. 11-250509, filed Sep. 3, 1999; and No. 2000-001833, filed Jan. 7, 2000, the entire contents of which are incorporated herein by reference.

BACKGROUND OF THE INVENTION

The present invention relates to a semiconductor apparatus, and more particularly to a semiconductor memory device having a multibank structure which incorporates a redundant circuit for relieving a defect memory cell.

A semiconductor memory device has a redundant system employed to improve the manufacturing yield by substituting a redundant cell for a defect cell to relieve the defect cell when a defect cell has been detected in a portion of memory cells as a result of a test of a memory cell array. A redundant system which is employed usually at present uses a method with which one or more cell arrays including the defect cell is, as a unit, replaced with a spare element having the same size as that of the cell array (replacement of a cell array unit).

Address information of the cell array unit including the defect cell is stored in a nonvolatile memory device including fuses. Since address information is composed of a plurality of bits, a fuse set including a plurality of fuses corresponding to the plurality of bits is employed. The fuse set is usually one-to-one correspond to the spare element. Fuse sets, the number of which is the same as that of the spare elements, are provided in a chip. When the spare element is used, fuses in the fuse set corresponding to the spare element are cut in accordance with address information.

Since the redundant system requires the redundant circuit including the spare elements and the fuse sets, the area of the memory chip is enlarged excessively. Since the number of defects, which can be relieved, and the area of the redundant circuit satisfy a trade-off relationship, a variety of redundant systems substantially capable of improving the area efficiency have been suggested.

For example, a flexible redundant systems ("Faulty-Tolerant Design for 256 Mb DRAM" (refer to IEEE JOURNAL OF SOLID-STATE CIRCUITS, VOL. 31, No. 4, April 1996) suggested by Kirihata et al. is known. The foregoing method arranged such that one spare element covers a wide cell array region is able to relieve a faulty state where defect cells are eccentrically present in a portion of a chip similarly to a state where faults are present uniformly. Therefore, the number of the spare elements can be reduced, causing the area efficiency of the redundancy circuit to be improved. The foregoing method is effective in a case where the number of faults per chip has been detected or estimated.

On the other hand, a memory chip has been developed in which the memory cell array is divided into sections. For example, a memory chip is known which includes a plurality of banks arranged to simultaneously be activated.

In a memory chip of the foregoing type, the row spare element for relieving a defect memory cell in a row unit cannot be used across the bank. Therefore, a limitation is imposed such that a spare element must be prepared for each bank. As the number of the banks is enlarged, the number of sections of the memory cell array in the chip is enlarged. Hence it follows that the area of the cell array region which can be covered by one spare element is reduced.

When the spare element is provided for each bank, the possibility that defects of the memory cell eccentrically occur is raised considerably as the capacitance of the memory is enlarged. To maintain a high efficiency percentage, the number of the spare elements to be included in each bank must be enlarged. As a result, the area of the chip is enlarged excessively.

To relieve a defect cell even if defects are eccentrically present in a portion of the memory cell array in a case where the spare element can cover only a narrow region as described above, the spare element must be provided for each of the narrow cell array region. As a result, the spare elements are mounted on a chip by a number considerably larger than an average number of defects per chip. Therefore, the overall area efficiency of the chip deteriorates.

The conventional method with which the spare elements and the fuse sets are one-to-one corresponded encounters increase in the number of fuse sets as the number of the spare elements is increased. Since the fuse set generally requires an area larger than the area required for the spare element, the area efficiency of the redundant circuit excessively deteriorates.

To overcome the foregoing problem, a method is known with which the number of the fuse sets which is larger than an estimated number of defects in the overall cell array can be made to be smaller than the number of all of the spare elements. Specifically, the relationship of the corresponding information with plurality of spare row decoders in each bank is included in each fuse set. Thus, the necessity for causing each fuse set to one-to-one correspond to the spare element can be eliminated.

A portion of conventional DRAM includes a type having a structure that the overall cell array is sectioned into 16 banks. Moreover, eight spare elements are provided for each bank to cope with a state where defects are eccentrically present. Assuming that the average defects in the overall cell array is about 20, twenty eight fuse sets which is smaller than the number of all of the spare elements which is 128 are used to cope with a state where defects are uniformly dispersed or defects are present eccentrically. Since the spare elements, the total number of which is 128, are provided, the area efficiency of the spare element is unsatisfactorily low.

Note that the number of banks increases in proportion to the enlargement of the capacitance of the memory. The necessity for increasing the number of the banks is not raised in the future. The increasing rate of the number of the banks with respect to the enlargement of the capacitance of the memory will be lowered. Since the lengths of the bit line and the word line have upper limits, the size of the sub-array constituting the bank has an upper limit. Hence it follows that the number of the sub-arrays is increased. To be adaptable to the foregoing trend, a structure is employed in which when a certain bank has been activated, a sub-array belonging to the bank and maintained at a non-active state is present.

A semiconductor memory having the structure that the active sub-arrays and non-active sub-arrays belonging to the same bank are present suffers from a problem in that the area of the chip is excessively enlarged if a multiplicity of spare elements are provided for each sub-array.

Since the defect is not fined when the device is fined, a portion of defects has a relatively large width (area). Thus, use of a plurality spare elements is sometimes required.

The method with which the number of the fuse sets is made to be smaller than the total number of the spare elements involves a fact that consumption of a plurality of the spare elements causes the fuse sets to, of course, be consumed by the same number. Therefore, fewer fuse sets sustain greater damage owing to a defect having a width larger than the spare element.

FIG. 21 collectively shows defect example A and B caused from defects which are possible to occur in one bank.

The defect example A is an example in which a defect having a large area corresponding to two word lines is relieved by using one spare element. In the foregoing case, one fuse set is used.

The defect example B is an example in which two spare elements are required to relieve a defect having a large area corresponding to two word lines. In the foregoing case, two fuse sets are used.

As the device is fined, the defect example B increases. In an extreme case in which all of twenty estimated defects traverse the boundary of the unit for the substitution, insufficiency of the fuse sets occurs with reliability in spite of low possibility of insufficiency of the number of the spare element.

If the pattern is fined considerably as compared with the width of the defect, a state is realized in that the number of the fuse sets cannot be reduced in spite of requirement for decreasing the fuse sets which requires a large area.

As described above, the conventional DRAM having the multibank structure suffers from a problem in that increase in the number of the spare element causes the area efficiency to deteriorate.

Also a conventional DRAM having the multibank structure in which each bank is composed of a plurality of sub-arrays is arranged such that an independent spare element is provided for each sub-array of each bank to cope with eccentric presence of defects. Therefore, increase in the number of the spare element causes the area efficiency to deteriorate.

The conventional DRAM having the multibank structure suffers from a problem in that insufficiency of the fuse sets occurs when a state in which the defect traverse the boundary of the spare element which is the unit for the substitution.

BRIEF SUMMARY OF THE INVENTION

To achieve the problems experienced with the conventional structures, an object of the present invention is to provide a semiconductor memory device which is capable of coping with a case where defects are present eccentrically in the overall cell array even if the number of spare elements corresponding to a plurality of units of a memory cell array which has been fined in recent years is reduced and reducing the total number of the spare elements while the relieving ratio and relieving degree of freedom are being maintained so as to improve the area efficiency of a redundant circuit on a chip.

Another object of the present invention is to provide a semiconductor memory device which permits common use of a spare element provided for each sub-array of each bank in the same bank, which is capable of coping with a state where defect are present eccentrically in the overall cell array and reducing the total number of the spare elements while the relieving ratio and relieving degree of freedom are being maintained so as to improve the area efficiency of a redundant circuit on a chip.

Another object of the present invention is to provide a semiconductor memory device structured to enable one fuse set to perform substitution for a plurality of spare elements, preventing consumption of fuse sets when a defect having a large width is overcome and attaining satisfactory efficiency percentage without a necessity of increasing the fuse sets which require a large area.

According to a first aspect of the present invention, there is provided a semiconductor memory device comprising a first spare element provided for each of a plurality of units of a memory cell array; second spare elements in addition to the plurality of units; and circuits for selectively assigning the second spare elements to arbitrary units of the plurality of units.

According to a second aspect of the present invention, there is provided a semiconductor memory device comprising a plurality of normal banks formed by dividing a memory cell array into a plurality of sections; first redundant cell arrays collectively provided as one spare bank so as to be substituted for a defect memory cell of the memory cell array; a plurality of second redundant cell arrays provided to correspond to the plurality of normal banks; normal decoders provided to correspond to the normal banks and arranged to select the row and column of the memory cell array in accordance with an input address; a first spare decoder for selectively operating the plurality of first redundant cell arrays; a plurality of second spare decoders for selectively and correspondingly operating the plurality of second redundant cell arrays; a first substitution-control signal line for supplying a first substitution-control signal for controlling the operation of the first spare decoder; a second substitution-control signal line for supplying a second substitution-control signal for controlling the operation of the plurality of second spare decoders; a plurality of first memory circuits in which information of the address of a defect memory cell and information as to which of the first redundant cell array and the second redundant cell array corresponds to each of the plurality of first memory circuits are previously stored to selectively output the first substitution-control signal or the second substitution-control signal in accordance with a detection result of the correspondence between the stored address of the defect memory cell and the input address and information of the correspondence with the first redundant cell array or the second redundant cell array; and a control circuit for controlling the normal decoder to be deactivated state when either of the first substitution-control signal line or the second substitution-control signal line is in an active state.

In the semiconductor memory device according to the second aspect of the present invention, the first memory circuit may comprise first storage circuits for previously storing information of the address of a defect memory cell and information as to which of the first redundant cell array and the second redundant cell array corresponds to each of the plurality of first memory circuits are previously stored; and a first output circuit which determines which of the first redundant cell array and the second redundant cell array corresponds to the first memory circuit in accordance with information stored in the first storage circuits to output the first substitution control signal or the second substitution control signal. The first storage circuit may comprise a plurality of first fuse device for storing each bit data of the address of the defect memory cell to correspond to a state of cut/non-cut; a second fuse device for storing one-bit data for instructing conduction of selection of the first redundant cell array to correspond to the state of cut/non-cut; and a third fuse device for storing one-bit data for instructing conduction of selection of the second redundant cell array to correspond to the state of cut/non-cut, and the first output circuit may comprise a comparison circuit for making a comparison between the stored address of the defect memory cell and the input address; a first AND gate which performs a logical process of an output representing a result of the comparison made by the comparison circuit and data stored in the second fuse device to output the first substitution control signal; and a second AND gate which performs a logical process of an output representing a result of the comparison made by the comparison circuit and data stored in the third fuse device to output the second substitution control signal.

According to a third aspect of the present invention, there is provided a semiconductor memory device comprising a plurality of normal banks formed by dividing a memory cell array into a plurality of sections; a plurality of first redundant cell arrays provided as a plurality of spare banks so as to be substituted for a defect memory cell of the memory cell array; a plurality of second redundant cell arrays provided to correspond to the plurality of normal banks; normal decoders provided to correspond to the normal banks and arranged to select the row and column of the memory cell array in accordance with an input address; a plurality of first spare decoders corresponding to the plurality of the first redundant cell arrays to select and operate the plurality of the first redundant cell arrays; a plurality of second spare decoders corresponding to the plurality of the second redundant cell arrays to select and operate the plurality of the second redundant cell arrays; a plurality of first substitution-control signal lines for supplying a first substitution-control signal for alternatively controlling the operation of the plurality of the first spare decoders; a second substitution-control signal line for supplying a second substitution-control signal for controlling the operation of the plurality of the second spare decoders; a plurality of first memory circuits in which information of the address of a defect memory cell and information as to which of the first redundant cell array and the second redundant cell array corresponds to each of the plurality of first memory circuits are previously stored to selectively output the first substitution-control signal or the second substitution-control signal in accordance with a detection result of the correspondence between the stored address of the defect memory cell and the input address and information of the correspondence with the first redundant cell array or the second redundant cell array; and a control circuit for controlling the normal decoder to be deactivate when the plurality of first substitution-control signal lines or the second substitution-control signal lines are active.

In the semiconductor memory device according to the third aspect of the present invention, the first memory circuit may comprise first storage circuits for previously storing information of the address of a defect memory cell and information as to which of the first redundant cell array and the second redundant cell array corresponds to each of the plurality of first memory circuits are previously stored; and a first output circuit which determines which of the first redundant cell array and the second redundant cell array corresponds to the first memory circuit in accordance with information stored in the first storage circuits to selectively output the first substitution control signal or the second substitution control signal.

According to a fourth aspect of the present invention, there is provided a semiconductor memory device comprising a plurality of normal banks formed by dividing a memory cell array into a plurality of sections; a plurality of first redundant cell arrays collectively provided as one spare bank so as to be substituted for a defect memory cell of the memory cell array; a plurality of second redundant cell arrays provided to correspond to the plurality of normal banks; normal decoders provided to correspond to the normal banks and arranged to select the row and column of the memory cell array in accordance with an input address; a plurality of first spare decoders corresponding to the plurality of the first redundant cell arrays to select and operate the plurality of the first redundant cell arrays; a plurality of second spare decoders corresponding to the plurality of the second redundant cell arrays to select and operate the plurality of the second redundant cell arrays; a plurality of first substitution-control signal lines for supplying a first substitution-control signal for correspondingly and selectively operating the plurality of first spare decoders; a second substitution-control signal line for supplying a second substitution-control signal for controlling the operation of the plurality of second spare decoders; a plurality of first memory circuits including first storage circuits which are provided to correspond to the plurality of first substitution-control signal lines and in which the address of a defect memory cell is previously stored and structured to selectively output the first substitution-control signal to the corresponding first substitution-control signal line in accordance with a detection result of the correspondence between the address of the defect memory cell stored in the first storage circuits and the input address; a plurality of second memory circuits including second storage circuits in which information of the address of a defect memory cell and information as to which of the first redundant cell array and the second redundant cell array corresponds to each of the plurality of first memory circuits are previously stored and arranged to selectively output the second substitution-control signal to the second substitution-control signal line in accordance with a detection result of the correspondence between the address of the defect memory cell stored in the second storage circuits and the input address and information of the correspondence with the plurality of second redundant cell arrays; and a control circuit for controlling the normal decoder to be deactivate when the plurality of first substitution-control signal lines or the second substitution-control signal line is active.

According to a fifth aspect of the present invention, there is provided a semiconductor memory device comprising a plurality of memory banks which are formed by dividing a memory cell array into a plurality of sections and each of which is constituted by a plurality of sub-arrays; a plurality of spare elements which are provided for each of the sub-arrays and arranged to be substituted for a defect memory cell; a plurality of normal decoders which are provided to correspond to each of the sub-arrays and arranged to select the row of the sub-array in accordance with an input address; a plurality of spare decoders which are provided to correspond to each of the sub-arrays and arranged to correspondingly operate the plurality of spare elements; a plurality of bank selecting lines for selecting and instructing the plurality of memory banks; a plurality of normal-decoder control lines provided to correspond to the sets composed of a plurality of sub-arrays constituting the plurality of memory banks and arranged to select and instruct the normal decoders of the normal decoders and the spare decoders provided to correspond to the sub-arrays of each set; a plurality of spare-decoder control lines provided to correspond to the sets composed of the plurality of sub-arrays constituting the plurality of memory banks and arranged to select and instruct the spare decoders of the normal decoders and the spare decoders provided to correspond to the sub-arrays of each set; a plurality of spare-decoder selecting lines for alternatively selecting and controlling the plurality of spare decoders of each sub-array; and assigning circuits for selectively assigning the spare element of each sub-array to another sub-array belonging to the same bank.

In the semiconductor memory device according to the fifth aspect of the present invention, the assigning circuits may comprise a plurality of memory circuits in which information of the relationship between the address of the defect memory cell and the spare decoder made to one-to-one correspond to the address of the defect memory cell is previously stored, which make a comparison between the input address and the stored address of the defect memory cell to output a signal for selectively activating the plurality of spare decoder control lines and which outputs a signal for selectively activating the plurality of spare-decoder selecting lines in accordance with the stored address of the defect memory cell and the spare decoder when coincidence has been detected, and which outputs a signal for selectively activating the plurality of normal-decoder control lines when non-coincidence has been detected. Each memory circuit may comprise first storage circuits in which the address of the defect memory cell is stored; second storage circuits in which information of the correspondence with sub-arrays of a plurality of sets constituting the plurality of memory banks is stored; third storage circuits in which information of the correspondence with the plurality of spare decoders is stored; a comparison circuit for making a comparison between stored information in the first storage circuits and the input address; a first output circuit for outputting a signal for activating any one of the plurality of spare-decoder control lines in accordance with output representing a result of the comparison made by the comparison circuit and stored information in the second storage circuits; a second output circuit for outputting a signal for selectively activating the plurality of spare-decoder selecting lines in accordance with stored information in the third storage circuits when any one of the plurality of spare-decoder control lines is activated; and a third output circuit for outputting a signal for activating any one of the plurality of normal-decoder control lines in accordance with the output representing the result of the comparison made by the comparison circuit and the input address. The first storage circuits may comprise a plurality of first fuse devices for storing each bit data of the address of the defect memory cell to correspond to a state of cut/non-cut; the second storage circuits may comprise a second fuse device for storing information of the correspondence with two sets of sub-arrays such that one-bit data is caused to correspond to the state of cut/non-cut; the third storage circuits may comprise a third fuse device for storing each bit data of encode data indicating the correspondence with the plurality of spare decoders to correspond to the state of cut/non-cut; the first output circuit may be a first logical circuit which is complimentarily activated by data stored in the second fuse device and data acquired by inverting the stored data when coincidence has been detected by the comparison circuit to activate either of two spare decoder control lines; the second output circuit may be a decoder which decodes encode data stored in the plurality of third fuse devices when coincidence has been detected by the comparison circuit so as to selectively activate the plurality of spare-decoder control line, and the third output circuit may be a second logical circuit which is complimentarily activated in response to a predetermined bit signal of the input address and a signal acquired by inverting the predetermined bit signal when non-coincidence has been detected by the comparison circuit so as to activate either of two normal-decoder control lines. The first logical circuit may comprise a first AND gate for calculating a logical product of a detection output when coincidence has been detected by the comparison circuit and data stored in the second fuse device and a second AND gate for calculating the logical product of a detection output when coincidence has been detected by the comparison circuit and inverted data of data stored in the second fuse device, and the second logical circuit may comprise a third AND gate for calculating a logical product of detection output when non-coincidence has been detected by the comparison circuit and the predetermined bit signal of the input address and a fourth AND gate for calculating a logical product of a detection output when non-coincidence has been detected by the comparison circuit and an inverted signal of the predetermined bit signal of the input address.

In the semiconductor memory device according to the fifth aspect of the present invention, the assigning circuits may comprise a memory circuit in which the address of the defect memory cell is previously stored, which makes a comparison between the input address and the stored address of the defect memory cell, which outputs a signal for selectively activating the plurality of spare-decoder control lines when coincidence has been detected and which outputs a signal for activating the plurality of normal-decoder control lines when non-coincidence has been detected. The memory circuit may be provided with only one corresponding spare decoder and may comprise first storage circuits for storing the address of the defect memory cell; second storage circuits in which information of the correspondence with the sub-arrays of the plurality of sets constituting the plurality of memory banks is stored; a comparison circuit for making a comparison between stored information in the first storage circuits and the input address; a first output circuit for outputting a signal for activating any one of the plurality of spare-decoder control lines in accordance with an output representing a result of a comparison made by the comparison circuit and stored information in the second storage circuits; a second output circuit for outputting a signal for activating the corresponding spare decoder when any one of the plurality of spare-decoder control lines is activated; and a third output circuit for outputting a signal for activating any one of the plurality of normal-decoder control line in accordance with the output representing the result of the comparison made by the comparison circuit and in response to a predetermined bit signal at the input address.

In the semiconductor memory device according to the fifth aspect of the present invention, the sub-array may comprises a sub-cell array portion having word lines, spare word lines, bit-line pairs and memory cells disposed to correspond to each intersection of the word lines, the spare word lines and the bit-line pairs; equalizing circuit and sense amplifier lines including plurality of equalizing circuits disposed on the two sides of the sub-cell array and arranged to be controlled in response to an equalizing signal to equalize the bit-line pairs to a bit-line-pair equalization potential and a plurality of sense amplifiers for sense-amplifying data read from a memory cell on a selected row to the bit line; and a control circuit to which signals are input from the bank selecting line, the normal-decoder control line and the spare-decoder control line, which controls equalizing circuits corresponding to all of the sub-arrays in the same bank to an equalizing suspended state when activation of the bank is started so as to temporarily control the sense amplifier to an activation preparing state, and which is structured such that when any one of the plurality of normal-decoder control lines and the plurality of spare-decoder control lines has been activated, the equalizing circuits corresponding to the sub-arrays to be activated are controlled to maintain the equalizing suspended state so as to maintain the activation preparing state of the sense amplifiers and the equalizing circuits corresponding to the sub-arrays to be deactivated are returned to the equalizing state so as to restore the sense amplifiers to the deactivate state. The control circuit may comprise a first circuit to which a signal is input from the bank selecting line and which generates a pulse signal having a time width shortened in synchronization with the front edge; a first NMOS transistor having a gate to which an output signal from the first circuit is input; a PMOS transistor connected between the drain of the first NMOS transistor and a power-supply node and having a gate to which a signal is input from the bank selecting line; a second NMOS transistor connected between the source of the first NMOS transistor and a ground node and having a gate to which a signal is input from the normal-decoder control line; a third NMOS transistor connected between the source of the first NMOS transistor and the ground node and having a gate to which a signal is input from the spare-decoder control line; a latch circuit for latching the drain potential of the first NMOS transistor; and a logical gate for performing a logical process of an output signal from the latch circuit and an input signal from the bank selecting line to output an equalizing control signal for the equalizing circuit.

In the semiconductor memory device according to the fifth aspect of the present invention, the sub-array may comprises a sub-cell array portion having word lines, spare word lines, bit-line pairs and memory cells disposed to correspond to each intersection of the word lines, the spare word lines and the bit-line pairs; a plurality of equalizing circuits disposed on the two sides of the sub-cell array portion and arranged to be controlled in response to an equalizing signal to equalize the bit-line pairs to a bit-line-pair equalization potential; an array selecting switch connected between a sense amplifier line including a plurality of bit-line sense amplifiers which are disposed between adjacent sub-arrays and commonly used between adjacent sub-arrays and each of the bit-line pairs; and a control circuit to which signals are input from the bank selecting line, the normal-decoder control line and the spare-decoder control line, which controls the equalizing circuits corresponding to all of the sub-array in the same bank to an equalizing suspended state and brings the array selecting switch to a connection suspended state so that the sense amplifiers is temporarily brought to an activation preparing state when activation of the bank is started, and which maintains the equalizing circuit corresponding to the sub-array to be activated at an equalizing suspended state, controls the array selecting switch of adjacent sub-cell array to a connection suspended state so as to maintain the activation preparing state of the sense amplifier, controls the equalizing circuits corresponding to the residual sub-arrays to be deactivated to an equalizing state, and controls the array selecting switch to a connected state so as to return the sense amplifier to deactivated state when any one of the plurality of normal-decoder control lines and the plurality of spare-decoder control lines has been activated. The control circuit may comprise a first circuit to which a signal is input from the bank selecting line and which generates a pulse signal having a time width shortened in synchronization with the front edge; a first NMOS transistor having a gate to which an output signal from the first circuit is input; a PMOS transistor connected between the drain of the first NMOS transistor and a power-supply node and having a gate to which a signal is input from the bank selecting line; a second NMOS transistor connected between the source of the first NMOS transistor and a ground node and having a gate to which a signal is input from the normal-decoder control line; a third NMOS transistor connected between the source of the first NMOS transistor and the ground node and having a gate to which a signal is input from the spare-decoder control line; a latch circuit for latching the drain potential of the first NMOS transistor; and a logical gate for performing a logical process of an output signal from the latch circuit and an input signal from the bank selecting line to output an equalizing control signal for the equalizing circuit.

According to a sixth aspect of the present invention, there is provided a semiconductor memory device comprising a memory bank formed by dividing a memory cell array into a plurality of sections; a plurality of spare elements which are provided for each memory bank and arranged to be substituted for defect memory cells; a plurality of normal decoders disposed to correspond to the memory banks and arranged to select the row of the memory bank in accordance with an input address; a plurality of spare decoders provided to correspond to the memory banks and arranged to correspondingly operate the plurality of spare elements; a plurality of bank selecting lines for selectively instructing the plurality of memory banks; a spare-decoder control line for selectively instructing the spare decoder of the normal decoders and the spare decoders; a plurality of spare-decoder selecting lines for alternatively and selectively controlling the spare decoders of each memory bank; and assigning circuits provided by a number smaller than the total number of the spare elements and arranged to arbitrarily select and substitute one or plurality of spare elements for the defect memory cell.

In the semiconductor memory device according to the sixth aspect of the present invention, the assigning circuits may comprise a memory circuit in which the address of one or plural defect memory cells and information of the relationship between the address of the defect memory cell and the spare decoders in one-to-one correspondence is previously stored, which makes a comparison between the input address and the stored address of one or plural defect memory cells, which outputs a signal for correspondingly activating/deviating the spare-decoder control line when coincidence/non-coincidence has been detected and which outputs a signal for selectively activating the plurality of spare-decoder selecting lines in accordance with information of the relationship between the address of the defect memory and the spare decoder when coincidence has been detected. The memory circuit may comprise first storage circuits in which one or a plurality of addresses of the defect memory cell; a comparison circuit for making a comparison between information stored in the first storage circuits and the input address; a first output circuit for outputting a signal for activating the spare-decoder control line in accordance with an output produced when the comparison circuit has detected coincidence; second storage circuits in which information of one-to-one correspondence between the plurality of spare decoders and the address of the defect memory cell; and a second output circuit for outputting a signal for selectively activating the plurality of spare-decoder selecting lines in accordance with information stored in the second storage circuits and in response to at least a lowest bit of the address for use in substitution when the spare-decoder control line is activated. The addresses of the plurality of defect memory cells which are stored in the first storage circuits of the semiconductor memory device may be two to four types of addresses which are different from one another in only a lowest bit of the address for use in substitution or only two bits consisting of the lowest bit and one upper bit, and the one bit or two-bit address bits different from one another may be contained in the input of the second output circuit. The first storage circuits may comprise a plurality of first fuse devices for storing a lowest bit signal of the address for use to substitute the defect memory cell, the reversed signal of the lowest bit signal and each bit data upper than the lowest bit such that correspondence to cut/non-cut state is established; the second storage circuits may comprise a second fuse device for storing each bit data of encode data indicating the correspondence with the plurality of spare decoders except for the lowest bit such that correspondence to cut/non-cut state is established; the first output circuit may comprises a first comparison circuit for making a comparison among the lowest bit signal of the address for use in the substitution, a reversed signal of the lowest bit signal and data corresponding to the signals and stored in the first storage circuits, a second comparison circuit for making a comparison among each bit data upper than the lowest bit of the address and data corresponding to each bit data stored in the first storage circuits, and a first AND gate for performing a logical process of an output representing a result of the comparison made by the first comparison circuit and an output representing a result of the comparison made by the second comparison circuit to output a signal for activating the spare-decoder control line; and the second output circuit may be a decoder to which lowest-bit data of the address and data stored in the second storage circuits are input and which decodes the input data to selectively activate the plurality of spare-decoder selecting lines. The first storage circuits may comprise a plurality of first fuse devices for storing a lowest bit signal of the address for use to substitute the defect memory cell, a reversed signal of the lowest bit signal and each bit data upper than the lowest bit such that correspondence to cut/non-cut state is established; the second storage circuits may comprise a second fuse device for storing each bit data of encode data indicating the correspondence with the plurality of spare decoders such that correspondence to cut/non-cut state is established; the first output circuit may comprise a first comparison circuit for making a comparison among the lowest bit signal of the address for use in the substitution, a reversed signal of the lowest bit signal and data corresponding to the signals and stored in the first storage circuits, a second comparison circuit for making a comparison among each bit data upper than the lowest bit of the address and data corresponding to each bit data and stored in the first storage circuits, and a first AND gate for performing a logical process of an output representing a result of the comparison made by the first comparison circuit and an output representing a result of the comparison made by the second comparison circuit to output a signal for activating the spare-decoder control line; and the second output circuit is a decoder to which encode data stored in the second storage circuits or encode data obtained by switching the lowest bit data of the encode data item into lowest bit data of the address for use in the substitution is input and which decodes input encode data to selectively activating the plurality of spare-decoder selecting lines. The first storage circuits may comprise a plurality of first fuse devices for storing two bit signals from the lowest bit of the address for use to substitute the defect memory cells, reversed signals of the two bit signals and each bit data upper than the two bits such that correspondence to cut/non-cut state is established; the second storage circuits may comprise a second fuse device for storing each bit data of encode data indicating the correspondence with the plurality of spare decodes such that correspondence to cut/non-cut state is established; the first output circuit may comprise a first comparison circuit for making a comparison among the two bit signals from the lowest bit of the address for use in the substitution, reversed signals of the two bit signals and data corresponding to the signals and stored in the fist storage circuits, a second comparison circuit for making a comparison among each bit data upper than the two bits from the lowest bit of the address and data corresponding to each bit data and stored in the first storage circuits, and a first AND gate for performing a logical process of an output representing a result of the comparison made by the first comparison circuit and an output representing a result of the comparison made by the second comparison circuit to output a signal for activating the spare-decoder control line; and the second output circuit is a decoder to which encode data stored in the second storage circuits or encode data obtained by switching at least one bit of two bit data from the lowest bit into bit data to which the address corresponds is input and which decodes input encode data to selectively activate the plurality of spare-decoder selecting lines.

In the semiconductor memory device according to the sixth aspect of the present invention, the semiconductor memory device may further comprise a normal decoder control line for substantially instructing the normal decoder of the normal decoder and the spare decoder, wherein the memory circuit further incorporates a third output circuit for outputting a signal for activating the normal-decoder control line in accordance with an output made when non-coincidence has been detected by the comparison circuit.

Other objects, features and advantages of the invention will be evident from the following detailed description of the preferred embodiments described in conjunction with the attached drawings.

Additional objects and advantages of the invention will be set forth in the description which follows, and in part will be obvious from the description or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompany drawings.

First Embodiment

The outline of the operation for relieving a defect memory cell defect memory cell in a DRAM incorporating a redundant circuit and having a multibank structure will now be described.

An assumption is made to simplify the description that the distribution of defect memory cell in a memory cell array formed on the DRAM chip and having the multibank structure is the Poisson distribution.

$$P_\lambda(n) = \frac{\lambda^n \exp(-\lambda)}{n!} \tag{1}$$

The foregoing equation (1) indicates the possibility of presence of n defects when the average defect memory cell on the chip is $\lambda$.

Assuming that one spare element is able to relieve one defect, R spare elements present on the chip enables the following relieving ratio expressed as follows:

$$S_\lambda(R) = \sum_{n=0}^{R} P_\lambda(n) \tag{2}$$

Assuming that the average number of defect memory cells is 20, a required relieving ratio of 95% can be realized as follows:

$$S_{20}(28) = 0.966 \tag{3}$$

Therefore, 28 spare elements must be prepared.

As described above, 28 fuse sets are provided on the foregoing assumption. When the relieving units are sectioned into 16 banks, the total number of the spare elements to be prepared is increased. That is, $$\left\{\frac{S_{20}(8)}{16}\right\}^{16} = 0.998, \quad \left\{\frac{S_{20}(4)}{16}\right\}^{16} = 0.864, \tag{4}$$

Therefore, 8 spare elements must be provided for each bank.

Figure 1:
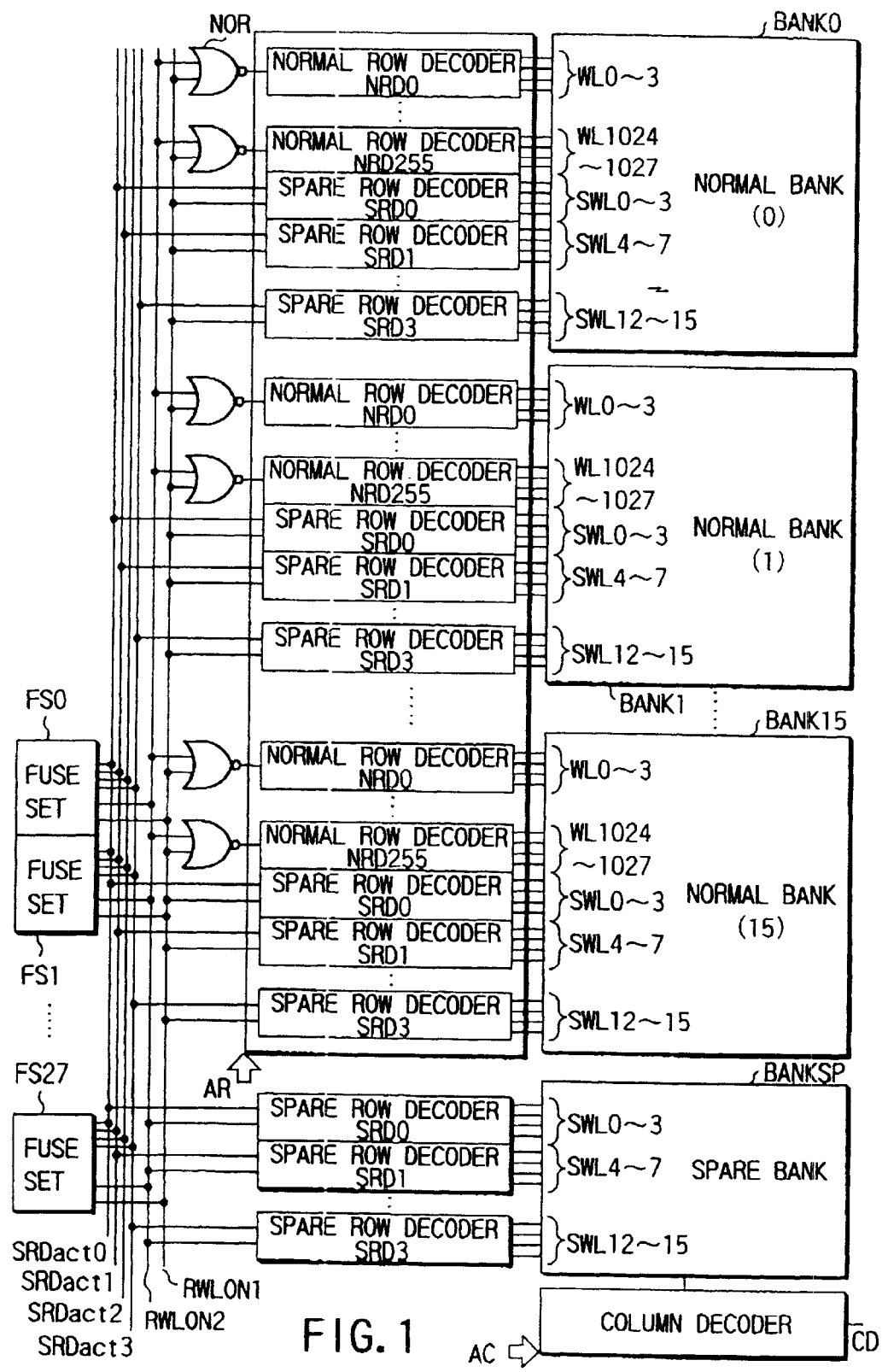
FIG. 1 is a block diagram showing the structure of an essential portion of a DRAM having a multibank structure for use in a first embodiment of the present invention.

As shown in FIG. 1, the structure according to the first embodiment incorporates a first spare element provided for each of a plurality of units (in this embodiment, 16 normal banks BANK0 to BANK15) of the memory cell array; second spare elements (for example, four spare elements) provided for spare bank BANKSP individually provided from the 16 normal bank BANK0 to BANK15; and means for selectively assigning the second spare element to an arbitrary bank in the 16 normal bank BANK0 to BANK15.

A structure is considered in which, for example, four spare elements are previously prepared for the 16 normal bank BANK0 to BANK15. Moreover, for example, four spare elements which can be used commonly by each bank are provided (note that a means for storing application of the spare element to the bank must be provided).

As described above, the number of the spare elements to be provided for each of the banks which are the relieving units is reduced. Moreover, a small number of individual spare elements is provided so a to be assigned to one or a small number of arbitrary banks of a multiplicity of banks. Thus, a state where defect memory cells are eccentrically present can be overcome.

That is, 15 banks of the 16 bank BANK0 to BANK15 have the possibility that the number of the defect memory cells (the number of defects) is 4 or smaller and one residual bank has 5 and 8 defect memory cells is as follows:

$$\left\{\frac{S_{20}(8)}{16} - \frac{S_{20}(4)}{16}\right\}^2 \cdot 16 \cdot \left\{\frac{S_{20}(4)}{16}\right\}^{15} = 0.127 \tag{5}$$

The possibility that two banks are present which has 5 to 8 defect memory cells is as follows:

$$\left\{\frac{S_{20}(8)}{16} - \frac{S_{20}(4)}{16}\right\}^2 \cdot 120 \cdot \left\{\frac{S_{20}(4)}{16}\right\}^{14} = 0.009 \qquad (6)$$

Since the foregoing possibility is very low, a structure may be employed in which four spare elements common to each bank are prepared to correspond to one bank which has a large number of defect memory cells present eccentrically. Thus the following relieving ratio can be obtained:

$$0.864 + 0.127 = 0.991 \qquad (7)$$

FIG. 1 schematically shows the structure of an essential portion of a DRAM according to the first embodiment and having a multibank structure. As a redundant circuit for relieving a defect memory cell, a circuit having a row spare for relieving the defect memory cell in row units and having no column spare is taken as an example.

The overall structure of the memory cell array incorporates a bank (a normal bank) sectioned into 16 banks BANK0 to BANK15 and one spare bank BANKSP. Each of the normal banks BANK0 to BANK15 incorporates four spare elements (distributed spared). Moreover, there are provided 256 normal row decoders (normal row decoders) NRD0 to NRD255 and four spare row decoders SRD0 to SRD3 corresponding to the four spare element. One normal low decoder undertakes four normal word line WL, while one spare row decoder undertakes four spare word lines SWL. The normal row decoders NRD0 to NRD255 decode row address RA and selects the normal word line WL.

The one spare bank BANKSP has four spare elements (common spares) which can be used across each of the banks BANK0 to BANK15 and which are concentrated. Four spare row decoders SRD0 to SRD3 corresponding to the four spare elements are provided. The selected spare row decoders SRD0 to SRD3 latch the state of the selection to hold the same until a precharge command is issued next.

The column decoder CD decodes a column address AC to select the columns of the normal banks BANK0 to BANK15 and the spare bank BANKSP.

Figure 2:
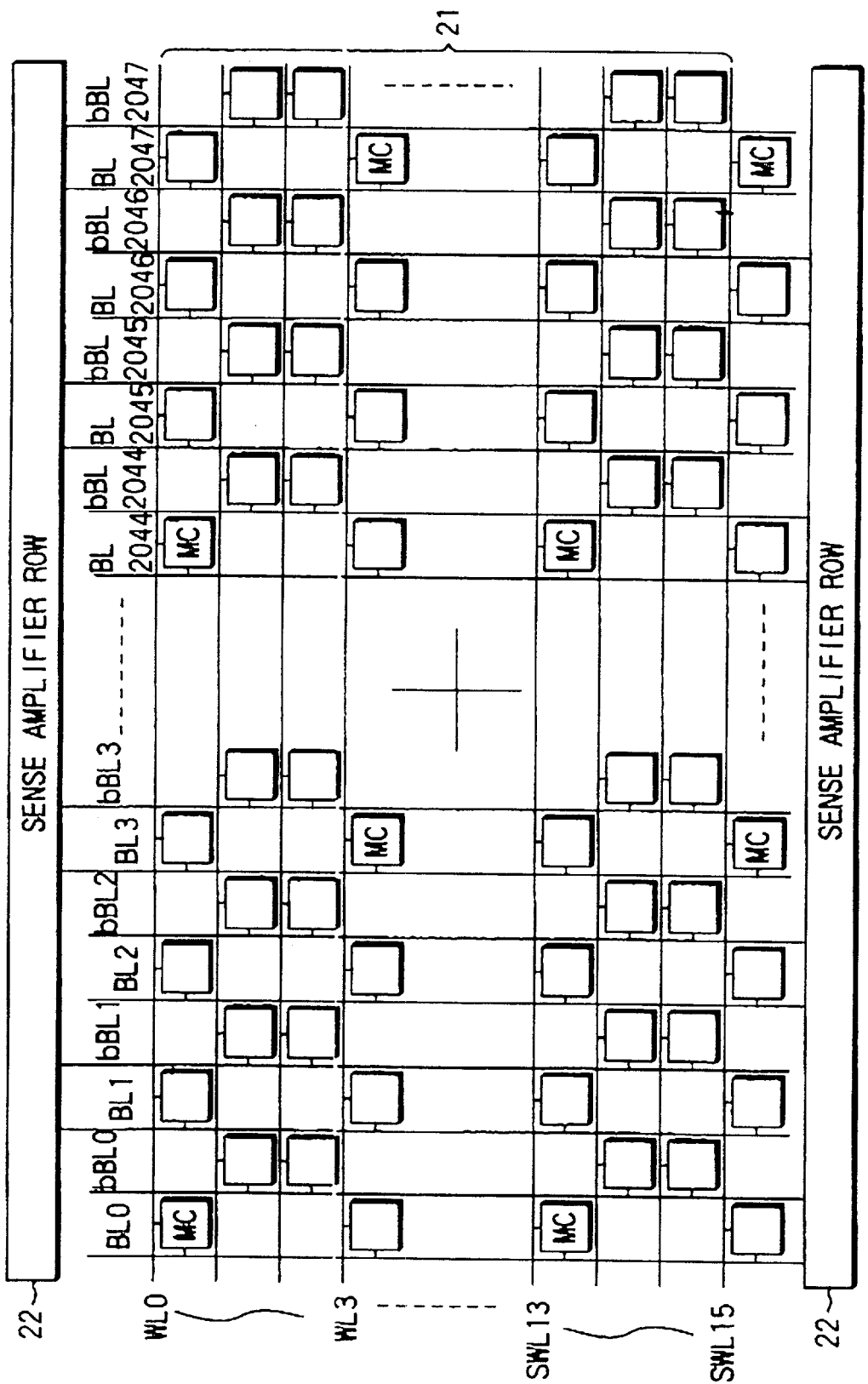
FIG. 2 is a circuit diagram representatively showing one of banks shown in FIG. 1.

FIG. 2 representatively shows one of the normal banks BANK0 to BANK15 shown in FIG. 1.

the bank shown in FIG. 2 incorporates normal word line WLi disposed in the direction of the row, spare word line SWLi, a bit-line pair BLi and bBLi disposed in the direction of the column perpendicular to the direction of the row, a sub-cell array portion 21 composed of memory cells MC disposed (disposed in the form of a matrix) corresponding to the intersections and sense amplifier rows 22 disposed on the two sides of the sub-cell array portion 21 and causing a sense amplifier to amplify data read from the memory cell MC of the selected row to the bit line BLi or bBli to output data through a column switch selected by a column decoder (not shown).

As described above, each of the normal banks BANK0 to BANK15 incorporates 256 normal row decoders NRD0 to NRD255 and four spare row decoders SRD0 to SRD3. One normal row decoder undertakes four word lines WL, while one spare row decoder undertakes four spare word lines SWL. In this embodiment, one bank includes 4×156=1024 word lines WL, 4×4=16 spare word lines SWL and 2048 bit-line pairs BL/bBL.

The structure is not limited to the above-mentioned structure that the one row decoder undertakes four word lines WL. Another structure may be employed. The sense amplifier row 22 may be so structured as to be used commonly by adjacent banks or structured to be independent for each bank.

Referring to FIG. 1, substitution is controlled by a non-volatile memory circuit for storing the address of the defect memory cell. The nonvolatile memory circuit is realized by 28 fuse sets FS0 to FS27, the number of which is sufficiently larger than an average number (20 is assumed in this embodiment) of defects in the overall cell. Each of the fuse sets FS0 to FS27 has connected output signal lines which are two substitution-control signal lines RWLON1 and RWLON2 and four spare row decoder selecting lines SRDact0 to SRDact3.

A signal of the first substitution-control signal line RWLON1 is used to selectively control four spare row decoders SRD0 to SRD3 of the normal banks BANK0 to BANK15. A signal of the second substitution-control signal line RWLON2 selectively controls four spare row decoders SRD0 to SRD3 of the spare bank BANKSP.

Signals of the four spare row decoder selecting lines SRDact0 to SRDact3 are used to selectively instruct the four spare row decoders SRD0 to SRD3 of each of all of the normal banks BANK0 to BANK15 and the spare bank BANKSP.

Each of 256 normal row decoders NRD0 to NRD255 of each of the normal banks BANK0 to BANK15 has been supplied with the signals of the two substitution control signal lines RWLON1 and RWLON2 through a NOR gate NOR, the signals being active/deactivate control signals. When both of the two substitution control signal lines RWLON1 and RWLON2 are deactivate ("L" level), operation is permitted. When either of the two substitution control signal lines RWLON1 or RWLON2 is active ("H" level), operation is inhibited.

The normal banks BANK0 to BANK15 are structured such that continuous activation is permitted. Therefore, a state can be realized in which a certain bank is activated and another bank is accessed before the certain bank is again precharged (put standby). That is, the structure is arranged such that the normal row decoders NRD0 to NRD255 and the spare row decoders SRD0 to SRD3 of the selected bank latch the state of the selection to hold the state of selection until a precharge command is issued next.

Specifically, 16 bank active lines BACT0 to BACT15 (not shown) are correspondingly provided for each of the normal banks BANK0 to BANK15. The bank active lines BACT0 to BACT15 are brought to "H" in a period to select and activate the corresponding banks and "L" in the other period. The bank active lines BACT0 to BACT15 latch a state of selection of the row decoder (the normal row decoder or the spare row decoder) corresponding to the selected bank to maintain the state of the selection until a precharge command is issued to the foregoing bank. That is, a row decoder of the normal row decoders NRD0 to NRD255 and four spare row decoders SRD0 to SRD3 in the selected bank which is selected in response to a signal of an address line AR or the like to which a pulse corresponding to the interval of the accesses between different banks can be turned on until the precharge command for the bank is issued.

Figure 3:
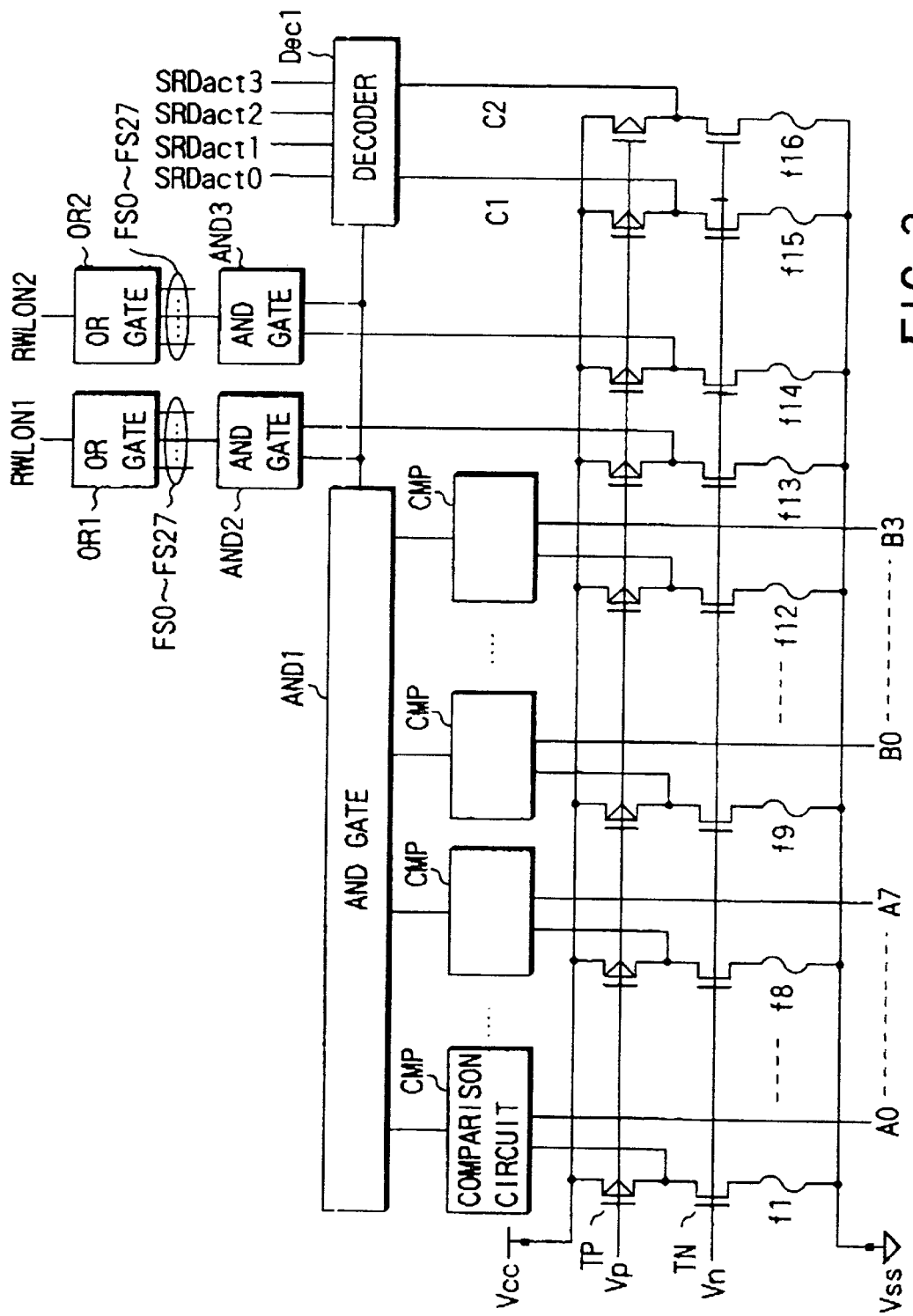
FIG. 3 is a circuit diagram showing a specific example of the structure of one of fuse sets shown in FIG. 1 taken representatively.

FIG. 3 shows a specific example of the structure of one of the fuse sets FS0 to FS27 shown in FIG. 1 which has been taken representatively.

In the fuse set shown in FIG. 3, 12 fuses f1 to f12 to the 16 fuses f1 to f16 store information (information including information of the bank) for instructing the address of the defect memory cell. Eight fuses f1 to f8 of the 12 fuses f1 to f12 instruct the correspondence with 256 row decoder in the bank, four residual fuses f9 to f12 stores information for selecting 16 normal banks BANK0 to BANK15.

The fuse f13 is an enable fuse for selecting a spare element in the normal banks BANK0 to BANK15. The fuse f14 is an enable fuse for selecting a spare element in the spare bank BANKSP. The two residual fuses f15 and f16 store information for instructing correspondence to be established to any one of the four spare row decoders SRD0 to SRD3 in the normal banks BANK0 to BANK15 and the spare bank BANKSP.

In the foregoing case, successive accesses of the bank may occur in the DRAM according to this embodiment. Therefore, one spare bank BANKSP cannot cope with a defect on the rows of a plurality of the normal banks BANK0 to BANK15. Thus, the spare bank BANKSP is made to correspond to any one of the normal banks BANK0 to BANK15. Therefore, cutting of only either of the fuse f13 or the fuse f14 is permitted.

Each of the fuses f1 to f16 is, together with a MOS transistor TP for the precharge and a selecting NMOS transistor TN, connected in series in between a power source (Vcc) node and a ground (Vss) node.

Information stored in each fuse (fuse data) is precharged because the PMOS transistor TP has been turned on and the NMOS transistor TN has been turned off. Then, information above is read in a state where the PMOS transistor TP has been turned off and the NMOS transistor TN has been turned on. If the foregoing fuse is cut, the "H" level is output. If the fuse is not cut, the "L" level is output.

Fuse data (defect address including data of the bank of the memory cell) read (previously stored) in the 12 fuses f1 to f12 and each bit signal of row addresses A0 to A7 corresponding to the input address supplied from outside and bank addresses B0 to B3 are input to 12 comparison circuits CMP. The logical level of corresponding fuse data and the logical level of the address bit are compared with each other so that coincidence of the two logical level is detected.

Each of outputs from the 12 comparison circuits CMP is input to a first AND gate AND1. When coincidence has been detected in all of the 12 comparison circuits CMP, the output of the first AND gate AND1 is activated ("H"). As a result, a decoder Dec1 is activated to decode fuse data items C1 and C2 stored in the two fuses f15 and f16. Thus, the decode output appears in the four spare row decoder selecting lines SRDact0 to SRDact3 connected to the output of the decoder Dec1. Thus, one corresponding spare row decoder of the normal banks BANK0 to BANK15 and the spare row decoders SRD0 to SRD3 in the spare bank BANKSP is instructed.

The output of the first AND gate AND1 and fuse data stored in the fuse f13 are input to a second AND gate AND2. The output of the first AND gate AND1 and fuse data stored in the fuse f14 are input to a third AND gate AND3. The first substitution-control signal line RWLON1 is connected to the output of the second AND gate AND2 through a first OR gate OR1 which calculates the logical OR of the outputs of the second AND gate AND2 of all of the fuse sets FS0 to FS27. The second substitution-control signal line RWLON2 is connected to the output of the third AND gate AND3 through a second OR gate OR2 which calculates the logical OR or the output of the third AND gate AND3 of all of the fuse sets FS0 to FS27.

Therefore, when the output of the first AND gate AND1 has been activated ("H"), either of the output of the second AND gate AND2 or the output of the third AND gate AND3 (that is, either of the first substitution-control signal line RWLON1 or the second substitution-control signal line RWLON2) is made to be "H" in accordance with a fact that cut fuse is the fuse f13 or the fuse f14.

As a result, the output a NOR gate NRO corresponding to a specific row decoder of the normal banks BANK0 to BANK15 to be selected in accordance with the input address from outside is made to be "L". The output of the NOR gate NOR deactivates the specific row decoder.

Simultaneously, activation of a specific spare row decoder in the normal banks BANK0 to BANK15 selected by any one of the spare row decoder selecting lines SRDact0 to SRDact3 and the signal of the first substitution-control signal line RWLON1 or a specific row decoder in the spare bank BANKSP selected bit any one of the spare row decoder selecting lines SRDact0 to SRDact3 and the signal of the second substitution-control signal line RWLON2 is performed.

As described above, the first embodiment has the structure that one spare bank BANKSP in which the spare elements are concentrated is prepared. When one or less normal bank having four or more defects is present, one spare bank BANKSP is made to correspond to the one normal bank. Thus, only 68 (4×17 banks) spares are required.

On the other hand, the conventional DRAM in which all of the spare elements are distributed in each bank must be structured such that 8 spare elements are provided for each bank if one or less bank in which the number of defects is four or larger is present. Thus, 128 (=8×16 banks) spares are required. Therefore, the total number of the spares can considerably be reduced in this embodiment. As a result, the area efficiency of the chip can significantly be improved.

Second Embodiment

A second embodiment will now be described in which a plurality of spare bank are provided by a number with which the area efficiency of the chip can be improved as compared with that of the conventional DRAM if a plurality of banks in each of which the number of defects is larger than 4 according to the distribution of the defect cell array.

Figure 4:
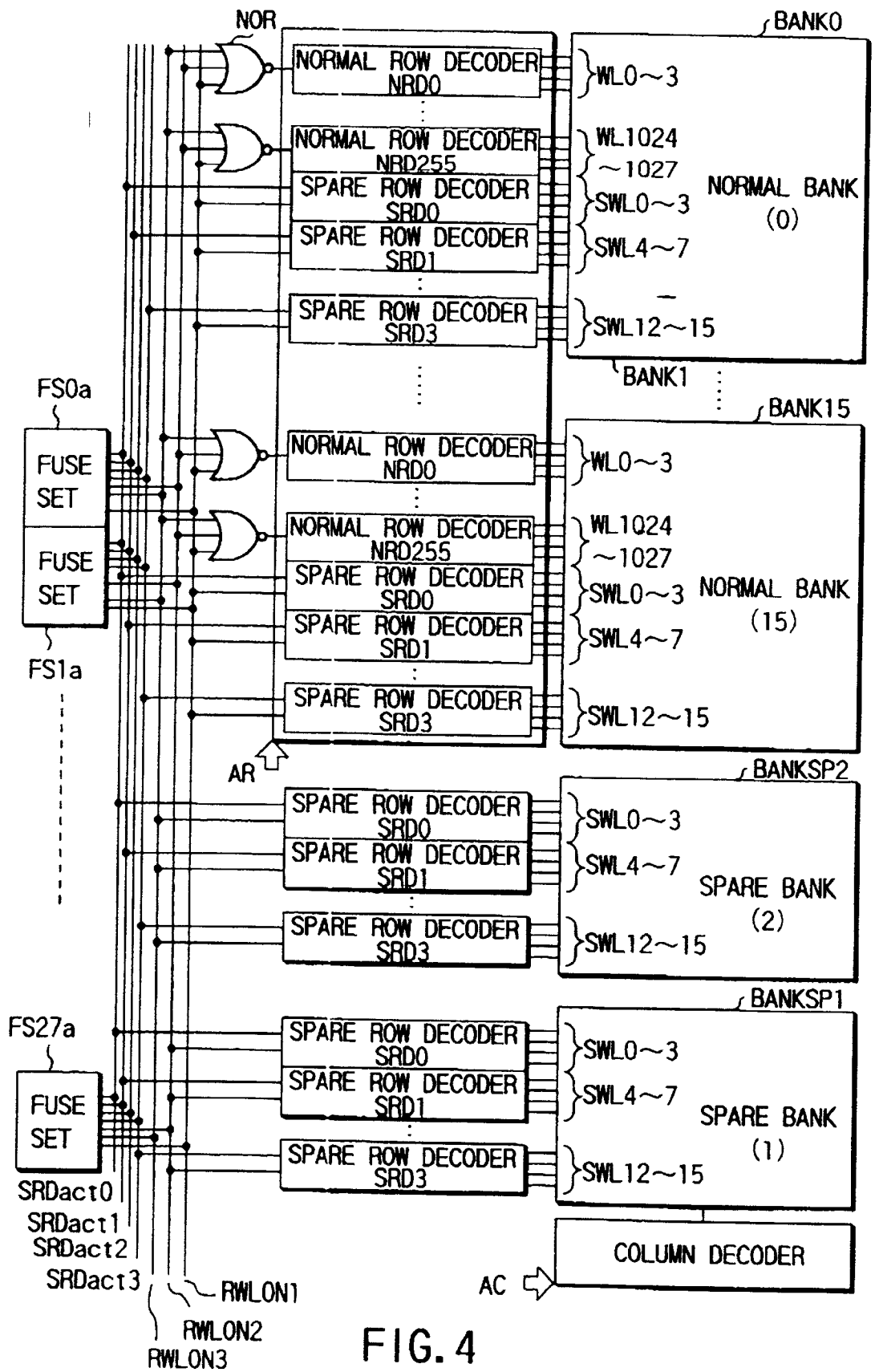
FIG. 4 is a block diagram showing the structure of an essential portion of a DRAM having a multibank structure according to a second embodiment of the present invention.

FIG. 4 schematically shows the structure of an essential portion of the DRAM according to the second embodiment and having the multibank structure.

The DRAM shown in FIG. 4 is different from the DRAM shown in FIG. 1 in the following structure and operation. Since the other structures are the same, the same reference numerals as those shown in FIG. 1 are given the same reference numerals.

(1) Two spare banks (a first spare bank BANKSP1 and a second spare bank BANKSP2). Each of the spare banks BANKSP1 and BANKSP2 has four spare elements (common elements).

(2) As shown in FIG. 3, a first substitution-control signal line RWLON1 and a second substitution-control signal line RWLON2 are connected to each of fuse sets FS0a to FS27a through a first OR gate OR1 and a second OR gate OR2. Similarly, a third substitution control signal line RWLON3 is connected through a third OR gate (not shown) is connected. Moreover, four spare row decoder selecting lines SRDact0 to SRDact3 are connected. In the foregoing case, a signal of the first substitution-control signal line RWLON1 is used to selectively control the spare row decoders SRD0 to SRD3 of the normal banks BANK0 to BANK15. A signal of the second substitution-control signal line RWLON2 is used to selectively control the spare row decoders SRD0 to SRD3 of the first spare bank BANKSP1. A signal of the third substitution control signal line RWLON3 is used to selectively control the spare row decoders SRD0 to SRD3 of the second spare bank BANKSP2. Signals of the four spare row decoder selecting lines SRDact0 to SRDact3 are used to correspondingly instruct the four spare row decoders SRD0 to SRD3 of all of the banks BANK0 to BANK15 and BANKSP1 and BANKSP2.

The normal row decoders NRD0 to NRD255 of each of the normal banks BANK0 to BANK15 have been supplied with the signals of the three first substitution-control signal lines RWLON1, RWLON2 and RWLON3 the NOR gate NOR, the signals being supplied as activation/deactivation control signal. When all of the three first substitution-control signal lines RWLON1, RWLON2 and RWLON3 are deactivate ("L" level), operation is permitted. When any one of the three substitution-control signal lines RWLON1, RWLON2 and RWLON3 is active ("H" level), operation is not permitted.

The DRAM according to the second embodiment attains a similar effect to that obtainable from DRAM according to the first embodiment. If a plurality of banks in each of which the number of defects is four or larger gate to the distribution of the defects in the cell array, relieving can be performed in a range in which the area efficiency of the chip can be improved as compared with that of the conventional DRAM.

Third Embodiment

The first embodiment has the structure that any one of the fuse sets FS0 to FS27, the spares of the normal banks BANK0 to BANK15 and the share of the spare bank BANKSP can be selected. The fuse set one-to-one corresponding to the spare element of the spare bank BANKSP is used for the spare element of the spare bank BANKSP.

Figure 5:
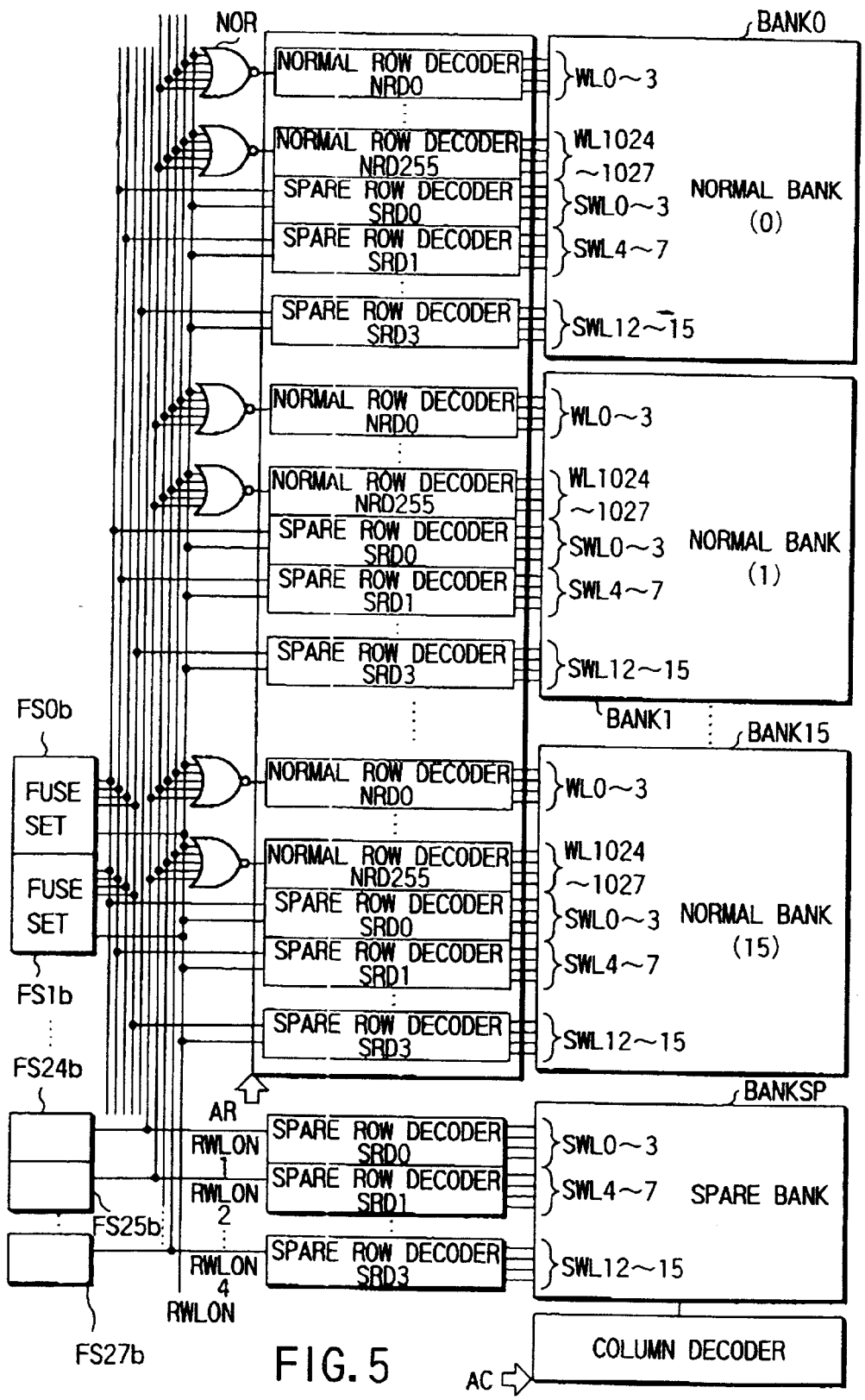
FIG. 5 is a block diagram showing the structure of an essential portion of a DRAM having a multibank structure according to a third embodiment of the present invention.

FIG. 5 schematically shows the structure of an essential portion of the DRAM according to the third embodiment and having the multibank structure.

As compared with the foregoing DRAM shown in FIG. 1, the DRAM shown in FIG. 5 is structured such that four fuse sets FS24b to FS27b fuse the 28 fuse sets FS0b to FS27b are assigned so as to one-to-one correspond to the four spare row decoders SRD0 to SRD3 corresponding to the faun spare element of the spare bank BANKSP. The 24 residual fuse sets FS0b to FS23b are assigned to instruct the spare row decoders SRD0 to SRD3 of the normal banks BANK0 to BANK15. A substitution-control signal line RWLON is connected to the 24 fuse sets FS0b to FS23b through an OR gate (not shown). The substitution-control signal lines RWLON1 to RWLON4 are connected to the four corresponding fuse sets FS24b to FS27b. The signals of the five substitution control lines RWLON and RWLON1 to RWLON4 are input to control the spare row decoders SRD0 to SRD3 of the normal banks BANK0 to BANK15. The foregoing structures are different. Since the other structures are the same, the same elements are given the same reference numerals as in FIG. 1.

In the foregoing case, the fuse sets FS0b to FS27b do not require the enable fuse f14 for selecting the spare element in the spare bank BANKSP as compared with the fuse sets FS0 to FS27 shown in FIG. 4. The four fuse sets FS24b to FS27b for the spare bank BANKSP do not require the fuses f15 and f16 for instructing the correspondence with the four spare row decoders SRD0 to SRD3 and the decoder Dec1 of the corresponding fuse data items C1 and C2. Therefore, the total number of the fuses can be reduced.

Figure 6:
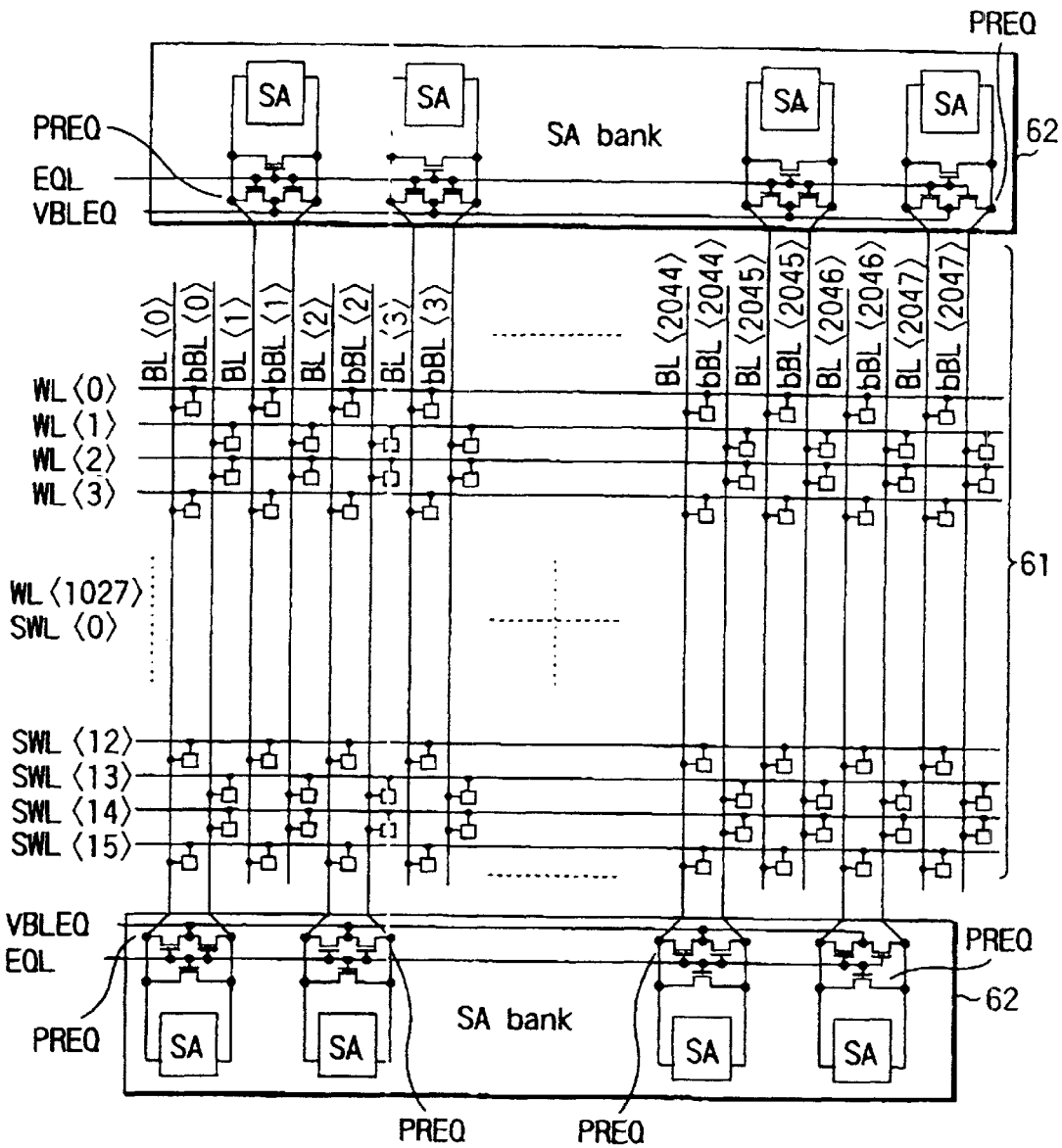
FIG. 6 is a circuit diagram showing a detailed structure of a portion of the bank shown in FIG. 2.

The DRAM according to the third embodiment attains a similar effect obtainable from the DRAM according to the first embodiment. Moreover, the total number of the fuse sets FS0b to FS27b can be reduced. Modification of First to Third Embodiments FIG. 6 shows a portion of a modification of the bank described with reference to FIG. 2.

The bank according to this modification incorporates a sub-cell array 61 and equalizing circuit and sense amplifier rows 62. The equalizing circuit and sense amplifier rows 62 are disposed on the two sides of a sub-cell array 61 and provided with a plurality of equalizing circuits PREQ which are controlled in response to an equalizing signal EQL to precharge/equalize the bit-line pair BL/bBL to the equalizing potential VBLEQ of the bit line and a plurality of sense amplifiers SA for sense-amplifying data read from memory cell MC of the selected row to the bit line BL or bBL.

The sense amplifier SA communicates data with respect to a data line (not shown) through a column switch (not shown) which is controlled in response to a column selection signal output from the column decoder CD. To control the equalizing circuit and sense amplifier row 62, a sense amplifier control circuit (not shown) including an equalizing signal generating circuit is provided for the bank.

When a bank active signal for activating the corresponding bank has been supplied to the sense amplifier control circuit (when a command to activate the bank has been issued), equalizing of the bit line of the corresponding bank is suspended to realize a state for standby for selection of a word line.

After determination of the selection of the selection of the normal row decoder/selection of the spare row decoder by the fuse sets FS0 to FS27 has been waited for, control is performed such that the suspended state of the equalizing of the bit line of the corresponding bank is continued.

In the first to third embodiments, substitution for a defect word line is performed. Also in a case where substitution for a defect column selecting line (a defect bit line) is performed, a structure similar to that according to the first to third embodiments may be employed.

Fourth Embodiment

Figure 7:
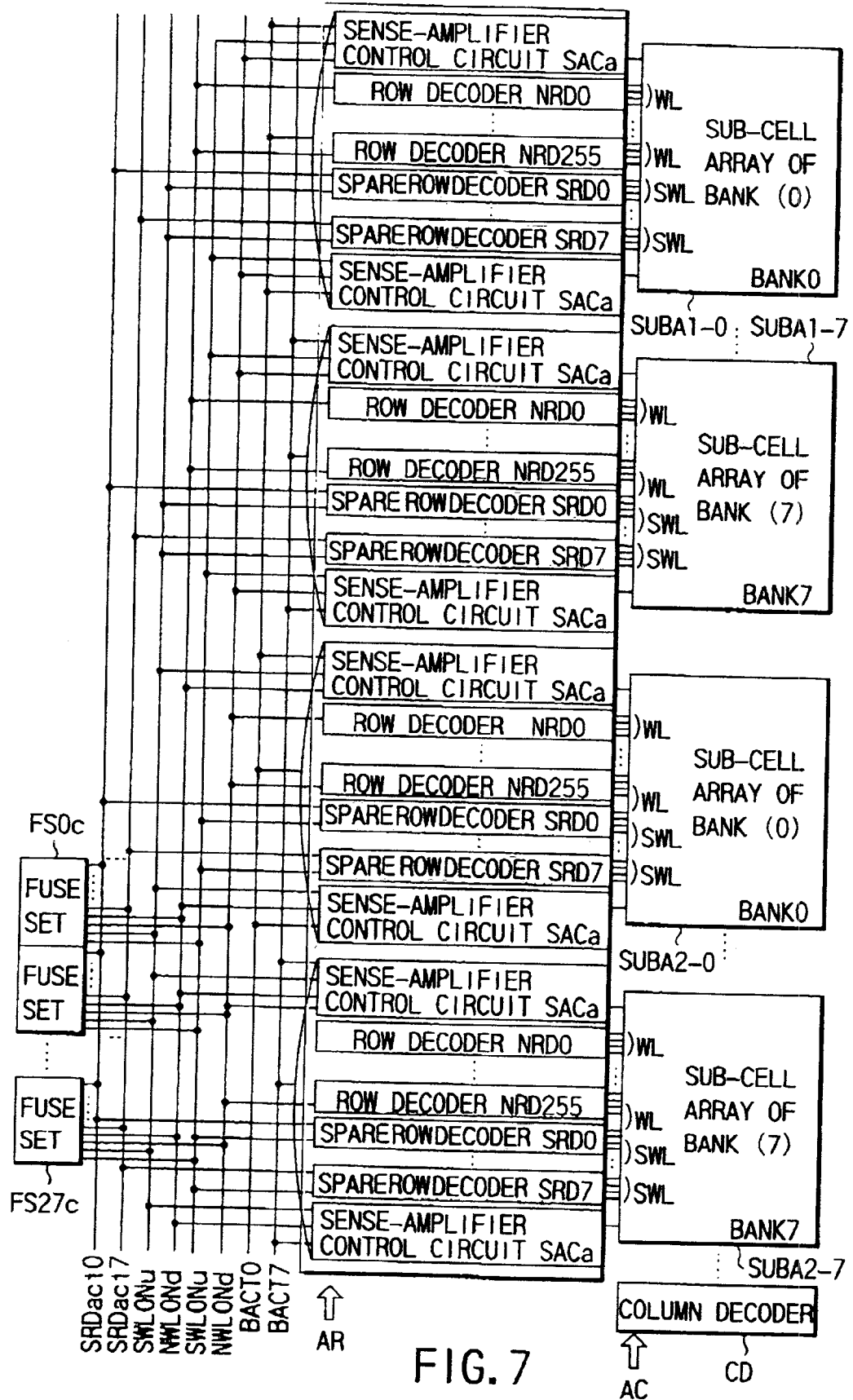
FIG. 7 is a block diagram showing the structure of an essential portion of a DRAM having a multibank structure according to a fourth embodiment.

FIG. 7 schematically shows the structure of an essential portion of a DRAM according to a fourth embodiment and having a multibank structure. As a redundant circuit for relieving a defect memory cell, a structure is employed in which a row spare is provided which relieving the defect memory cell in row units and no column spar for relieving the same in column units is not provided.

The characteristic of the DRAM shown in FIG. 7 lies in that an assigning means is provided which selectively assigns at least a portion of a plurality of spare elements in each of the sub-arrays SUBA1-0 to SUBA1-7 and SUBA2-0 to SUBA2-7 to another sub-array belonging to the same bank.

Since the assigning means is provided, substitution of a row spare in another sub-array in the same bank for a defect row in a certain sub-array can be performed. 1n a conventional DRAM, only substitution of a row spare in the same sub-array for a defect row in a certain sub-array has been permitted.

The assigning means incorporates the following elements.

That is, the assigning incorporates two normal-row-decoder selection control lines NWLONu and NWLONd provided to correspond to two sets of sub-arrays (SUBA1-0 to SUBA1-7) and (SUBA2-0 to SUBA2-7) constituting eight memory banks BANK0 to BANK7 and arranged to selectively instruct the corresponding sub-arrays in each set; and two spare-row-decoder selection control lines SWLONu and SWLONd for selectively instructing corresponding sub-array in each set. Moreover, fuse sets FS0c to FS27c having a function to output a signal defect memory cell selectively instructing the two spare-raw-decoder selection control lines SWLONu and SWLONd in accordance with information of the correspondence with each set of the sub-arrays which have been stored when the spare row decoders SRD0 to SRD7 are selectively operated in accordance with a detection result of the coincidence of the defect address.

The outline of the DRAM shown in FIG. 7 will no be described. The DRAM has the following structural characteristics (1) to (4) to realize the assigning means.

(1) Eight bank active lines BACT0 to BACT7 are provided to correspond to eight memory banks BANK0 to BANK7. The bank active lines BACT0 to BACT7 are brought to "H" in a period in which the bank active lines BACT0 to BACT7 select and activate the corresponding banks. In the other period, the bank active lines BACT0 to BACT7 are brought to "L".

(2) A first normal-row-decoder selection control line NWLONu is connected to the normal row decoders NRD0 to NRD255 in the eight sub-cell arrays (SUBA1-0 to SUBA1-7) forming a first set in the eight memory banks BANK0 to BANK7. A second normal-row-decoder selection control line NWLONd is connected to the normal row decoders NRD0 in the eight sub-cell arrays (SUBA2-0 to SUBA2-7) forming a second set.

(3) A first spare-row-decoder selection control line SWLONu is connected to the spare row decoders SRD0 to SRD7 of the eight sub-cell arrays (SUBA1-0 to SUBA1-7) forming the first set of the eight memory banks BANK0 to BANK7. A second spare-row-decoder selection control line SWLONd is connected to the spare row decoders SRD0 to SRD7 of the eight sub-cell arrays (SUBA2-0 to SUBA2-7) forming the second set.

(4) The 28 fuse sets FS0c to FS27c provided to serve as a nonvolatile memory circuit for storage the address of the defect memory cell are connected to the two normal-row-decoder selection control lines NWLONu and NWLONd through an AND gate (not shown) as described later. Moreover, the fuse sets FS0c to FS27c are connected to the two spare-row-decoder selection control Lines SWLONu and SWLONd through an OR gate (not shown).

(5) When a bank active signal has been supplied from the corresponding bank active lines BACT0 to BACT7 (when a bank activation command has been issued), a sense-amplifier control circuit SACa corresponding to each of the sub-arrays SUBA1-0 to SUBA1-7 and SUBA2-0 to SUBA2-7 suspends equalizing of the bit line of the two sets of the sub-arrays (SUBA1-0 to SUBA1-7) and (SUBA2-0 to SUBA2-7) in the eight memory banks BANK0 to BANK7 to realize a state in which selection of the word line is waited for.

Then, determination of the selection of the normal row decoder/selection of the spare row decoder which is performed by the fuse sets FS0c to FS27c is waited for. Then, equalizing of the bit line of one sub-cell array of the two sets of the sub-cell arrays (SUBA1-0 to SUBA1-7) and (SUBA2-0 to SUBA2-7) to be activated is suspended. Moreover, equalizing of the bit-line equalizing circuit of one set of the sub-cell array to be deactivated is restarted.

The operations of the structures (1) to (5) will now be described.

When an attempt is made to access one sub-cell array SUBA1-0 belonging to the first set of the bank BANK0 equalizing circuits corresponding to the two sub-cell arrays SUBA1-0 and SUBA2-d corresponding to the bank BANK0 are turned off.

When the defect address and the outer address do not coincide with each other in the foregoing case when no substitution is performed), the outputs from the fuse sets FS0c to FS27c activate only the first normal-row-decoder selection control line NWLONu of the two normal-row-decoder selection control lines NWLONu and NWLONd. Only one sub-cell array (SUBA1-0 belonging to the first set of the bank BANK0 is accessed. Any one of the normal row decoders NRD0 to NRD255 of the sub-cell array is selected in accordance with the outer address. The equalizing circuit corresponding to the sub-cell array SUBA2-0 belonging to the second set of the bank BANK0 is turned on so that the sub-cell array SUBA2-0 is deactivated.

When the defect address and the outer address coincide with each other (when the substitution is performed), the outputs of the fuse sets FS0c to FS27c activate only either of the two spare-row-decoder selection control lines SWLONu and SWLONd of the four selection control lines NWLONu, NWLONd, SWLONu and SWLONd. When the first spare-row-decoder selection control line SWLONu has been accumulated, any one of the spare raw decoders SRD0 to SRD7 in one sub-cell array SUBA1-0 belonging to the first set of the bank BANK0 is selected in accordance with the outputs from the fuse sets FS0c to FS27c. Then, the equalizing circuit corresponding to the sub-cell array SUBA2-0 bit line to the second set of the bank BANK0 is turned on so that the sub-cell array SUBA2-0 is deactivated.

The structure of the DRAM shown in FIG. 7 will now be described.

The overall body of the memory cell array is divided into the eight memory banks BANK0 to BANK7. That is, the eight memory banks BANK0 to BANK7 are divided into the two sets of the eight sub-cell arrays (SUBA1-0 to SUBA1-7) forming the first set and the eight sub-cell arrays (SUBA2-0 to SUBA2-7) forming the second set. The memory banks BANK0 to BANK7 are structured to successively be activated. Therefore, there is the possibility that another bank is accessed before a certain bank, which has been activated, is again precharged (brought to a standby state).

The column decoder CD decodes the column address AC to select the column of each of the SUBA1-0 to SUBA1-7 and SUBA2-0 to SUBA2-7.

Figure 8:
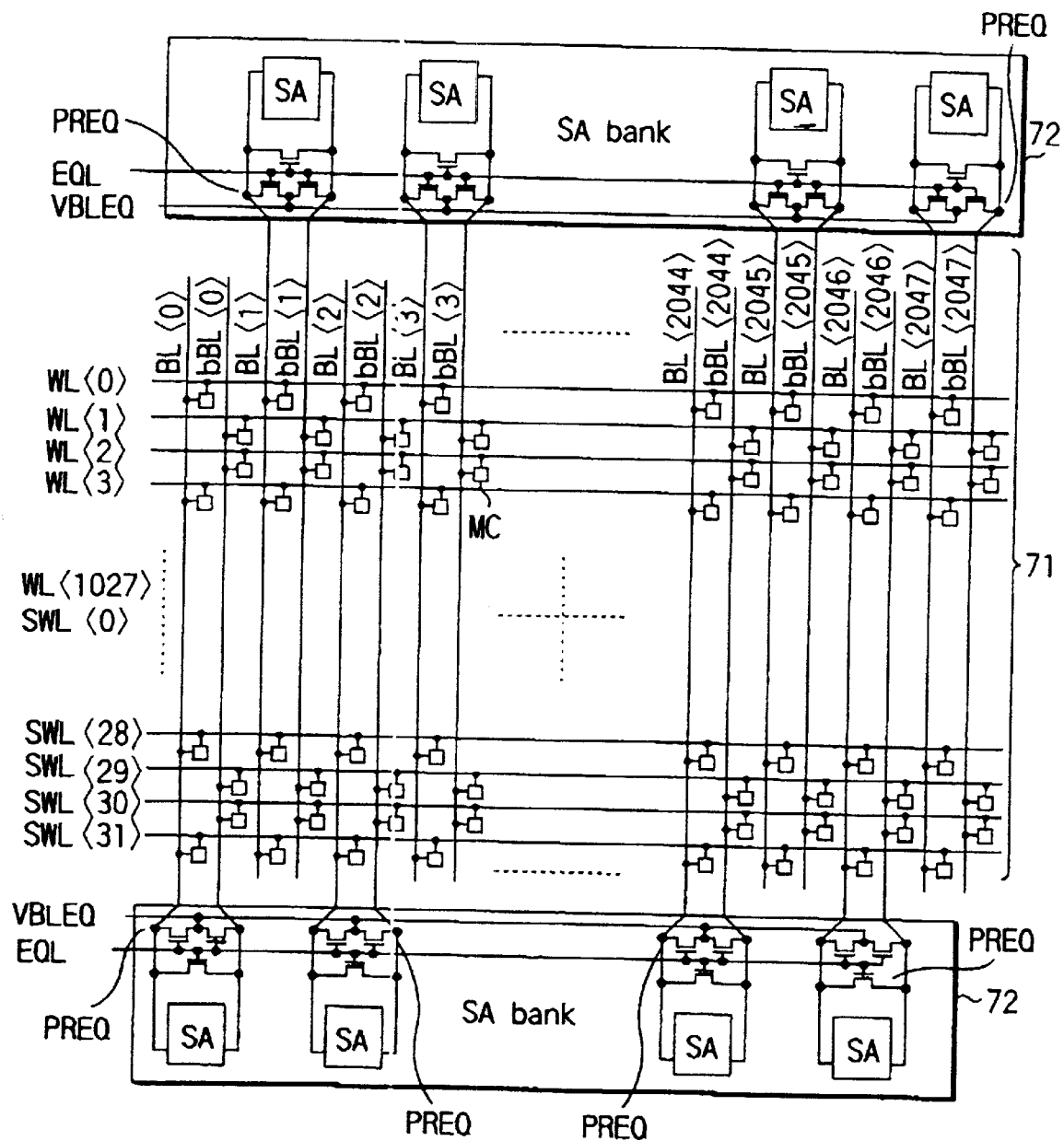
FIG. 8 is a circuit diagram showing a specific example of the structure of one of the sub-arrays shown in FIG. 7 taken representatively.

Each of the sub-cell arrays SUBA1-0 to SUBA1-7 and SUBA2-0 to SUBA2-7, as shown in FIG. 8, incorporates a sub-cell array portion 71 and an equalizing circuit/sense amplifier row 72.

Referring to FIG. 8, the sub-cell array portion 71 incorporates word lines WORD LINE, spare ward lines SWL disposed in the direction of the row, bit line pair BL/bBL and memory cells MC disposed to correspond to the intersections. In this embodiment, one normal row decoder undertakes four word lines WL, while one spare row decoder uses four spare word lines SWL. In one sub-cell array portion 71, 4×256=1024 word lines WL, 4×8=32 spare word lines SWL and 2048 bit line pairs HL/bBL are present.

The equalizing circuit/sense amplifier row 72 incorporates a plurality of equalizing circuits PREQ which are disposed on the two sides of the sub-cell array portion 71, which are controlled in response to an equalizing signal EQL and which are arranged to precharge/equalize the bit line pair BL/bBL to the equalizing potential VBLEQ for the bit line; and a plurality of sense amplifiers SA for sense-amplifying data read to the bit line BL or bBL from the memory cell of the selected row.

The sense amplifier SA communicates data with respect to the data line (not shown) through a column switch (not shown) which is controlled in response to a column selection signal output from the column decoder CD.

The structure is not limited to the foregoing structure that one row decoder undertakes four word lines WL. Another structure may be employed.

Moreover, 256 normal row decoders NRD0 to NRD255, 8 spare row decoders SRD0 to SRD7 and the sense-amplifier control circuit SACa for controlling the equalizing circuit/sense amplifier row 72 disposed on each of the two sides of the sub-cell array portion 71 are provided to correspond to each of the sub-cell arrays SUBA1-0 to SUBA1-7 and SUBA2-0 to SUBA2-7. The sense-amplifier control circuit SACa includes an equalizing signal generating circuit for generating an equalizing signal to be supplied to the equalizing circuit PREQ of the corresponding equalizing circuit/sense amplifier row 72.

The first normal-row-decoder selection control line NWLONu (which is brought to the active state "H" level when selection is performed for selectively controlling the normal row decoders NRD0 to NRD255 are connected to the normal row decoders NRD0 to NRD255 of the eight sub-cell arrays (SUBA1-0 to SUBA1-7) forming the first set of the eight memory banks BANK0 to BANK7.

The second normal-row-decoder selection control line NWLONd (which is brought to the active state "H" level when selection is performed) for selectively controlling the normal row decoders NRD0 to NRD255 are connected to the normal row decoders NRD0 to NRD255 of the residual eight sub-cell arrays (SUBA2-0 to SUBA2-7) forming the second set.

The first spare-row-decoder selection control line SWLONu (which is brought to the active state "H" level when selection is performed) for selectively control ling the spare row decoders SRD0 to SRD7 is connected to the spare row decoders SRD0 to SRD7 of the eight sub-cell arrays (SUBA1-0 to SUBA1-7) forming the first set.

The second spare-row-decoder selection control line SWLONd (which is brought to the active state "H" level when selection is performed) for selectively controlling the spare row decoders SRD0 to SRD7 is connected to the spare row decoders SRD0 to SRD7 of the eight sub-cell arrays (SUBA2-0 to SUBA2-7) forming the second set.

Eight spare row decoder selecting lines SRDact0 to SRDact7 (which is brought to the active state "H" level when selection is performedfor instructing one of the eight spare row decoders SAD0 to SRD7 to be selected are connected to the eight spare row decoders SRD0 to SRD7 of all of the memory banks BANK0 to BANK7.

Moreover, eight bank active lines BACT0 to BACT7 corresponding to the eight memory banks BANK0 to BANK7 are provided. The bank active lines BACT0 to BACT7 are brought to "H" in a period in which the bank active lines BACT0 to BACT7 select and activate the corresponding banks and brought to "L" in the other period. The bank active lines BACT0 to BACT7 latch the state of selection of the row decoder the normal row decoder or the spare row decoders corresponding to the selected bank and hold the selected state until a precharge command to the bank is issued.

That is, the row decoder selected in response to the signals from the address line AR to which a pulse corresponding to the interval of accesses between different banks, the first normal-row-decoder selection control line NWLONu, the second normal-row-decoder selection control line NWLONd, the first spare-row-decoder selection control line SWLONu the second spare-row-decoder selection control line SWLONd and the eight spare row decoder active lines SRDact0 to SRDact7 among the normal row decoders NRD0 to NRD255 and the eight spare decoders SRD0 to SRD7 of the selected bank can be turned on until a precharge command for the bank is issued.

Figure 9:
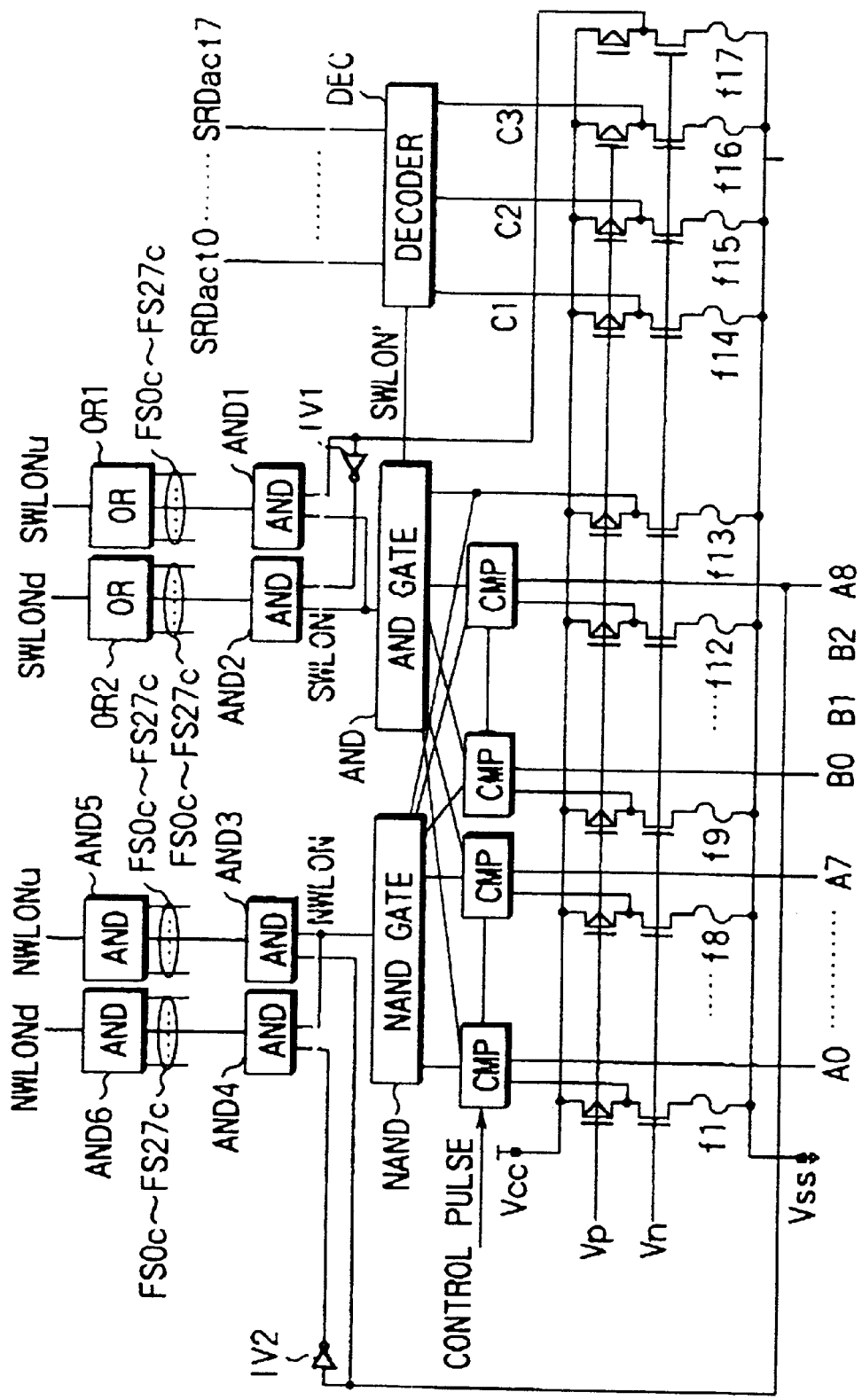
FIG. 9 is a circuit diagram showing a specific example of the structure of one of fuse sets shown in FIG. 7 taken representatively.

FIG. 9 representatively shows the specific structure of one of the fuse sets FS0c to FS27c shown in FIG. 7.

The fuse set has the following characteristics.

(1) One fuse f17 is added to instruct the spare element of the two sets of the sub-arrays constituting the eight memory banks BANK0 to BANK7 to be selected in accordance with the state of conduction/non-conduction of the fuse f17.

(2) The outputs of the 12 comparison circuits CMP, the output of the multi-input AND gate AND to which the output of the fuse f13 is input and the output of the fuse f17 are input to a two-input first AND gate AND1 so that the logical product of the outputs is calculated. The outputs of the logical products of the first AND gates AND1 of all of the fuse sets FS0c to FS27c are output to the first spare-row-decoder selection control line SWLONu through the first OR gate OR1. A signal formed by inverting the output of the AND gate AND is input to the two-input second AND gate AND2 so that their logical product is calculated. Each of the output of the logical product of the second AND gates AND2 of all of the fuse sets FS0c to FS27c is output to the second spare-row-decoder Selection control line SWLONd through the second OR gate OR2.

(3) The outputs of the 12 comparison circuits CMP, the output of the HAND gate NAND to which the output of the fuse f13 is input and the signal of the address bit A8 for instructing selection of either of the two sets of the sub-arrays constituting the eight memory banks BANK0 to BANK7 are input to the two-input third AND gate AND3. Thus, the logical product is calculated. Each of the output of the logical products from the third AND gates AND3 of all of the fuse sets FS0c to FS27c is output to the first normal-row-decoder selection control line NWLONu through a fifth AND gate AND5. The signal formed by inverting the address bit AS by an inverter IV2 and the output of the NAND gate NAND is input to the two-input fourth AND gate AND4 so chat their logical product is calculated. Each of the output of the logical products of the fourth AND gates AND4 of all of the fuse sets FS0c to FS27c is output to the second normal-row-decoder selection control line NWLONd through a sixth AND gate AND6.

That is, the 12 fuses f1 to f12 of the 16 fuses f1 to f16 of the fuse set shown in FIG. 4 store information (information as well as including the bank to be instructed) for instructing the defect address of the memory cell. The fuse f13 stores flag information indicating whether or not the foregoing fuse set is used. The three fusses f14 to f16 store information for instructing the spare row decoder among the eight spare row decoders SRD0 to SRD7 in the bank.

Eight fuses f1 to f8 of the 12 fuses f1 to f12 for storing information of instruction of the defect address are used to instruct the correspondence with the 256 normal row decoders NRD0 to NRD255 in the bank. The four residual fuses f9 to f12 store information for selecting 16 sub-arrays SUBA1-0 to SUBA1-7 and SUBA2-0 to SUBA2-7.

Each of the fuses f1 to f16 is, in series, connected between the power source (Vcc) node and the ground (Vss) node together with the PMOS transistor TP for the precharge and the selecting NMOS transistor TN.

Information fuse data) stored in each fuse is precharged because the PMOS transistor TP has been turned on and the NMOS transistor TN has been turned off. Then, stored information is read in a state where the PMOS transistor TP has been turned off and the NMOS transistor TN has been turned on, when the fuse has been cut at this time, the "H" level is output. When the fuse has not been cut, the "L" level is output.

Fuse data read from the 12 fuses f1 to f12 and each bit signal of each of the row addresses A0 to A7, the bank addresses B0 to B2 and the row address A8 are input to the comparison circuit CMP. The comparing operation of the comparison circuit CMP is controlled in response to a pulse signal such that fuse data and the input address are compared with each other to detect coincidence of fuse data and the input address.

The row address A8 is used to distinguish, from each other, the two sets of the sub-arrays the (SUBA1-0 to SUBA1-7) in the upper set and the SUBA2-0 to SUBA2-7 in the lower set shown in FIG. 7) constituting the memory banks BANK0 to BANK7.

Each of detection output of the 12 comparison circuits CMP corresponding to the row addresses A0 to A7, the bank addresses B0 to B2 and the row address A8 and the output from the fuse f13 for storing enable information are input to the AND gate AND so that their logical product is calculated.

The decoder DEC is supplied with the control signal SWLON', the phase of which is the same as that of the output of the AND gate AND, the control signal SWLON' being supplied as an activation/deactivation control signal. The decoder DEC decodes output data from the fuses f14 to f16 to output a result of the decoding operation to the eight spare row decoder active lines SRDact0 to SRDact7.

Figures 10A, 10B:
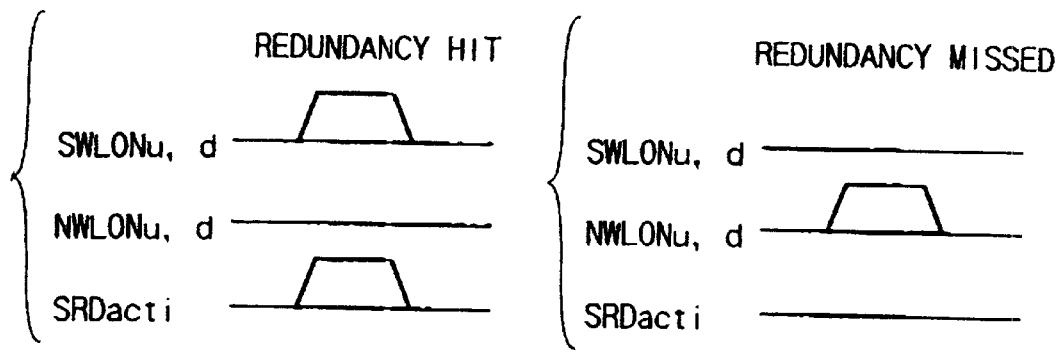
FIGS. 10A and 10B are graphs showing the waveforms to described two different operations of the fuse sets shown in FIG. 9.

Each of the detection output from each of the 12 comparison circuits CMP corresponding to the row addresses A0 to A7, the bank addresses B0 to B2 and the row address A8 and the output of the fuse f13 for storing enable information is input to the HAND gate NAND so that their logical OR is calculated, The operation which is performed when data Of the fuse f13 of the fuse set shown in FIG. 9 will now be described with reference to FIGS. 10A and 108.

When data of the address input A0 to A8 and B0 to B2 and that of the fuses f1 to f12 coincide with each other when redundancy hit occurs), the output of the AND gate AND is made to be "H" for a predetermined period (mad to be "L" in the other period).

In accordance with a state of conduction/non-conduction of the fuse f17, the first spare-row-decoder selection control line SWLONu or the second spare-row decoder selection control line SWLONd is made to be "H" in a predetermined period (made to be "L" in the other period). Thus, activation of spare row decoders SRD0 to SRD7 of one selected sub-array of the two sets of the sub-arrays (SUBA1-0 to SUBA1-7) and (SUBA2-0 to SUBA2-7) can be performed.

At this time, the decoder DEC is activated in response to the control signal SWLON'. Thus, one of spare-row-decoder active line SRDacti of the eight spare row decoder active lines SRDact0 to SRDact7 is made to be "H" in accordance with fuse data of the fuses f14 to f16. As a result, one of the eight spare row decoders sRD0 to SRD7 in the selected sub-array is selected.

When redundancy hit occurs, the output of the HAND gate NAND is made to be "L" (which is opposite to the logical level of the output of the AND gate AND) for a predetermined period ("L" in the other period). At this time, the first normal-row-decoder selection control line NWLONu and the second normal-row-decoder selection control line NWLONd are "L" regardless of the logical level of the row address A8. Thus, the normal row decoders NRD0 to NRD255 of the selected sub-array are deactivated.

When the input address and fuse data do not coincide with each other (redundancy missed), the output of the NAND gate HAND is made to be "H" for a predetermined period ("L" in the other period).

In accordance with the logical level of the row address A8, the first normal-row-decoder selection control line NWLONu normal decoder the second normal-row-decoder selection control line NWLONd are made to be "H" for a predetermined period ("L" in the other period). Thus, the normal row decoders NRD0 to NRD255 of the selected set of the two sets of the sub-arrays (SUBA1-0 to SUBA1-7) and (SUBA2-0 to SUBA2-7) are activated in accordance with the addresses A0 to A7 and B0 to B2.

When the redundancy missed occurs, the "L" level of the output of the AND gate AND is maintained. At this time, the first spare-row-decoder selection control line SWLONu and the second spare-row-decoder selection control line SWLONd are "L" regardless of the state of conduction/non-conduction of the fuse f17. Thus, the spare row decoders SRD0 to SRD7 of the selected sub-array are deactivated. At this time, the decoder DEC is deactivated in response to the control signal SWLON'. Therefore, all of the eight spare raw decoder active lines (spare-decoder selecting lines) SRDact0 to SRDact7 are made to be "L" level.

That is, each of the fuse sets FSO0c to FS27c incorporates the following elements.

The elements are consisting of a first storage means (the fuses f1 to f12) for storing the address of the defect memory cell; a second storage means the fuse f17) for storing information of the correspondence with the two sets of the sub-arrays (SUBA1-0 to SUBA1-7) and (SUBA2-0 to SUBA2-7) constituting the eight memory banks BANK0 to BANK7; and a third storage means (the fuses f14 to f16) for storing information of the correspondence with the eight spare row decoders SRD0 to SRD7.

Moreover, the elements are consisting of the comparison circuit CMP for making a comparison between information stored in the first storage means and the input addresses A0 to AB; and first output circuits (AND, AND1 and AND2) for outputting a signal for activating either of the first spare-row-decoder selection control line SWLONu or the second spare-row-decoder selection control line SWLONd in accordance with the output representing a result of the comparison made by the comparison circuit and information stored in the second storage means.

Moreover, the elements are consisting of a second output circuit (DECfor outputting a signal for selectively activating the eight spare row decoder selecting lines SRDact0 to SRDact7 in accordance with information stored in the third storage means when either of the first spare-row-decoder selection control line SWLONu or the second spare-row-decoder selection control line SWLONd is activated; and a third output circuit (NAND, AND3 and AND4) for outputting a signal for activating either of the first normal-row-decoder selection control line NWLONu or the second normal-row-decoder selection control line NWLONd in accordance with the output representing a result of the comparison made of the comparison circuit and the input address A8.

Figure 11A:
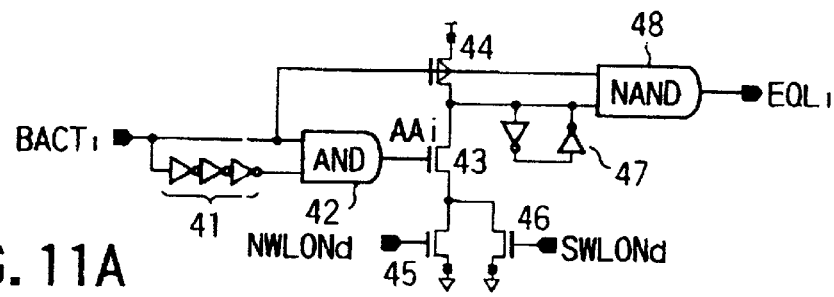
FIGS. 11A and 11B are a circuit diagram and a graph showing waveforms to describe an example of the operation of an equalizing signal generating circuit included in a sense-amplifier control circuit SACa provided to correspond to a sub-array SUBA1-0 in each sense-amplifier control circuit SACa shown in FIG. 8.

FIG. 11A shows an example of an equalizing signal generating circuit EQLGEN included in a sense-amplifier control circuit SACa provided to correspond to one sub-array SUBA1-$i$ belonging to the sub-arrays (SUBA1-0 to SUBA1-7) in the first set of the sense-amplifier control circuits SACa provided to correspond to the SUBA1-0 to SUBA1-7 and the SUBA2-0 to SUBA2-7, the sense-amplifier control circuit SACa being representatively taken.

Figure 11B:
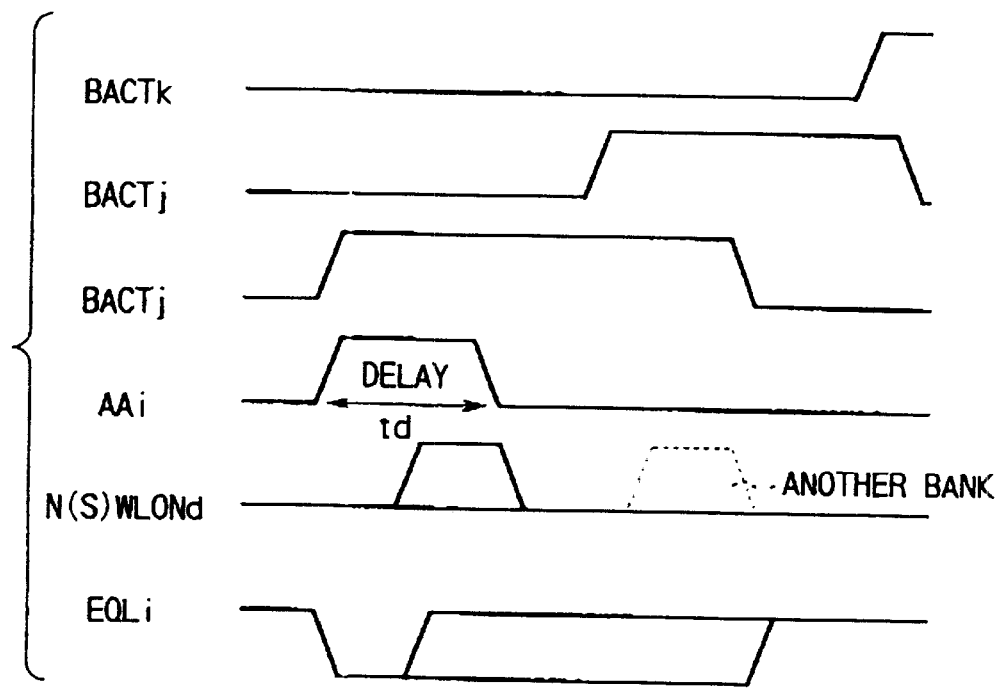

FIG. 11B shows a state in which the bank active signals BACTi, BACTj, BACTk, . . . , are successively supplied such that supply of the next signal BACTj is started during supply of the signal BACTi.

The equalizing signal generating circuit EQLGEN shown in FIG. 11A generates an equalizing signal (EQLi), the phase of which is opposite to that of the input bank active signal (BACTi in this embodiment). The equalizing-signal generating circuit EQLGEN incorporates the following elements.

The elements are consisting of a delay gate 41 to which a bank active signals BACTi supplied from the corresponding bank active lines BACT0 to BACT7 are input and which delays the bank active signal BACTi, for a predetermined period td and invert and output the bank active signal BACTi; and a two-input AND gate 42 to which the output of the delay gate 41 and the bank active signal BACTi are input.

The elements are furthermore consisting of a first NMOS transistor 43 having a gate to which the output signal AAi of the AND gate 42 is input; a first PMOS transistor 44 having a gate to which the bank active signal BACTi, is input and connected between the power source (Vcc) node and the drain of the first NMOS transistor 43; a second NMOS transistor 45 having a gate to which a second normal-row-decoder selection control signal supplied from the second normal-row-decoder selection control line NWLONd corresponding to the sub-arrays (SUBA2-0 to SUBA2-7) in the second set is input and connected between the source of the first NMOS transistor 43 and the ground potential (Vss) node; and a third NMOS transistor 46 having a gate to which the second spare row decoder selection control signal supplied from the second spare-row-decoder selection control line SWLONd corresponding to the sub-arrays (SUBA2-0 to SUBA2-7) in the second set is input and connected between the source of the first NMOS transistor 43 and the ground potential (vss) node.

Moreover, the elements are consisting of a latch circuit 47 having input/output nodes connected to the drain connecting nodes of the first PMOS transistor 44 and the first NMOS transistor 43; and a two-input NAND gate 48 to which the output of the latch circuit 47 and the bank active signal BACTi are input and which outputs the equalizing signal EQLi.

The delay gate 41 and the AND gate 42 generate the output signal AAi having a pulse width corresponding to the delay time td from the front end of the bank active signal BACTi.

The operation of the equalizing-signal generating circuit EQLGEN shown in FIG. 11A will now be described with reference to FIG: 11B.

When the level of the bank active signal BACTi supplied from the bank active line BACTi corresponding to the sub-array SUBA1-i of the two SUBA1-i and SUBA2-i of the bank BANKi is raised from "L" to "A" (activated); the equalizing signal EQLi which is the output of the HAND gate 48 is made to be "L" from "H" (activated). When the level of the bank active signal BACTi has been raised, the output signal AAi of the AND gate 42 is made to be "H". Thus, the first NMOS transistor 43 is turned on.

After a certain delay time has elapsed from rise of the bank active signal BACTi (that is, after determination of the selection of the normal row decoder/the selection of the spare row decoder by the fuse sets FS0c to FS27c has been made), "H" is output to only one of the four row-decoder selection control lines NWLONu, NWLONd, SWLONu and SWLONd.

Assuming that the sub-array SUBA2-i belonging to the sub-arrays (SUBA2-0 to SUBA2-7) in the second set is activated, "H" is output to the second normal-row-decoder selection control line NWLONd or the second spare row-decoder selection control line SWLONd corresponding to the sub-arrays (SUBA2-0 to SUBA2-7) in the second set.

As a result, the second NMOS transistor 45 or the third NMOS transistor 46 is turned on so that the drain corresponding nodes of the first PMOS transistor 44 and the first NMOS transistor 43 are made to be "L". The "L" level is latched by the latch circuit 47.

Thus, the equalizing signal EQLi which is the output of the (NAND, gate 48 is changed from "L" to "K" (deactivated) so that the sub-array SUBA1-i belonging to the sub-array (SUBA1-0 to SUBA1-7) in the first set is deactivated.

When the bank active signal BACTi has been returned from "H" to "L" (deactivated), the first PMOS transistor 44 is turned on. Moreover, the drain corresponding nodes of the first PMOS transistor 44 and the first NMOS transistor 43 are made to be "N" (Vcc). The "H" level is latched by the latch circuit 47.

A state will now be considered in which the bank active signal BACTj bank active signal BACTj supplied from the other bank active lines BACT0 to BACT7 when the bank active signal BACTi is "H" (in an active state) causes the sub-arrays in another bank to successively be selected. In the foregoing case, "H" is again output to any one of the four raw-decoder selection control line NWLONu, NWLONd, SWLONu and SWLONd, as indicated with a dashed line shown in FIG. 11B.

The equalizing signal generating circuit of the sense-amplifier control circuit SACa provided to correspond to the sub-array SUBA2-i bit to the sub arrays SUBA2-0 to SUBA2-7) in the second set is different from the equalizing signal generating circuit shown in FIG. 11A in the following structure: the second NMOS transistor 45 and the third NMOS transistor 46 are supplied with the signals output from the first normal-row-decoder selection control line NWLONu and the first spare-row-decoder selection control line SWLONu corresponding to the sub-arrays (SUBA1-0 to SUBA1-7) in the first set.

In a state where the "L" level of the first normal-row-decoder selection control line NWLONu and the first spare-row-decoder selection control line SWLONu has been supplied to the equalizing-signal generating circuit corresponding to the sub-array SUBA2-i, the OFF-states of the second NMOS transistor 45 and the third NMOS transistor 46 are maintained.

Therefore, the "H" level of the drain connecting nodes of the first PMOS transistor 44 and the first NMOS transistor 43 is maintained. The "L" level of the equalizing signal EQLi which is the output of the AND gate 92 is maintained (in the active state).

That is, when the equalizing-signal generating circuit EQLGEN has been supplied with the bank active signal BACTi from the corresponding bank active lines BACT0 to BACT7 (when the bank activating command has been issued), a state is realized in which equalizing of the bit lines of the two sub-arrays belonging to the same bank is suspended and selection of the word line is waited for before the decoder is determined.

The determination of the selection of the normal row decoder/selection of the spare row decoder which is performed by the fuse sets FS0c to FS27c is waited for. Then, the state of suspending equalizing of the bit line of one sub-cell array of the two sub-cell arrays belonging to the same bank to be activated is maintained. Moreover, equalising of the bit line of the sub-cell array in the set to be deactivated is restarted.

As described above, the fourth embodiment enables the 8 spare elements provided for each sub-array of each bank to commonly be used in the same bank. Therefore, 16 spare elements are substantially prepared for each bank.

Therefore, if defects are present eccentrically in the overall cell array, a countermeasure can be taken. Thus, the relieving ratio (the efficiency percentage) and the relieving degree of freedom can be improved. Namely, the total number of the spare elements can be reduced and the area efficiency of the redundant on the chip can be improved while satisfactory relieving ratio and the relieving degree of freedom are being maintained.

Fifth Embodiment

In the fourth embodiment, the sense amplifier SA is not shared between the adjacent banks. A fifth embodiment will now be described in which sharing of the sense amplifier SA is permitted between adjacent banks under condition that the adjacent banks are not simultaneously activated.

Figure 12:
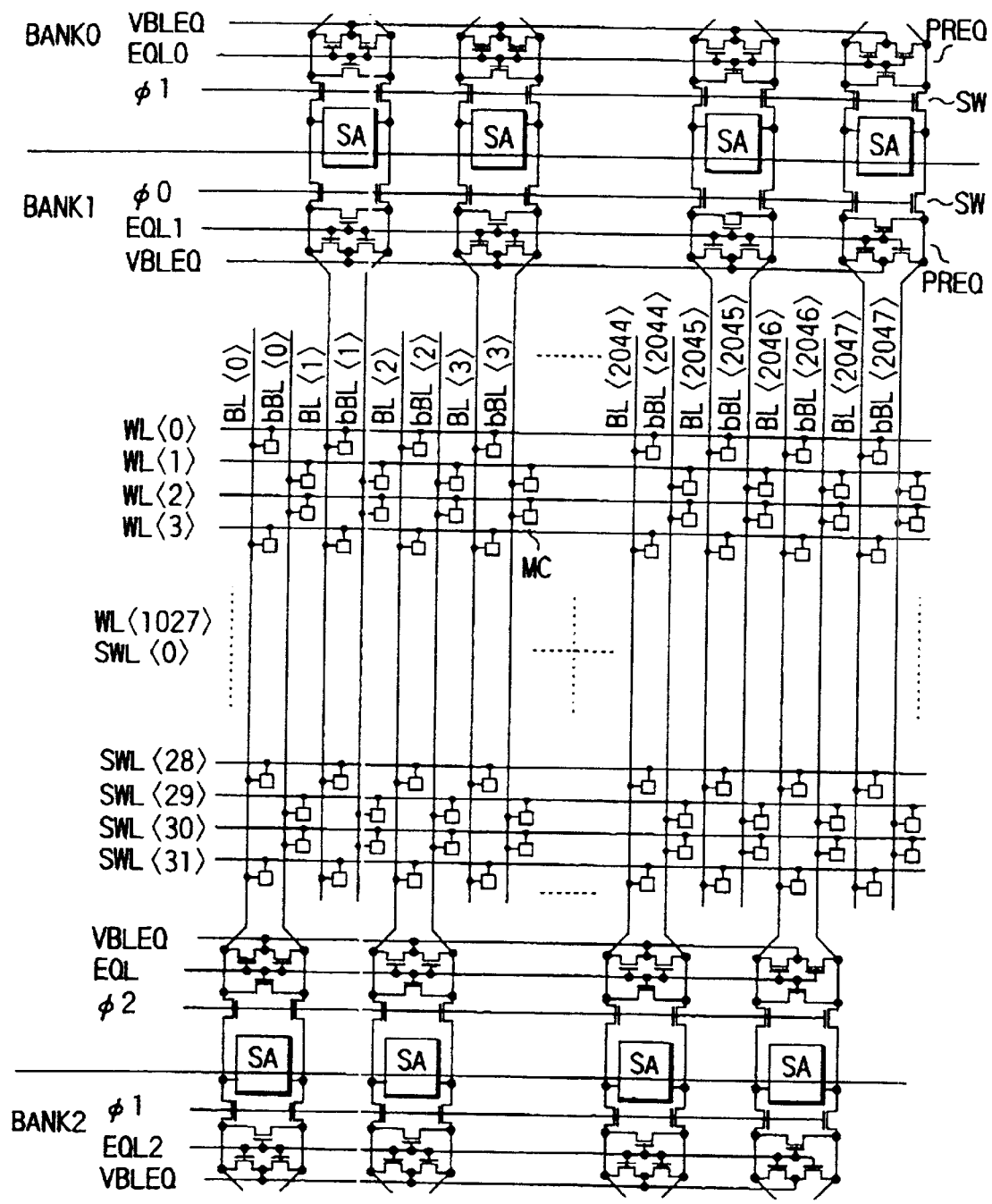
FIG. 12 is a circuit diagram showing a portion of adjacent sub-arrays of a DRAM having the multibank structure according to a fifth embodiment of the present invention.

FIG. 12 schematically shows the structure of a portion of banks in a DRAM according to the fifth embodiment and having the multibank structure.

Referring to FIG. 12, the sub-array SUBA1-1 sub-array SUBA1-1 of the bank BANK1 is characterized in that the sense amplifier SA is shared between adjacent banks.

That is, the equalizing circuit of the equalizing circuit/sense amplifier row at an end of the sub-array SUBA1-1 of the bank BANK1 and the equalizing circuit of the equalizing circuit/sense amplifier row at an end of the sub-array SUBA1-0 of the adjacent bank BANK0 are commonly connected to the sense amplifier SA disposed between the banks BANK0 and BANK1 through an array selecting switch SW composed of the NMOS transistor.

Similarly, the equalizing circuit of the equalizing circuit/sense amplifier row at another end of the sub-array SUBA1-1 of the bank BANK1 and the equalizing circuit of the equalizing circuit/sense amplifier row at another end of the sub-array SUBA1-2 of the adjacent bank BANK2 are commonly connected to the sense amplifier SA disposed between the banks BANK1 and BANK2 through an array selecting switch SW composed of the NMOS transistor. Note that the equalizing signal for controlling the equalizing circuit PREQ of the sub-array SUBA1-0 of the bank BANK0 is represented by EQL0, the equalizing signal for controlling the equalizing circuit PREQ of the sub-array SUBA1-1 is represented by EQL1, the equalizing signal for controlling the equalizing circuit PREQ of the sub-array SUBA1-2 of the bank BANK2 is represented by EOL2 an the potential of the equalizing power source is represented by VBLEQ.

The control signal for the array selecting switch SW of the bank BANK1 adjacent to the bank BANK0 is represented by $\phi 0$, the control signal for the array selecting switch SW of the bank BANK1 adjacent to the bank BANK2 is represented by $\psi 2$, and the control signal of the array selecting switch SW of each of the bank BANK0 and the bank BANK2 adjacent to the bank BANK1 is represented by $\phi 1$.

When the bit line is precharged, each of the equalizing signals EQL0 to EQL2 and the array selection control signals $\phi 0$ to $\psi 2$ is made to be "H".

When the sub-array SUBA1-1 of the bank BANK1 is activated, the equalizing signal EQL1 for controlling the equalizing circuit PREQ of the sub-array SUBA1-1, the array selecting switch SW of the sub-array SUBA1-0 of the adjacent bank BANK0 and the control signal $\phi 1$ of the array selecting switch SW of the sub-array SUBA1-2 of the adjacent bank BANK2 is made to be "L".

When an assumption is made that the equalizing signal EQL1 and the array selecting switch control signal ?1 are equivalent to the equalizing signal EQL shown in FIG. 8, the operation similar to the operation which is performed when the sense amplifier SA is not shared between the adjacent banks described in the fourth embodiment can be performed.

The DRAM according to the fifth embodiment attains a similar effect obtainable from the DRAM according to the fourth embodiment. Moreover, the sense amplifier SA can be shared between the adjacent banks under the condition that the adjacent banks are not simultaneously activated.

Sixth Embodiment

In the fourth and fifth embodiments, the sub-arrays of the plurality of sub-arrays belonging to the same bank and arranged to be activated and the sub-arrays belonging to the same and arranged not to be activated is 1:1. In the sixth embodiment, the sub-arrays to be activated and the sub-arrays which are not activated are 1:n (n is 2 or greater).

That is, when the sub-arrays which are activated and the sub-arrays which are not activated is 1:n (n is 2 or greater), that is, when the plurality of the banks are sectioned into (1+n) sets of sub-arrays, substitution control line is previously sectioned to correspond to the sub-arrays in each set by the method according to the embodiment. Moreover, a substitution control signal is selectively output from the fuse sets FS0c to FS27c. Thus, substitution of a spare element of another sub-array belonging to the same bank for a defect row in a certain sub-array can be performed.

Seventh Embodiment

In the fourth to sixth embodiments, any one of the fuse sets FS0c to FS27c is able to select all of the spare decoders in each of the sub-arrays SUBA1-0 to SUBA1-7 and SUBA2-0 to SUBA2-7. A seventh embodiment has a modification in which one-to-one corresponding fuse sets are used for a portion of the spare elements (a portion of the fuse sets has only one corresponding spare decoder).

In the foregoing case, the fuse set must incorporate only a first storage means for storing the address of a defect memory cell; a comparison circuit for making a comparison between information stored in the first storage means and the input address; a circuit for outputting a signal for activating any one of the spare-decoder control lines in accordance with the output representing a result of the comparison made by the comparison circuit; and a circuit for outputting a signal for activating the corresponding spare decoder when any one of the plurality of spare-decoder control lines is activated.

Namely, the fuse sets one-to-one corresponding to the spare decoders do not require the fuses f14 to f16 and the corresponding decoder DEC as compared with the fuse sets FS0c to FS27c shown in FIG. 9. Therefore, the total number of the fuses can be reduced.

The DRAM according to the seventh embodiment attains a similar effect obtainable from the DRAM according to the fourth embodiment. Moreover, the total number of the fuses of the fuse set can be reduced.

In the fourth to seventh embodiments, the number of the spare elements in each sub-array is the same. If the number of the spare elements in each sub-array is not always the same (the number of the spare elements in a portion of the sub-arrays is different from the number of the spare elements in each of the other sub-arrays), the spare row-decoder active lines SRDact by the number capable of covering the maximum number of the spare elements in the sub-array are previously provided. Then, spare row-decoder selecting signals are selectively output to the spare row-decoder active lines from the fuse sets. Thus, the present invention may be applied to the foregoing case.

Eighth Embodiment

In each of the foregoing element, one fuse set is used when substitution of one spare element is performed. In an eighth embodiment, a plurality of spare elements (substituting units) and one fuse set are used when the width of the defect is great.

Figure 13:
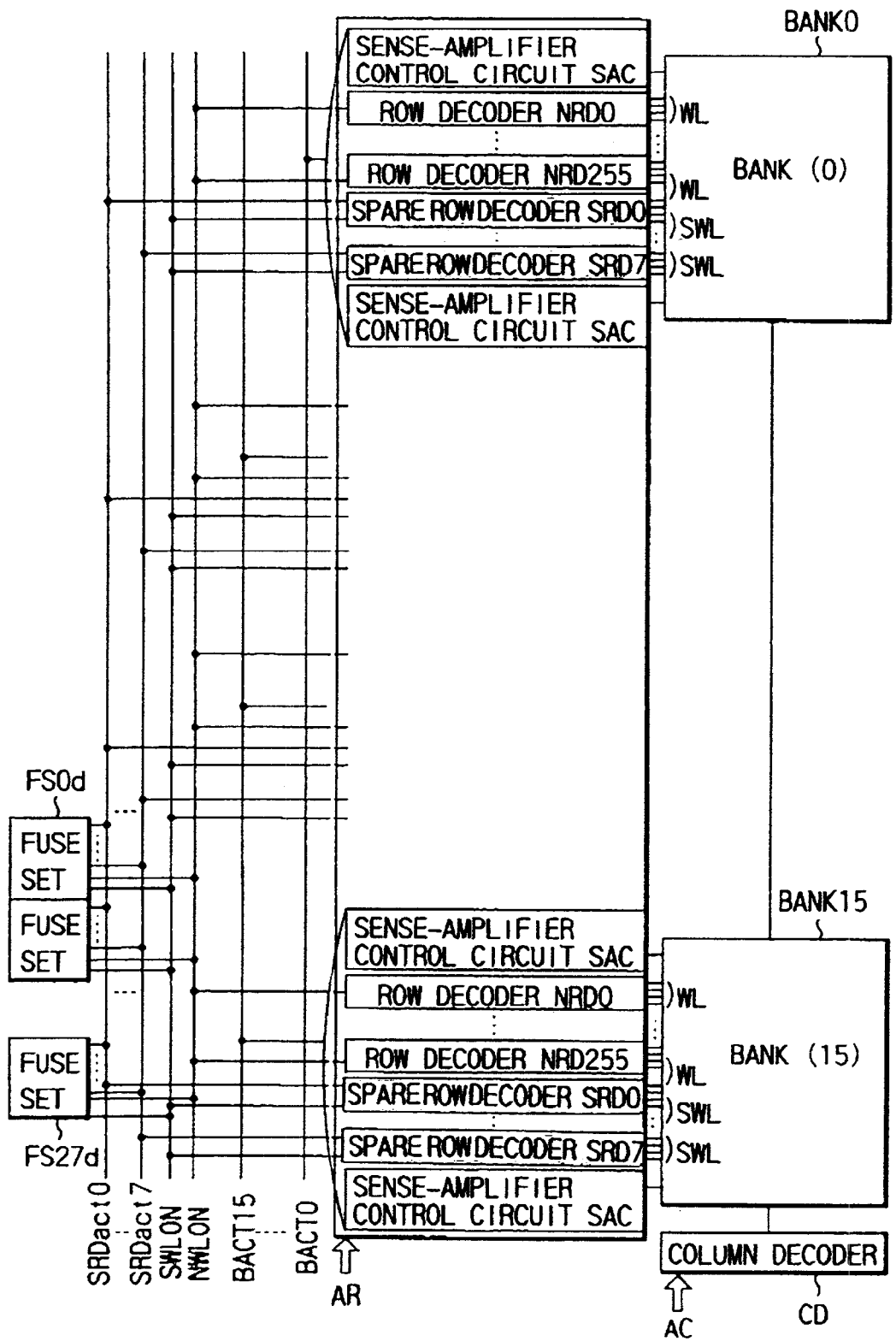
FIG. 13 is a block diagram showing the structure of an essential portion of a DRAM having a multibank structure according to a fifth embodiment of the present invention.

FIG. 13 schematically shows an essential portion of a DRAM according to the eighth embodiment and having the multibank structure. In this embodiment, a structure is employed as an example in which a row spar for relieving a defect memory cell in row units is provide and the column spare for relieving the same in column units is not provided. When both of two adjacent row decoders which are different from each other in only the lowest bit A0 of the address which is used to perform the substitution are defect or when a defect occurs across two row decoders different from each other in only the lowest bit A0, only one fuse set is used to instruct the two spare row decoders.

The overall memory cell array is divided into 16 memory banks BANK0 to BANK15. The memory banks BANK0 to BANK15 can successively be activated. Thus, there is the possibility that another bank is accessed before a certain bank, when has been activated, is again precharged (put to a standby state).

The column decoder CD decodes the column address AC to select the columns of each of the memory banks BANK0 to BANK15.

Each of the memory banks BANK0 to BANK15 is structured similarly to the bank according to the fourth embodiment shown in FIG. 8 and incorporates a sub-cell array portion 71 and an equalizing circuit/sense amplifier row 72.

That is, 256 normal row decoders NRD0 to NRD255, 8 spare row decoders SRD0 to SRD7 and a sense-amplifier control circuit SAC for controlling the equalizing circuit/sense amplifier row 72 disposed on each of the two sides of the sub-cell array portion 71 are provided to correspond to each of the banks BANK0 to BANK15.

As shown in FIG. 13, a normal row-decoder selection control line NWLON (which is brought to the activated state "H" level when selection is performed) for selectively controlling the normal row decoders NRD0 to NRD255 is connected to each of the normal row decoders NRD0 to NRD255. Moreover, a spare row-decoder selection control line SWLON (which is brought to the activated state "H" level when selection is performed) for substantially controlling the spare row decoders SRD0 to SRD7 is connected to each of the spare row decoders SRD0 and SRD7. In addition, eight spare row decoder active lines SRDact0 to SRDact7 (which is brought to the active state "H" level when selection is performed) for instructing selection of any one of the eight spare row decoders SRD0 to SRD7 are connected.

Sixteen bank active lines BACT0 to BACT15 corresponding to each memory banks BANK0 to BANK15 are provided. The bank active lines BACT0 to BACT15 are made to be "H" in a period in which the bank active lines BACT0 to BACT15 selects the corresponding bank and activating the same and "L" in the other period. The bank active lines BACT0 to BACT15 is structured to latch a state of selection of the row decoder (the normal row decoder or the spare row decoder) corresponding to the selection bank and enabled to maintain the state of the selection until a precharge command for the bank is issued.

Row decoders among the normal row decoders NRD0 to NRD255 in the selected banks and the eight spare row decoders SRD0 to SRD7 are selected. The selection is performed in response to the signals from the address line AR, normal row-decoder selection control line NWLON, the spare row-decoder selection control line SWLON and the eight spare row decoder selecting lines SRDact0 to SRDact7 to which pulses corresponding to the intervals of accesses between the different banks. The state where the selected row decoders are turned on can be maintained until a precharge command is issued to the foregoing bank.

Figure 14:
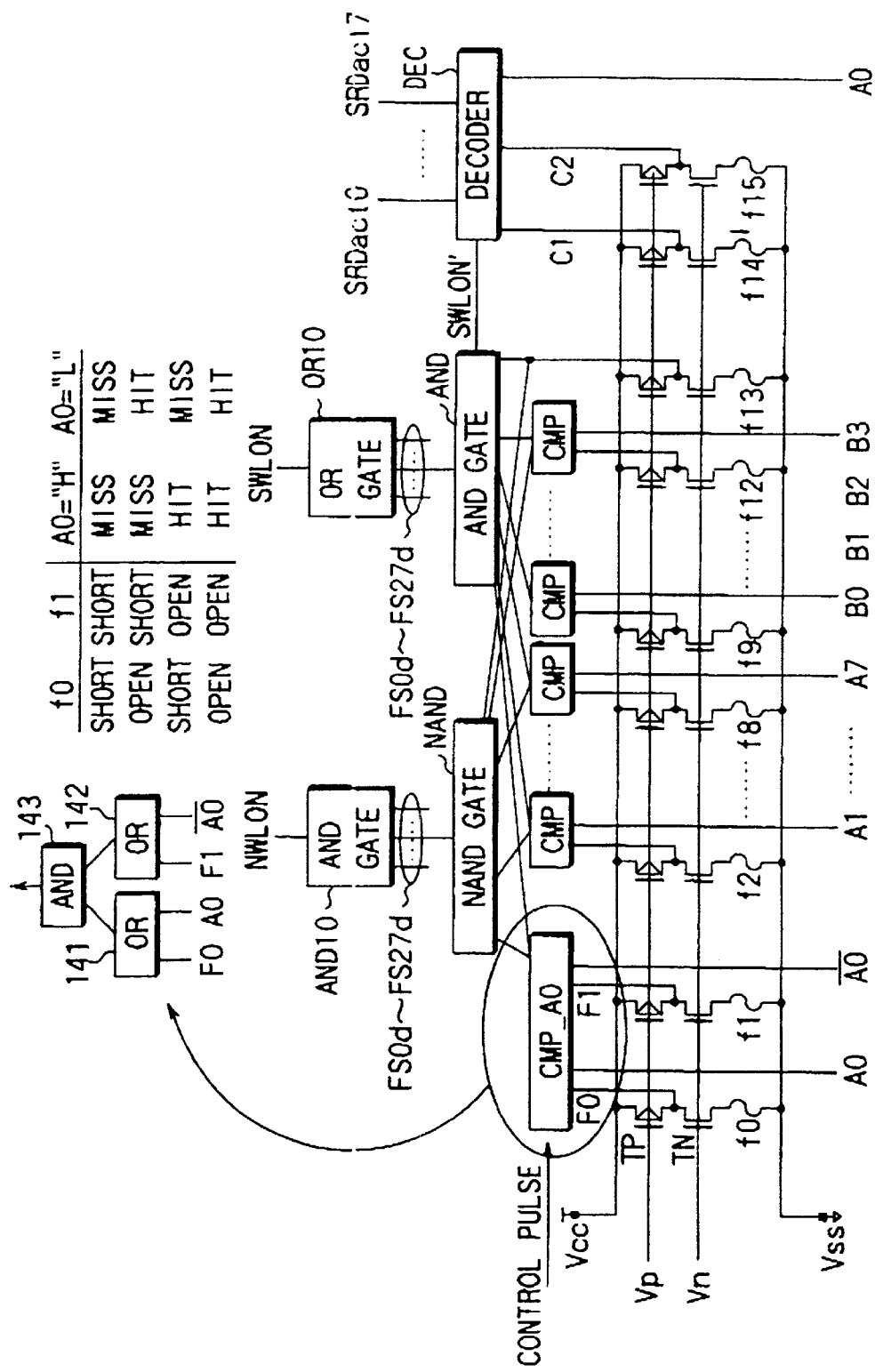
FIG. 14 is a circuit diagram showing a specific example of the structure of one of the fuse sets shown in FIG. 13 taken representatively.

FIG. 14 shows a specific example of one of the fuse sets FS0d to Fs27d shown in FIG. 13 which is representitatively taken. Moreover, the specific example of the structure and the operation of the portion of the foregoing fuse sets FS0d to Fs27d.

The fuse set shown in FIG. 14 has a structure that 13 fuses f0 to f12 of the 16 fuses f0 to f15 store information (information including information of the bank) for instructing a defect address of the memory cell. The fuse f13 stores flag information which indicates whether or not the foregoing fuse set is used. The two fuses f14 and f15 stores a portion of information (encode data) for instructing correspondence to any one of the 8 spare row decoders SRD0 to SRD7.

Nine fuse f0 to f8 of the 13 fuses f0 to f12 for storing information for instructing the defect address are used to instruct the correspondence to the 256 normal row decoders NRD0 to NRD255 n the bank. The four residual fuses f9 to f12 store information for selecting 16 banks BANK0 to BANK15.

The fuses f0 to f15 is, in series, connected between the Vcc node and the Vss node together with the PMOS transistor TP for precharge and the NMOS transistor TN for selection. Information (fuse data) stored in each fuse is precharged after the PMOS transistor TP has been turned on and the NMOS transistor TN has been turned off. Then, information above is read in a state where the PMOS transistor TP has been turned off and the NMOS transistor TN has been turned off. When the fuse has been cut, "H" level is output. When the fuse has not been cut, "L" level is output.

Two fuses f0 and f1 of the 13 fuses f0 to f12 are prepared to correspond to complementary signals A0 and /A0 of the lowest bit of the row address. Fuse data F0 and F1 read from the fuses f0 and f1 and the complementary bit signals A0 and /A0 of the row address are input to a coincidence detection circuit (the first comparison circuit CMP-A0).

The first comparison circuit CMP-A0 incorporates a first OR gate 141 to which F0 and A0 are input; a second OR gate 142 to which F1 and /A0 are input; and an AND gate 143 to which the outputs of the OR gates 141 and 142 are input. The comparison operation is controlled in response to a pulse signal.

The operation of the first comparison circuit CMP-A0 is performed such that the output of the first OR gate 141 is "H" when the fuse f0 has been cut (f0="H"). When /A0= "H", the output of the second OR gate 142 is "H" and the output of the AND gate 143 is "H".

In a state where the fuse f1 has been cut (F1="H"), the output of the second OR gate 142 is "H". When A0="H", the output of the first OR gate 141 is "H" and the output of the AND gate 143 is "H" (output of detected coincidence).

That is, when the two fuses f0 and f1 are previously cut, the "H" output (output of detected coincidence) can be obtained from the first comparison circuit CMP-A0 regardless of the logical level of the address bit signal A0.

When the two fuses f0 and f1 are not cut, the output of each of the first OR gate 141 and second OR gate 142 is "L". Therefore, the output of the AND gate 143 is "L" (non-active state). Therefore, the corresponding fuse set is not used.

Fuse data read from the 13 fuses f0 to f12, bit signals A1 to A7 of the row addresses corresponding to the input address and bit signals B0 to B3 of the bank address are correspondingly input to the comparison circuits CMP. The comparing operation of each of the comparison circuits CMP is controlled in response to a pulse signal. Thus, the fuse data and the input address are compared with each other to detect the coincidence of the fuse data and the input address.

The detection outputs of the first comparison circuit CMP-A0 and the other comparison circuits CMP and the output of the fuse f13 for storing enable information are input to the NAND gate NAND so that their logical product is calculated and input to the AND gate AND so that their logical product is calculated. Each of the outputs from NAND gate NAND of the fuse sets FS0d to FS27d is connected to the normal row-decoder selection control line NWLON through the AND gate AND10. Each of the outputs of the AND gate AND of each of all of the fuse set FS0d to FS27d is connected to the spare row-decoder selection control line SWLON through the OR gate OR10.

Fuse data C1 and C2 read from the two fuses f14 and f15 for selecting the spare row decoder are input to the decoder DEC together with the address bit signal A0.

The decoder DEC is supplied with the control signal SWLON', the phase of which is the same as that of the output (spare row-decoder selection control signal) SWLON which is the output of the AND gate AND, the signal SWLON' being supplied as the activation/deactivation control signal. The decoder DEC decodes fuse data C1 and C2 of the fuses f14 and f15 and the address bit signal A0 to select one spare row decoder active line SRDacti from the 8 spare row decoder active lines SRDact0 to SRDact7. Specifically, the decoder DEC incorporates 8 AND gates to which any one of eight combination of "H" and "L" of the three inputs and the control signal SWLON' are correspondingly input.

The operation of the fuse set shown in FIG. 14 will now be described.

When the input address and fuse data coincide with each other (when redundancy hit occurs), the spare row-decode selection control signal of the spare row-decoder selection control line SWLON is made to be "H" for a predetermined period ("L" in the other period). The signal of the spare row-decoder selection control line SWLON is used to control activation/deactivation of the spare row decoders SRD0 to SRD7 as described above.

At this time, the decoder DEC is activated in response to the control signal SWLON'. Thus, the decoder DEC makes a SPDacti of the 8 spare row decoder active lines SRDact0 to SRDact7 to be "H" in accordance with fuse data C1 and C2 read from the fuses f14 and f15 and the address bit signal A0. Thus, one of the 8 spare row decoders SRD0 to SRD7 in the sub-array is selected.

When redundancy hit has occurred, the output (the normal-row-decoder selection control signal) of the NAND gate NAND is output through the AND gate AND10. Thus, the normal row-decoder selection control line NWLON is made to be "L" for a predetermined period ("L" in the other period). The signal of the normal row-decoder selection control line NWLON is used to control the activation/deactivation of the normal row decoders NRD0 to NRD255 as described above.

If the input address and fuse data do not coincide with each other (when redundancy missed occurs), the normal row-decoder selection control line NWLON is made to be "H" for a predetermined period ("L" in the other period) because the output of the NAND gate NAND is output through the AND gate AND10.

On the other hand, the "L" level of the spare row decoder selection control signal of the spare row-decoder selection control line SWLON which is the output of the AND gate AND is maintained. At this time, the decoder DEC is deactivated in response to the control signal SWLON'. Thus, all of the 8 spare row decoder active lines SRDact0 to SRDact7 are made to be "L" level.

Figure 15:
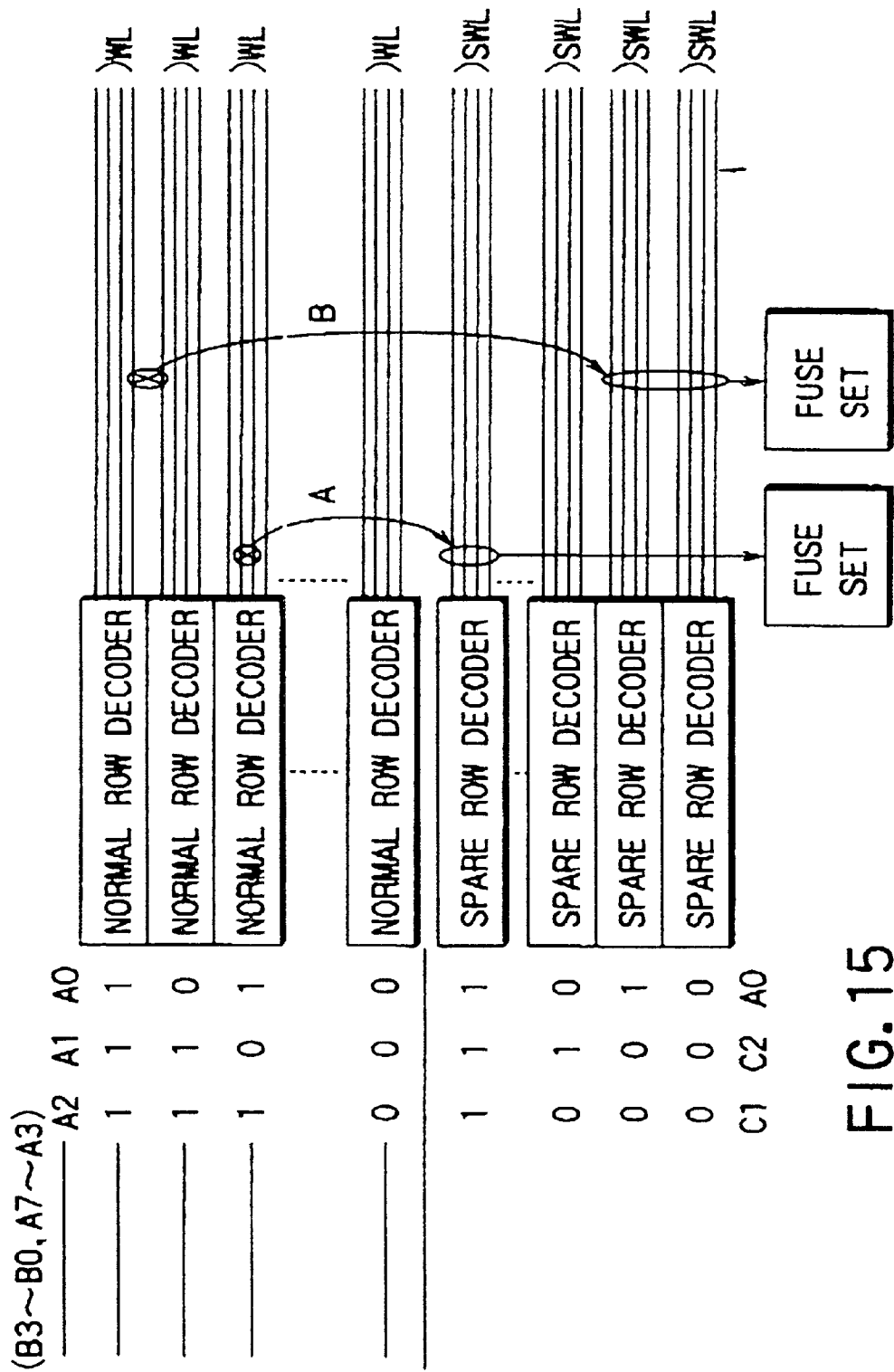
FIG. 15 is a block diagram showing a state in which substitution is performed in the bank shown in FIG. 13 by using the fuse set shown in FIG. 14.

FIG. 15 shows examples A and B of defects in the same bank shown in FIG. 13 for which substitution is performed by using the fuse set shown in FIG. 14.

The example B of the defect is an example of a state in which only one fuse set is used when both of two adjacent row decoders which are different from each other in only the address b it signal A0 are defect or a defect occurs across two row decoders which are different in only the address bit signal A0. In the foregoing case, two spare row decoders which are different from each other in the lowest bits of the addresses are used to perform substitution. In the foregoing case, selection of the whether or not spare row decoders is performed by using the address bit signal A0 as the input of the decoder DEC for selecting the spare row decoder.

The example A of the defect is an example in which substitution of a spare element is used which has the lowest bit of the address, the logical level of which is the same as that of the defect row decoder.

When 128 spare elements and 28 fuse sets are prepared to cope with an estimated average number of defects in a defect memory cell in the memory cell array which is 20, all of the fuse sets are not sometimes used if a defect having a large width (area) occurs and, therefore, 28 or more spare elements must be used.

As described above, the eighth embodiment is able to save as of fuse sets (prevent enlargement of the number of the fuse sets) which share a large area on the chip if the device is fined greatly and the size of the defect is relatively enlarged. As a result, the area efficiency can be improved without deterioration in the efficiency percentage.

When the foregoing substitution is the number of enabled substitution is four spare element per 0.5 bank. When a relatively large quantity of the space elements is prepared, a critical problem does not arise. Therefore, use of fuse sets to cope with a great defect can effectively be reduced (unnecessary consumption can be prevented).

First Modification of Fuse Set According to Eighth Embodiment

Figure 16:
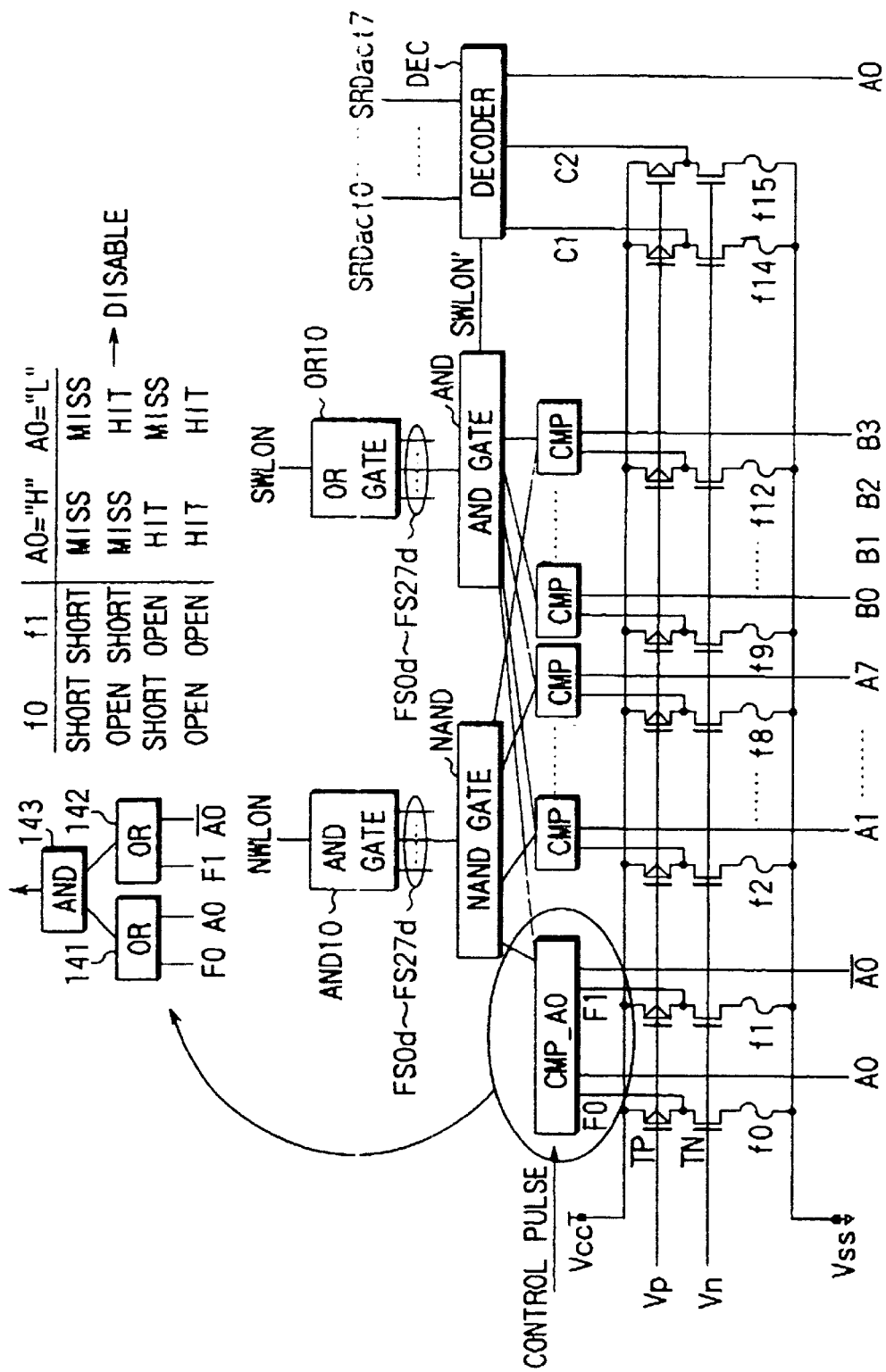
FIG. 16 is a circuit diagram showing a first modification of the fuse set shown in FIG. 14.

FIG. 16 shows a first modification of the fuse set according to the eighth embodiment shown in FIG. 14 such that a portion of the fuse sets are taken to describe the structure and the operation.

As compared with the fuse set shown in FIG. 14, the fuse set according to this modification is different in that the fuse f13 for storing whether or not the fuse set is used and one MOS transistor pair TP and TN in series connected to the fuse f13 are omitted. Since the other structures are the same, the same reference numerals as those shown in FIG. 14 are given.

If the fuse f13 is omitted, a similar effect to that obtainable from the fuse set shown in FIG. 14 can be obtained. That is, when either of the two fuses f0 and f1 prepared to correspond to the complementary address bit signals A0 and /A0 is cut, the fuse set is used as described above. If the two fuses are not cut, the fuse set is not used.

That is, the output of the first comparison circuit CMP-A0 corresponding to the fuses f0 and f1 is made to be the active state "H" when either of the fuse f0 or the fuse f1 is cut. When cutting of both of the fuses f0 and f1 is not performed, the non-active state "L" is realized. Therefore, the output of the first comparison circuit CMP-A0 is equivalent to data read from the fuse f13. The output of the first comparison circuit CMP-A0 enables the NAND gate NAND and the AND gate AND to be controlled similarly to the fuse set shown in FIG. 14.

As compared with the fuse as set shown in FIG. 14, the fuse set according to the first modification has the structure that the fuse f13 and the one MOS transistor pair TP and TN, in series, connected to the fuse f13 are omitted. Moreover, the NAND gate NAND and the AND gate AND are not supplied with data read from the fuse f13. Therefore, the number of inputs can be reduced and, thus, the advantage can be realized in terms of the area.

On the other hand, the fuse set shown in FIG. 14 has a repeated pattern of the fuses f0 to f15, the number of which is 16 which is an even number, and 16 MOS transistor pairs, in series, connected to the fuses f0 to f15. Therefore, the pattern can conveniently be produced.

Second Modification of Fuse Set According to Eighth Embodiment

Figure 17:
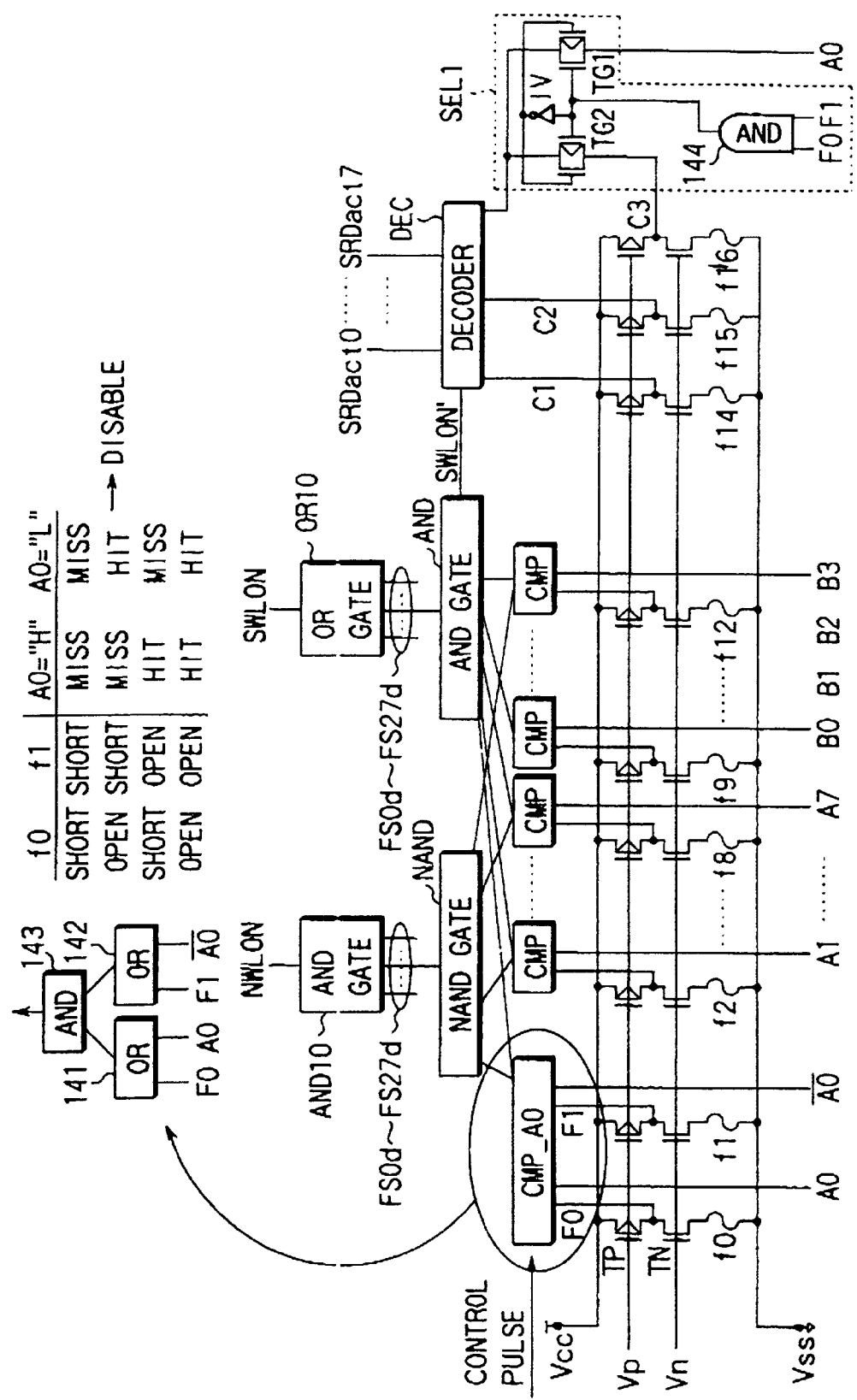
FIG. 17 is a circuit diagram showing a second modification of the fuse set shown in FIG. 14.

FIG. 17 shows a second modification of the fuse sets according to the eighth embodiment shown in FIG. 14 such that a portion of the fuse sets is taken to described the specific structure and operation.

As compared with the fuse set shown in FIG. 16, the fuse set according to this modification is different in the following structures. The other structures are the same and, the same elements are given the same reference numerals as those shown in FIG. 16.

(1) A fuse f16 and one MOS transistor pair TP and TN, the series, connected to the fuse f16 are added to the input portion of the decoder (spare row decoder selection circuit) DEC. Moreover, the fuses for selecting the spare row decoder are increased to three which are fuses f14 to f16.

(2) A first selector SEL1 for alternatively selecting data C3 read from the fuse f16 and the address bit signal A0 to input the same to the decoder DEC is added. As a circuit for generating a control signal for controlling the selecting operation of the first selector SEL1, an AND gate 144 for calculating the logical product of data F0 and F1 read from the fuses f0 and f1 and an inverter IV for inverting the output of the AND gate 144 are added.

Each of ends (outputs ends) of the two CMOS transfer gates TG1 and TG2 each having another end to which data C3 and the address bit signal A0 are correspondingly input is commonly connected to the first selection SEL1. The two CMOS transfer gates TG1 and TG2 are complimentarily controlled in response to complementary control signals supplied from the AND gate 144 and the interest IV.

The operation of the first selector SEL1 will now be described. When the output of the AND gate 144 is "H", the transfer gate TG1 to which the address bit signal A0 is input is turned on. The residual transfer gate TG2 is turned off. The address bit signal A0 is input to the decoder DEC as the lowest address for selecting the spare row decoder.

When the output of the AND gate 144 is "L", the transfer gate TG2 to which data C3 read from the fuse f16 is input is turned on. The residual transfer gate TG1 is turned off. Data C3 read from the fuse f16 is input to the decoder DEC as the lowest address for selecting the spare row decoder.

Figure 18:
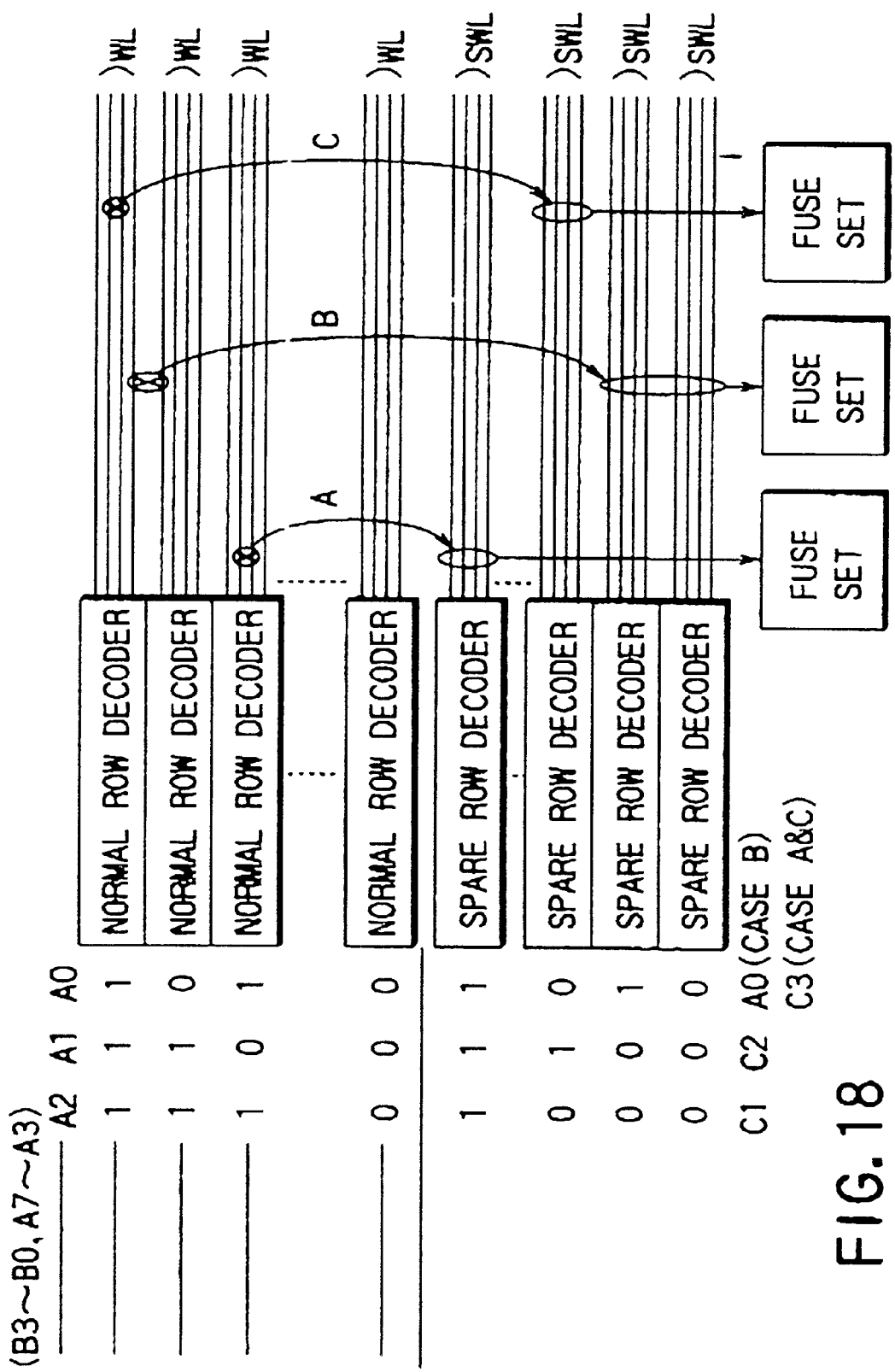
FIG. 18 is a block diagram showing a state in which substitution is performed in the bank shown in FIG. 13 by using the fuse set shown in FIG. 17.

FIG. 18 shows examples A, B and C in one bank shown in FIG. 13 for which substitution must be performed by using the fuse set shown in FIG. 16.

The example B of the defect shows a method of overcoming a state where both of two adjacent row decoders which are different in only the address bit signal A0 are defect or a defect has occurred over two row decoders which are different in only the address bit signal A0. In the foregoing case, substitution of two spare row decoders which are different from each other in the lowest bits of the addresses is performed by using only one fuse set. To select two spare row decoders in the foregoing case, the address bit signal A0 is used as the input of the decoder DEC. To achieve this, both of the two fuses f0 and f1 are cut to make both of data items F0 and F1 to be "H". Thus, the output of the AND gate 144 is made to be "H" so that the address bit signal A0 is input to the decoder DEC. As a result, an operation similar to that of the fuse set shown in FIG. 16 is performed so that a similar effect is obtained.

The example A of the defect shows a state where substitution of spare elements having the lowest bit of the address, the logical level of which is the same as that of the defect row decoder, is performed.

The example C of the defect shows a state where substitution of spare elements having the lowest bit of the address, the logical level of which is inverse to that of the defect row decoder, is performed. In the foregoing case, at least either of the two fuses f0 and f1 is not cut. Thus, either of data F0 or F1 is made to be "L". Thus, data C3 read from the fuse f16 is input to the decoder DEC. Therefore, the foregoing fuse set arranged such that cut/non-cut of the fuse f16 is controlled enables required substitution to be performed.

Third Modification of Fuse Set According to Eighth Embodiment

In the eighth embodiment and its first and second modifications, substitution requiring two spare elements is performed by using one fuse set. A third modification is arranged such that substitution requiring four spare elements is performed by using one fuse set.

Figure 19:
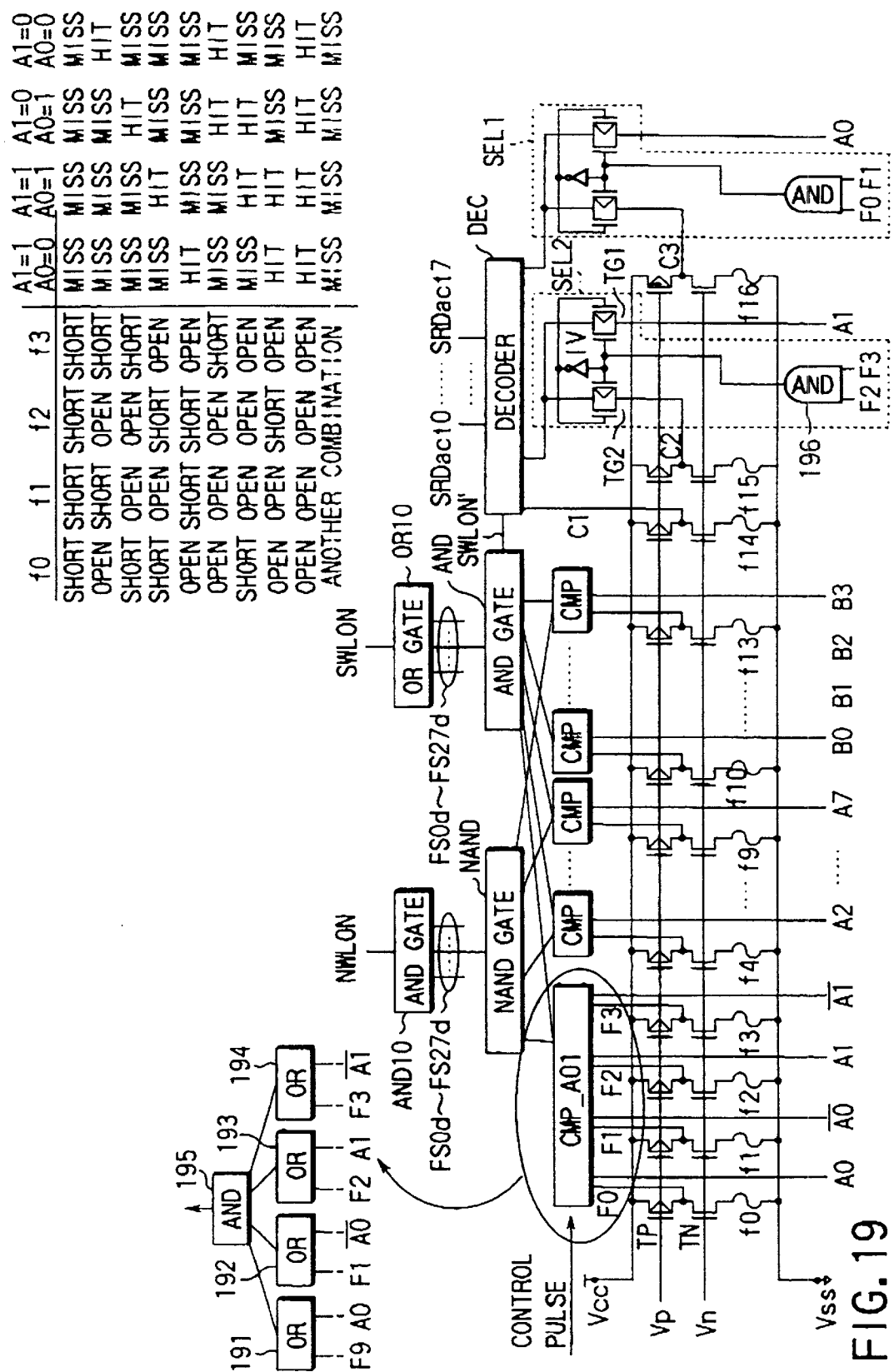
FIG. 19 is a circuit diagram showing a third modification of the fuse set shown in FIG. 14.

FIG. 19 is a circuit diagram showing the third modification of the fuse set according to the eighth embodiment shown in FIG. 14. The fuse set is different from the fuse set shown in FIG. 17 in the following structures. Since the other structures are the same the same reference numerals as those shown in FIG. 17 are given.

(1) Seventeen fuses f0 to f16 and 17 MOS transistor pairs TP and TN, in series, connected to the f0 to f16 are provided. Fourteen fuses f0 to f13 are provided to store information (information as well as including the bank) for instructing the defect address of the memory cell. The three f14 to f16 are used to store information for instructing the correspondence to the eight spare row decoders SRD0 to SRD7 in the bank.

(2) Ten fuses f0 to f9 of the 14 fuses f0 to f13 for storing information to instruct the defect address are used to instruct the correspondence to the 256 normal row decoders NRD0 to NRD255 in the bank. The four residual fuses f10 to f13 store information for selecting the 16 banks BANK0 to BANK15.

Four fuses f0 to f3 of the 14 fuses f0 to f13 are prepared to correspond to signals A0 and /A0 which are complementarily to the lowest bit of the row address and signals A1 and /A1 which are complementary to the upper bits of the signals A0 and /A0. Fuse data F0, F1, F3 and F4 read from the fuses f0, f1, f2 and f3 and the foregoing complementary address bit signals A0, /A0, A1 and /A0 are input to a coincidence direction circuit (a second comparison circuit CMP-A01).

The second comparison circuit CMP-A01 incorporates a first OR gate 191 to which F0 and A0 are input; a second OR gate 192 to which F1 and /A0 are input; a third OR gate 193 to which F2 and A1 are input; a fourth OR gate 194 to which F3 and /A1 are input; and an AND gate 195 to which outputs of the OR gates 191 to 194 are input.

The operation of the second comparison circuit CMP-A01 will now be described. When any one of the FIGS. f0, f1, f2 and f3 is not cut, two outputs of the outputs of the first to fourth OR gates 191 to 194 are made to be "L". The output of the AND gate 195 is made to be "L" (non-active state). Thus, the corresponding fuse set is not used.

When the fuses f0 and f2 are cut (F0 and F2="H"), the outputs of the first OR gate 191 and the third OR gate 193 are "H". When /A0 and /A1="H", the outputs of the second OR gate 192 and the fourth OR gate 194 are "H". Moreover, the output of the AND gate 195 is "H" (output of detection of coincidence). Thus, the addresses of /A0, /A1="H" (one combination) is determined as defect.

In a case where the fuses f1 and f2 are cut (F1 and F2="H"), the outputs of the second OR gate 192 and the third OR gate 193 are "H". When A0 and /A1="H", the outputs of the first OR gate 191 and the fourth OR gate 194 are "H". The output of the AND gate 195 is "H". Thus, the address of A0 and A1="H" (one combination) is determined as defect.

In a case where the fuses f1 and f3 are cut (F1 and F3="H"), the outputs of the second OR gate 192 and the fourth OR gate 194 are "H". When A0 and A1="H", the outputs of the first OR gate 191 and the third OR gate 193 are "H". The output of the AND gate 195 is "H". Thus, the address (one combination) of A0 and A1="H" is determined as defect.

In a case where the fuse f0 to f3 are cut (F0 and F3="H"), the outputs of the first OR gate 191 and the fourth OR gate 194 are "H". When /A0 and A1="H", the outputs of the second OR gate 192 and the third OR gate 193 are "H". The output of the AND gate 195 is "H". Thus, the address (one combination) of /A0 and A1="H" is determined as defect.

In a case where the fuses f0, f1 and f2 are cut (F0, F1 and F2="H"), the outputs of the first OR gate 191, the second OR gate 192 and the third OR gate 193 are "H". When /A1="H", the output of the fourth OR gate 194 is "H". The output of the AND gate 195 is "H". Thus, the address (two combinations) of /A1="H" is determined as defect.

In a case where the fuses f1, f2 and f3 are cut (F1, F2 and F3="H"), the outputs of the second OR gate 192, the third OR gate 193 and the fourth OR gate 194 are "H". When /A0="H", the output of the first OR gate 191 is "H". The output of the AND gate 195 is "H". Thus, the address (two combinations) of A0="H" is determined as defect.

In a case where the fuses f0, f1 and f3 are cut (f0, f1 and f3="H"), the outputs of the first OR gate 191, the second OR gate 192 and the fourth OR gate 194 are "H". When A1="H", the output of the third OR gate 193 is "H". The output of the AND gate 195 is "H". Thus, the addresses (two combinations) of A1="H" is determined as defect.

In a case where the fuses f0, f1, f2 and f3 are cut (F0, F1, F2 and F3="H"), all of the outputs of the first OR gate 191 to the fourth OR gate 194 are "H". Thus, the output of the AND gate 195 is "H" regardless of the logical level of A0 and A1. Thus, all of the four combinations of A0/A1 are determined as defect.

(3) A selector SEL2 is added which alternatively selects data C2 read from the fuse f15 of the three fuses f14 to f16 and the address bit signal A1 to input the same to the decoder DEC.

As a circuit for generating a control signal for controlling the selecting operation of the second selector SEL2, and AND gate 196 for calculating the logical product of data F2 and F3 read from the fuses f2 and f3 and an inverter IV for inverting the output of the AND gate 196 are added.

Each end (output end) of two CMOS transfer gates TG1 and TG2 each having another end to which the address bit signal A1 and data C2 are input is commonly connected to the second selector SEL2. The CMOS transfer gates TG1 and TG2 are complementarily controlled in response to complementary control signals supplied from the AND gate 196 and the inverter IV.

The operation of the second selector SEL2 will now be described. When the output of the AND gate 196 is "H", the transfer gate TG1 to which the address bit signal A1 is input is turned on. The residual transfer gate TG2 is turned off. Thus, the address bit signal A1 is input to the decoder DEC.

When the output of the AND gate 196 is "L", the transfer gate TG2, to which data C2 read from the fuse f15 is input, is turned on. The residual transfer gate TG1 is turned off. Thus, data C2 is input to the decoder DEC.

That is, the decoder DEC is supplied with data C1 read from the fuse f14, output data from the second selector SEL2 and output data of the first selector SEL1.

When both of the fuses f0 and f1 are cut in the foregoing case, A0 is used as the lowest address for selecting the spare as a substitute for data C3 read from the fuse f16. When both of the fuses f2 and f3 are cut, A1 is used as the intermediate address for selecting the spare as a substitute for data C2 read from the fuse f15.

Therefore, previous selection of cut/non-cut of the fuse f15 corresponding to the second selector SEL2 and the fuse f16 corresponding to the first selector SEL1 enables a required spare element to be selected.

Figure 20:
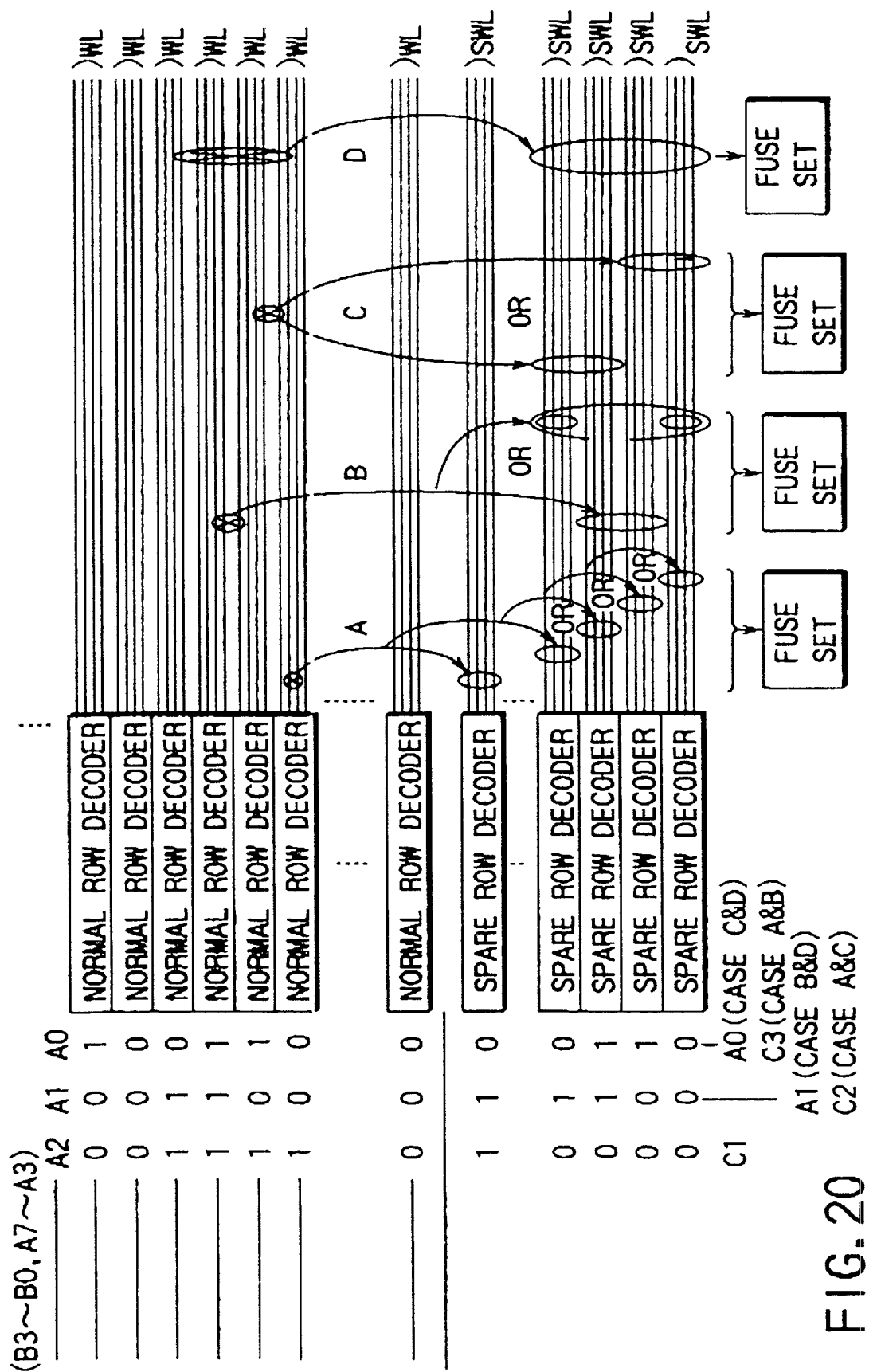
FIG. 20 is a block diagram showing a state in which substitution is performed in the bank shown in FIG. 13 by using the fuse set shown in FIG. 19.
Figure 21:
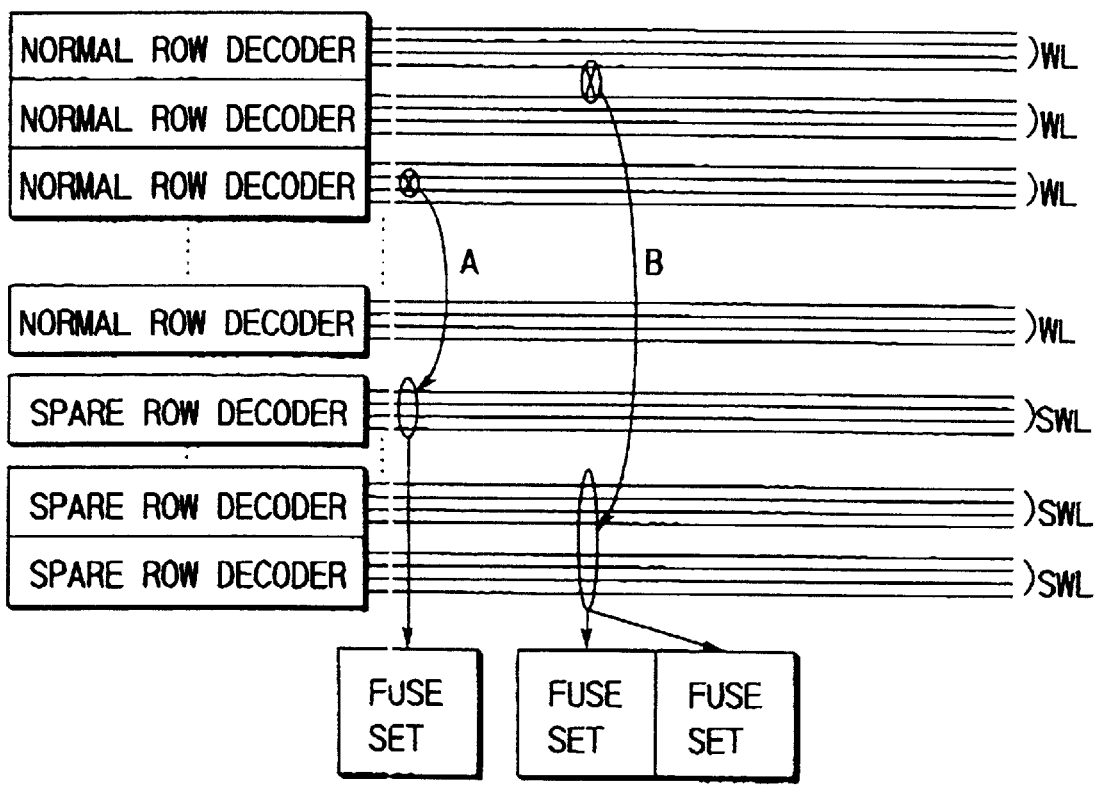
FIG. 21 is a block diagram showing a state where substitution is performed in a bank of a conventional DRAM.

FIG. 20 shows examples A to D of defects in one bank shown in FIG. 13 for which substitution must be performed by using the fuse set shown in FIG. 19. The examples A to D are examples which do not simultaneously occur. The defects which have individually occurred are simply arranged. In each of the examples A to D of the defects, only one fuse set is used.

That is, the example A of the defect shows a state where substitution of one spare is simply performed. A spare can arbitrarily be selected in accordance with the spare selecting fuses f14, f15 and f16.

The example B of the defect shows a state where substitution of two spares which are different from each other in only the address bit A1 is performed. In this example, A1 is used as the intermediate address for selecting the spare. The lowest address bit A0 is "1" or "0" in accordance with cut/non-cut of the fuse f16.

The example C of the defect shows a case where A1 and A0 are interchanged as compared with the example B of the defect.

The example D of the defect shows a case where substitution of four spares is performed when four successive normal decoders having the same addresses higher than the address bit A2 are defect.

To enable substitution of one fuse set for two adjacent normal row decoder of four normal row decoder having the same addresses higher than address bit A2, the arrangement of the spare elements in the bank are devised such that the lowest address bit A0 is arranged as "0110".

That is, the fuse set shown in FIG. 19 is arranged such that at least two combinations of cutting of the fuses f0 to f3 are employed. Thus, the address in which the two bits from the lowest bit of the input address coincide with one, two or four combinations of the four combinations of the address bit signals A0/A1 is determined as a defect address. Therefore, substitution of one, two or four spares can be performed by one fuse set.

In each embodiment, the fuse is employed as the nonvolatile storage device for the defect address memory circuit. Another nonvolatile semiconductor storage device, such as a ROM, an EPROM or EEPROM, may be employed. The semiconductor memory device to which the present invention is applied is not limited to the single apparatus. A storage apparatus of a consolidation type with a logic circuit or the like is included in the scope of the present invention.

As described above, the semiconductor memory device according to the present invention is structured to use both of the distributed spare elements and concentrated spare elements. If the number of the spare elements which are correspondingly provided for a plurality of sectioned units of the memory cell array is reduced, eccentric presence of defects in the overall cell array can be overcome. Thus, the total number of the spare elements can be reduced while the relieving ratio and the relieving degree of freedom are being maintained. As a result, the area efficiency of the redundant circuit on the chip can be improved.

Moreover, the semiconductor memory device according to the present invention permits the spare elements provided for each sub-array of each bank can commonly be used in the same bank. Therefore, a case where defects are present eccentrically in the overall cell array can be overcome. Thus, the total number of the spare elements can be reduced while the relieving ratio and the relieving degree of freedom are being maintained. As a result, the area efficiency of the redundant circuit on the chip can be improved.

The semiconductor memory device according to the present invention enables one fuse set to perform substitution of a plurality of spare elements. Therefore, use of the fuse sets to cope with a defect having a large width can be prevented. Therefore, increase in the fuse sets each requires a large area can be prevented when a satisfactory efficiency percentage is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of normal banks formed by dividing a memory cell array into a plurality of sections;
a first redundant cell array provided as one spare bank so as to be substituted for a defect memory cell of the memory cell array;
a plurality of second redundant cell arrays provided to correspond to the plurality of normal banks;
normal decoders provided to correspond to the normal banks and arranged to select the row and column of the memory cell array in accordance with an input address;
a first spare decoder for selectively operating the first redundant cell array;
a plurality of second spare decoders for selectively and correspondingly operating the plurality of second redundant cell arrays;
a first substitution-control signal line for supplying a first substitution-control signal for controlling the operation of the first spare decoder;
a second substitution-control signal line for supplying a second substitution-control signal for controlling the operation of the plurality of second spare decoders;
a plurality of first memory circuits in which information of the address of a defect memory cell and information as to which of the first redundant cell array and the second redundant cell arrays corresponds to each of the plurality of first memory circuits are previously stored to selectively output the first substitution-control signal or the second substitution-control signal in accordance with a detection result of the correspondence between the stored address of the defect memory cell and the input address and information of the correspondence with the first redundant cell array or the second redundant cell arrays; and
a control circuit for controlling the normal decoder to be deactivated when either of the first substitution-control signal line or the second substitution-control signal line is in an active state.

2. A semiconductor memory device according to claim 1, wherein the first memory circuit comprises:
first storage circuits for previously storing information of the address of a defect memory cell and information as to which of the first redundant cell array and the second redundant cell arrays corresponds to the first memory circuits; and
a first output circuit which determines which of the first redundant cell array and the second redundant cell arrays corresponds to the first memory circuit in accordance with information stored in the first storage circuits to output the first substitution control signal or the second substitution control signal.

3. A semiconductor memory device according to claim 2, wherein the fist storage circuit comprises:
a plurality of first fuse device for storing each bit data of the address of the defect memory cell to correspond to a state of cut/non-cut;
a second fuse device for storing one-bit data for instructing conduction of selection of the first redundant cell array to correspond to the state of cut/non-cut; and
a third fuse device for storing one-bit data for instructing conduction of selection of the second redundant cell arrays to correspond to the state of cut/non-cut and
the first output circuit comprises:
a comparison circuit for making a comparison between the stored address of the defect memory cell and the input address;
a first AND gate which performs a logical process of an output representing a result of the comparison made by the comparison circuit and data stored in the second fuse device to output the first substitution control signal; and
a second AND gate which performs a logical process of an output representing a result of the comparison made by the comparison circuit and data stored in the third fuse device to output the second substitution control signal.

4. A semiconductor memory device comprising:
a plurality of normal banks formed by dividing a memory cell array into a plurality of sections;
a plurality of first redundant cell arrays provided as a plurality of spare banks so as to be substituted for a defect memory cell of the memory cell array;
a plurality of second redundant cell arrays provided to correspond to the plurality of normal banks;
normal decoders provided to correspond to the normal banks and arranged to select the row and column of the memory cell array in accordance with an input address;
a plurality of first spare decoders corresponding to the plurality of the first redundant cell arrays to select and operate the plurality of the first redundant cell arrays;
a plurality of second spare decoders corresponding to the plurality of the second redundant cell arrays to select and operate the plurality of the second redundant cell arrays;
a plurality of first substitution-control signal lines for supplying a first substitution-control signal for alternatively controlling the operation of the plurality of the first spare decoders;
a second substitution-control signal line for supplying a second substitution-control signal for controlling the operation of the plurality of second spare decoders;
a plurality of first memory circuits in which information of the address of a defect memory cell and information as to which of the first redundant cell arrays and the second redundant cell arrays corresponds to each of the plurality of first memory circuits are previously stored to selectively output the first substitution-control signal or the second substitution-control signal in accordance with a detection result of the correspondence between the stored address of the defect memory cell and the input address and information of the correspondence with the first redundant cell arrays or the second redundant cell arrays; and
a control circuit for controlling the normal decoder to be deactivated when any one of the plurality of first substitution-control signal lines and the second substitution-control signal line are active.

5. A semiconductor memory device according to claim 4, wherein the first memory circuit comprises:
first storage circuits for previously storing information of the address of a defect memory cell and information as to which of the first redundant cell arrays and the second redundant cell arrays corresponds to the first memory circuits; and
a first output circuit which determines which of the first redundant cell arrays and the second redundant cell arrays corresponds to the first memory circuit in accordance with information stored in the first storage circuits to selectively output the first substitution control signal or the second substitution control.

6. A semiconductor memory device comprising:
a plurality of normal banks formed by dividing a memory cell array into a plurality of sections;
a first redundant cell array provided as one spare bank so as to be substituted for a defect memory cell of the memory cell array;
a plurality of second redundant cell arrays provided to correspond to the plurality of normal banks;
normal decoders provided to correspond to the normal banks and arranged to select the row and column of the memory cell array in accordance with an input address;
a plurality of first spare decoders to select and operate the first redundant cell array;
a plurality of second spare decoders corresponding to the plurality of the second redundant cell arrays to select and operate the plurality of the second redundant cell arrays;
a plurality of first substitution-control signal lines for supplying a first substitution-control signal for correspondingly and selectively operating the plurality of first spare decoders;
a second substitution-control signal line for supplying a second substitution-control signal for controlling the operation of the plurality of second spare decoders;
a plurality of first memory circuits including first storage circuits which are provided to correspond to the plurality of first substitution-control signal lines and in which the address of a defect memory cell is previously stored and structured to selectively output the first substitution-control signal to the corresponding first substitution-control signal line in accordance with a detection result of the correspondence between the address of the defect memory cell stored in the first storage circuits and the input address;
a plurality of second memory circuits including second storage circuits in which information of the address of a defect memory cell and information as to which of the second redundant cell array corresponds to each of the plurality of second memory circuits are previously stored and arranged to selectively output the second substitution-control signal to the second substitution-control signal line in accordance with a detection result of the correspondence between the address of the defect memory cell stored in the second storage circuits and the input address and information of the correspondence with the plurality of second redundant cell arrays; and
a control circuit for controlling the normal decoder to be deactivated when any one of the plurality of first substitution-control signal lines and the second substitution-control signal line is active.

7. A semiconductor memory device comprising:
a plurality of memory banks which are formed by dividing a memory cell array into a plurality of sections and each of which is constituted by a plurality of sub-arrays;
a plurality of spare elements which are provided for each of the sub-arrays and arranged to be substituted for a defect memory cell;
a plurality of normal decoders which are provided to correspond to each of the sub-arrays and arranged to select the row of the sub-array in accordance with an input address;
a plurality of spare decoders which are provided to correspond to each of the sub-arrays and arrange to correspondingly operate the plurality of spare elements;
a plurality of bank selecting lines for selecting the plurality of memory banks;
a plurality of normal-decoder control lines provided to correspond to the sets composed of a plurality of sub-arrays constituting the plurality of memory banks and arranged to select the normal decoders of the normal decoders and the spare decoders provided to correspond to the sub-arrays of each set;
a plurality of spare-decoder control lines provided to correspond to the sets composed of the plurality of sub-arrays constituting the plurality of memory banks and arranged to select the spare decoders of the normal decoders and the spare decoders provided to correspond to the sub-arrays of each set;

a plurality of spare-decoder selecting lines for alternatively selecting and controlling the plurality of spare decoder of each sub-array; and assigning circuits for selectively assigning the spare element of each sub-array to another sub-array belonging to the same bank.

8. A semiconductor memory device according to claim 7, wherein the assigning circuits comprise a plurality of memory circuits in which the address of the defect memory cell and the information of the relationship between the address of the defect memory cell and the spare decoder in one-to-one correspondence is previously stored, which make a comparison between the input address and the stored address of the defect memory cell to output a signal for selectively activating the plurality of spare decoder control lines and which outputs a signal for selectively activating the plurality of spare-decoder selecting lines in accordance with the stored information of the relationship between the address of the defect memory cell and the spare decoder when coincidence has been detected, and which outputs a signal for selectively activating the plurality of normal-decoder control lines when non-coincidence has been detected.

9. A semiconductor memory device according to claim 8, wherein each memory circuit comprises:

first storage circuits in which the address of the defect memory cell is stored;

second storage circuits in which information of the correspondence with sub-arrays of a plurality of sets constituting the plurality of memory banks is stored;

third storage circuits in which information of the correspondence with the plurality of spare decoders is stored;

a comparison circuit for making a comparison between stored information in the first storage circuits and the input address;

a first output circuit for outputting a signal for activating any one of the plurality of spare-decoder control lines in accordance with output representing a result of the comparison made by the comparison circuit and stored information in the second storage circuits;

a second output circuit for outputting a signal for selectively activating the plurality of spare-decoder selecting lines in accordance with stored information in the third storage circuits when any one of the plurality of spare-decoder control lines is activated; and a third output circuit for outputting a signal for activating any one of the plurality of normal-decoder control lines in accordance with the output representing the result of the comparison made by the comparison circuit and the input address.

10. A semiconductor memory device according to claim 9, wherein the first storage circuits comprise a plurality of first fuse devices for storing each bit data of the address of the defect memory cell to correspond to a state of cut/non-cut;

the second storage circuits comprise a second fuse device for storing information of the correspondence with two sets of sub-arrays such that one-bit data is caused to correspond to the state of cut/non-cut;

the third storage circuits for storing each bit data of encode data indicating the correspondence with the plurality of spare decoders to correspond to the state of cut/non-cut;

the first output circuit is a first logical circuit which is complementarily activated by data stored in the second fuse device and data acquired by inverting the stored data when coincidence has been detected by the comparison circuit to activate either of two spare decoder control lines:

the second output circuit is a decoder which decodes encode data stored in the plurality of third fuse devices when coincidence has been detected by the comparison circuit so as to selectively activate the plurality of spare-decoder selecting line, and the third output circuit is a second logical circuit which is complementarily activated in response to a predetermined bit signal of the input address and a signal acquired by inverting the predetermined bit signal when non-coincidence has been detected by the comparison circuit so as to activate either of two normal-decoder control lines.

11. A semiconductor memory device according to claim 10, wherein:

the first logical circuit comprises a first AND gate for calculating a logical product of a detection output when coincidence has been detected by the comparison circuit and data stored in the second fuse device and a second AND gate for calculating the logical product of a detection output when coincidence has been detected by the comparison circuit and inverted data of data stored in the second fuse device, and the second logical circuit incorporates a third AND gate for calculating a logical product of detection output when non-coincidence has been detected by the comparison circuit and the predetermined bit signal of the input address and a fourth AND gate for calculating a logical product of a detection output when non-coincidence has been detected by the comparison circuit and an inverted signal of the predetermined bit signal of the input address.

12. A semiconductor memory device according to claim 7, wherein the assigning circuits comprise a memory circuit in which the address of the defect memory cell is previously stored, which makes a comparison between the input address and the stored address of the defect memory cell, which outputs a signal for selectively activating the plurality of spare-decoder control lines when coincidence has been detected and which outputs a signal for activating the plurality of normal-decoder control lines when non-coincidence has been detected.

13. A semiconductor memory device according to claim 12, wherein the memory circuit is provided with only one corresponding spare decoder and comprises:

first storage circuits for storing the address of the defect memory cell;

second storage circuits in which information of the correspondence with the sub-arrays of the plurality of sets constituting the plurality of memory banks is stored;

a comparison circuit for making a comparison between stored information in the first storage circuits and the input address;

a first output circuit for outputting a signal for activating any one of the plurality of spare-decoder control lines in accordance with an output representing a result of a comparison made by the comparison circuit and stored information in the second storage circuits;

a second output circuit for outputting a signal for activating the corresponding spare decoder when any one of the plurality of spare-decoder control lines is activated; and a third output circuit for outputting a signal for activating any one of the plurality of normal-decoder control lines in accordance with the output representing the result of the comparison made by the comparison circuit and in response to a predetermined bit signal of the input address.

14. A semiconductor memory device according to claim 7, wherein the sub-array comprises:

a sub-cell array portion having word lines, spare word lines, bit-line pairs and memory cells disposed to correspond to each intersection of the word lines, the spare word lines and the bit-line pairs;

equalizing circuit and sense amplifier lines including plurality of equalizing circuits disposed on the two sides of the sub-cell array and arranged to be controlled in response to an equalizing signal to equalize the bit-line pairs to a bit-line-pair equalization potential and a plurality of sense amplifiers for sense-amplifying data read from a memory cell on a selected row to the bit line; and a control circuit to which signals are input from the bank selecting line, the normal-decoder control line and the spare-decoder control line, which controls equalizing circuits corresponding to all of the sub-arrays in the same bank to an equalizing suspended state when activation of the bank is started so as to temporarily control the sense amplifier to an activation preparing state, and which is structured such that when any one of the plurality of normal-decoder control lines and the plurality of spare-decoder control lines has been activated, the equalizing circuits corresponding to the sub-arrays to be activated are controlled to maintain the equalizing suspended state so as to maintain the activation preparing state of the sense amplifiers and the equalizing circuits corresponding to the sub-arrays to be deactivated are returned to the equalizing state so as to restore the sense amplifiers to the deactivate state.

15. A semiconductor memory device according to claim 7, wherein the sub-array comprises:

a sub-cell array portion having word lines, spare word lines, bit-line pairs and memory cells disposed to correspond to each intersection of the word lines, the spare word lines and the bit-line pairs;

a plurality of equalizing circuits disposed on the two sides of the sub-cell array portion and arranged to be controlled in response to an equalizing signal to equalize the bit-line pairs to a bit-line-pair equalization potential;

an array selecting switch connected between a sense amplifier line including a plurality of bit-line sense amplifiers which are disposed between adjacent sub-arrays and commonly used between adjacent sub-arrays and each of the bit-line pairs; and a control circuit to which signals are input from the bank selecting line, the normal-decoder control line and the spare-decoder control line, which controls the equalizing circuits corresponding to all of the sub-array in the same bank to an equalizing suspended state and brings the array selecting switch to a connection suspended state so that the sense amplifiers is temporarily brought to an activation preparing state when activation of the bank is started, and which maintains the equalizing circuit corresponding to the sub-array to be activated at an equalizing suspended state, controls the array selecting switch of adjacent sub-cell array to a connection suspended state so as to maintain the activation preparing state of the sense amplifier, controls the equalizing circuits corresponding to the residual sub-arrays to be deactivated to an equalizing state, and controls the array selecting switch to a connected state so as to return the sense amplifier to deactivated state when any one of the plurality of normal-decoder control lines and the plurality of spare-decoder control lines has been activated.

16. A semiconductor memory device according to claim 14, wherein the control circuit comprises:

a first circuit to which a signal is input from the bank selecting line and which generates a pulse signal having a time width shortened in synchronization with the front edge;

a first NMOS transistor having a gate to which an output signal from the first circuit is input;

a PMOS transistor connected between the drain of the first NMOS transistor and a power-supply node and having a gate to which a signal is input from the bank selecting line;

a second NMOS transistor connected between the source of the first NMOS transistor and a ground node and having a gate to which a signal is input from the normal-decoder control line;

a third NMOS transistor connected between the source of the first NMOS transistor and the ground node and having a gate to which a signal is input from the spare-decoder control line;

a latch circuit for latching the drain potential of the first NMOS transistor; and a logical gate for performing a logical process of an output signal from the latch circuit and an input signal from the bank selecting line to output an equalizing control signal for the equalizing circuit.

17. A semiconductor memory device according to claim 15, wherein the control circuit comprises:

a first circuit to which a signal is input from the bank selecting line and which generates a pulse signal having a time width shortened in synchronization with the front edge;

a first NMOS transistor having a gate to which an output signal from the first circuit is input;

a PMOS transistor connected between the drain of the first NMOS transistor and a power-supply node and having a gate to which a signal is input from the bank selecting line;

a second NMOS transistor connected between the source of the first NMOS transistor and a ground node and having a gate to which a signal is input from the normal-decoder control line;

a third NMOS transistor connected between the source of the first NMOS transistor and the ground node and having a gate to which a signal is input from the spare-decoder control line;

a latch circuit for latching the drain potential of the first NMOS transistor; and a logical gate for performing a logical process of an output signal from the latch circuit and an input signal from the bank selecting line to output an equalizing control signal for the equalizing circuit.

18. A semiconductor memory device comprising:
- a memory bank formed by dividing a memory cell array into a plurality of sections;
- a plurality of spare elements which are provided for each memory bank and arranged to be substituted for defect memory cells;
- a plurality of normal decoders disposed to correspond to the memory banks and arranged to select the row of the memory bank in accordance with an input address;
- a plurality of spare decoders provided to correspond to the memory banks and arranged to correspondingly operate the plurality of spare elements;
- a plurality of bank selecting lines for selecting the plurality of memory banks;
- a spare-decoder control line for selecting the spare decoders of the normal decoders and the spare decoders;
- a plurality of spare-decoder selecting lines for alternatively and selectively controlling the spare decoders of such memory bank; and
- assigning circuits provided by a number of smaller than the total number of the spare elements and arranged to arbitrarily select and substitute one or plurality of spare elements for the defect memory cell.

19. A semiconductor memory device according to claim 18, wherein the assigning circuits comprise a memory circuit in which the address of one or plural defect memory cells and information of the relationship between the address of the defect memory cell and the spare decoders in one-to-one correspondence is previously stored, which makes a comparison between the input address and the stored address of one or plural defect memory cells, which outputs a signal for correspondingly activating/deviating the spare-decoder control line when coincidence/non-coincidence has been detected and which outputs a signal for selectively activating the plurality of spare-decoder selecting lines in accordance with information of the relationship between the address of the defect memory and the spare decoder when coincidence has been detected.

20. A semiconductor memory device according to claim 19, wherein the memory circuit comprises:
- first storage circuits in which one or a plurality of addresses of the defect memory cell;
- a comparison circuit for making a comparison between information stored in the first storage circuits and the input address;
- a first output circuit for outputting a signal for activating the spare-decoder control line in accordance with an output produced when the comparison circuit has detected coincidence;
- second storage circuits in which information of one-to-one correspondence between the plurality of spare decoders and the address of the defect memory cell; and
- a second output circuit for outputting a signal for selectively activating the plurality of spare-decoder selecting lines in accordance with information stored in the second storage circuits and in response to at least a lowest bit of the address for use in substitution when the spare-decoder control line is activated.

21. A semiconductor memory device according to claim 20, wherein:
the addresses of the plurality of defect memory cells which are stored in the first storage circuits of the semiconductor memory device are two to four types of addresses which are different from one another in only a lowest bit of the address for use in substitution or only two bits consisting of the lowest bit and one upper bit, and
the one bit or two-bit address bits different from one another is contained in the input of the second output circuit.

22. A semiconductor memory device according to claim 21, wherein
the first storage circuits comprise a plurality of first fuse devices for storing a lowest bit signal of the address for use to substitute the defect memory cell, a reversed signal of the lowest bit signal and each bit data upper than the lowest bit such that correspondence to cut/non-cut state is established,
the second storage circuits comprise second fuse devices for storing each bit data of encode data indicating the correspondence with the plurality of spare decoders except for the lowest bit such that correspondence to cut/non-cut state is established,
the first output circuit comprises a first comparison circuit for making a comparison among the lowest bit signal of the address for use in the substitution, a reversed signal of the lowest bit signal and data corresponding to the signals and stored in the first storage circuits, a second comparison circuit for making a comparison among each bit data upper than the lowest bit of the address and data corresponding to each bit data stored in the first storage circuits; and a first AND gate for performing a logical process of an output representing a result of the comparison made by the first comparison circuit and an output representing a result of the comparison made by the second comparison circuit to output a signal for activating the spare-decoder control line, and
the second output circuit is a decoder to which lowest-bit data of the address and data stored in the second storage circuits an input and which decodes the input data to selectively activate the plurality of spare-decoder selecting lines.

23. A semiconductor memory device according to claim 21, wherein
the first storage circuits comprise a plurality of first fuse devices for storing a lowest bit signal of the address for use to substitute the defect memory cell, a reversed signal of the lowest bit signal and each bit data upper than the lowest bit such that correspondence to cut/non-out state is established,
the second storage circuits comprise second fuse devices for storing each bit data of encode data indicating the correspondence with the plurality of spare decoders such that correspondence to cut/non-cut state is established,
the first output circuit comprises a first comparison circuit for making a comparison among the lowest bit signal of the address for use in the substitution, a reversed signal of the lowest bit signal and data corresponding to the signals and stored in the first storage circuits, a second comparison circuit for making a comparison among each bit data upper than the lowest bit of the address and data corresponding to each bit data and stored in the first storage circuits; and a first AND gate for performing a logical process of an output representing a result of the comparison made by the first comparison circuit and an output representing a result of the comparison made by the second comparison circuit to output a signal for activating the spare-decoder control line, and the second output circuit is a decoder to which encode data stored in the second storage circuits or encode data obtained by switching the lowest bit data of the encode data item into lowest bit data of the address for use in the substitution is input and which decodes input encode data to selectively activating the plurality of spare-decoder selecting lines.

24. A semiconductor memory device according to claim 21, wherein the first storage circuits comprise a plurality of first fuse devices for storing two bit signals from the lowest bit of the address for use to substitute the defect memory cell, reversed signals of the two bit signals and each bit data upper than the two bits such that correspondence to cut/non-cut state is established, the second storage circuits comprise second fuse devices for storing each bit data of encode data indicating the correspondence with the plurality of spare decoders such that correspondence to cut/non-out state is established, the first output circuit comprises a first comparison circuit for making a comparison among the two bit signals from the lowest bit of the address for use in the substitution, reversed signals of the two bit signals and data corresponding to the signals and stored in the first storage circuits a second comparison circuit for making a comparison among each bit data upper than the two bits from the lowest bit of the address and data corresponding to the each bit data and stored in the first storage circuits; and a first AND gate for performing a logical process of an output representing a result of the comparison made by the first comparison circuit and an output representing a result of the comparison made by the second comparison circuit to output a signal for activating the spare-decoder control line, and the second output circuit is a decoder to which encode data stored in the second storage circuits or encode data obtained by switching at least one bit of two bit data from the lowest bit into bit data to which the address corresponds is input and which decodes input encode data to selectively activate the plurality of spare-decoder selecting lines.

25. A semiconductor memory device according to claim 18, further comprising a normal decoder control line for selecting the normal decoder of the normal decoder and the spare decoder, wherein the memory circuit further incorporates a third output circuit for outputting a signal for activating the normal-decoder control line in accordance with an output made what non-coincidence has been detected by the comparison circuit.

\* \* \* \* \*

UNITED STATES PATENT AND TRADEMARK OFFICE
CERTIFICATE OF CORRECTION

PATENT NO.    : 6,567,322 B1
DATED         : May 20, 2003
INVENTOR(S)   : Hideo Mukai et al.

It is certified that error appears in the above-identified patent and that said Letters Patent is hereby corrected as shown below:

Column 40,
Line 43, "fist" has been replace with -- first --;

Column 41,
Line 55, -- Signal -- has been inserted after the word "control";

Column 43,
Line 7, "decoder" has been replaced with -- decoders --;

Column 47,
Line 20, "such" has been replace with -- each --;

Column 48,
Line 37, "an" has been replaced with -- are --;
Line 47, "non-out" has been replaced with -- non-cut --;

Column 49,
Line 19, "non-out" has been replaced with -- non-cut --;

Column 50,
Line 24, "what" has been replaced with -- when --.

Signed and Sealed this

Twenty-fifth Day of November, 2003

JAMES E. ROGAN
*Director of the United States Patent and Trademark Office*